(12) United States Patent
Winkler et al.

(10) Patent No.: US 7,531,368 B2
(45) Date of Patent: May 12, 2009

(54) IN-LINE LITHOGRAPHY AND ETCH SYSTEM

(75) Inventors: Mark G. Winkler, Ridgefield, CT (US); Thomas E. Winter, Pleasant Valley, NY (US)

(73) Assignee: Tokyo Electron Limited, Tokyo (JP)

( * ) Notice: Subject to any disclaimer, the term of this patent is extended or adjusted under 35 U.S.C. 154(b) by 116 days.

(21) Appl. No.: 11/730,202

(22) Filed: Mar. 30, 2007

(65) Prior Publication Data

US 2008/0241969 A1    Oct. 2, 2008

(51) Int. Cl.
*H01L 21/00* (2006.01)
*G01R 31/26* (2006.01)

(52) U.S. Cl. .............. 438/5; 438/11; 438/14; 438/18; 257/E21.525; 257/E21.529; 700/109; 700/110; 700/121; 703/2; 716/1; 716/4

(58) Field of Classification Search .......... 257/E21.525, 257/E21.529
See application file for complete search history.

(56) References Cited

U.S. PATENT DOCUMENTS

| 7,373,216 | B1 * | 5/2008 | Winkler et al. ............ 700/121 |
| 2003/0015660 | A1 | 1/2003 | Shishido et al. |
| 2005/0187649 | A1 * | 8/2005 | Funk et al. ................ 700/121 |
| 2006/0292845 | A1 | 12/2006 | Chiang et al. |

* cited by examiner

*Primary Examiner*—Walter L Lindsay, Jr.
*Assistant Examiner*—Mohsen Ahmadi
(74) *Attorney, Agent, or Firm*—Oblon, Spivak, McClelland, Maier & Neustadt, P.C.

(57) ABSTRACT

The invention can provide a method of processing a wafer using Site-Dependent (S-D) processing sequences that can include S-D creation procedures, S-D evaluation procedures, and S-D transfer sequences. The S-D creation procedures can be performed using S-D processing elements, the S-D evaluation procedures can be performed using S-D evaluation elements, and S-D transfer sequences can be performed using site-dependent transfer subsystems. Site-dependent data can be stored in site-dependent libraries and/or databases.

41 Claims, 9 Drawing Sheets

IN-LINE LITHOGRAPHY AND ETCH SYSTEM

CROSS-REFERENCE TO RELATED APPLICATIONS

This application is related to co-pending U.S. patent application Ser. No. 11/694,428, entitled "Method and Apparatus for Verifying a site-Dependent Wafer," filed on even date herewith; co-pending U.S. patent application Ser. No. 11/730,284, entitled "Method and Apparatus for Verifying a site-Dependent Procedure," filed on even date herewith; co-pending U.S. patent application Ser. No. 11/730,341, entitled "Method and Apparatus for Creating a site-Dependent Evaluation Library," filed on even date herewith; co-pending U.S. patent application Ser. No. 11/730,279, entitled "Method and Apparatus for Performing a site-Dependent Dual Damascene Procedure," filed on even date herewith; and co-pending U.S. patent application Ser. No. 11/730,339, entitled "Method and Apparatus for Performing a site-Dependent Dual Patterning Procedure," filed on even date herewith. The contents of each of these applications are herein incorporated by reference in their entireties.

BACKGROUND OF THE INVENTION

1. Field of the Invention

The present invention relates to wafer processing, and more particularly to improving the wafer processing using site-dependent (S-D) procedures and subsystems.

2. Description of the Related Art

Current manufacturing methodology and factory design used for integrated circuits require many tools located as stand-alone platforms or grouped in general areas, usually separated by 2000 feet or more. Facilities to run these tools must therefore also be widely distributed throughout the factory. Typical functions required by these platforms are substrate coating (Adhesion, BARC, TARC, Resist, Top Coat), bake (post apply bake and post exposure bake) imaging (exposure), metrology (overlay, critical dimension, defect and film thickness), pre and post exposure cleaning using in immersion processing, etch (defining the pattern in the underling thin films) and post etch clean-up (polymer and other byproduct removal). Technologies targeting sub 32 nm gate lengths sub will require many of these operations to be repeated to complete a single active layer of the semiconductor device i.e. double BARC, double or triple patterning, double or triple imaging, etc.

The required gate level defect density for 15 nm gate technology is going to be approximately $0.01/cm^2$ at 10 nm in size per ITRS 2005 roadmap. Critical dimension control will need to be about 0.6 nm (3sigma), post etch, for the gate element. No lithographic and etch process tool exists with these performance capabilities.

These advanced technologies will need real time, wafer-to-wafer upstream adjustment of the process to maintain acceptable device results. Defectivity requirements will demand less movement of wafers from tool to tool within the factory as those movements add defects and factory clean room cost.

Platforms in use today function as manufacturing "islands". This does not afford the best CoO development or allow for optimum process control. No 300 mm track design today can meet 300 wafers per hour throughput as claimed possible by some exposure tool manufacturers.

SUMMARY OF THE INVENTION

The present invention provides a method of processing a wafer in real-time using S-D processing procedures and/or S-D evaluation procedures. In some embodiments, one or more controllers in one or more subsystems and/or systems can be used to perform S-D processing procedures and/or S-D evaluation procedures using real-time S-D parameters. In addition, S-D processing procedures and/or S-D measurement procedures may operate using historical data.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
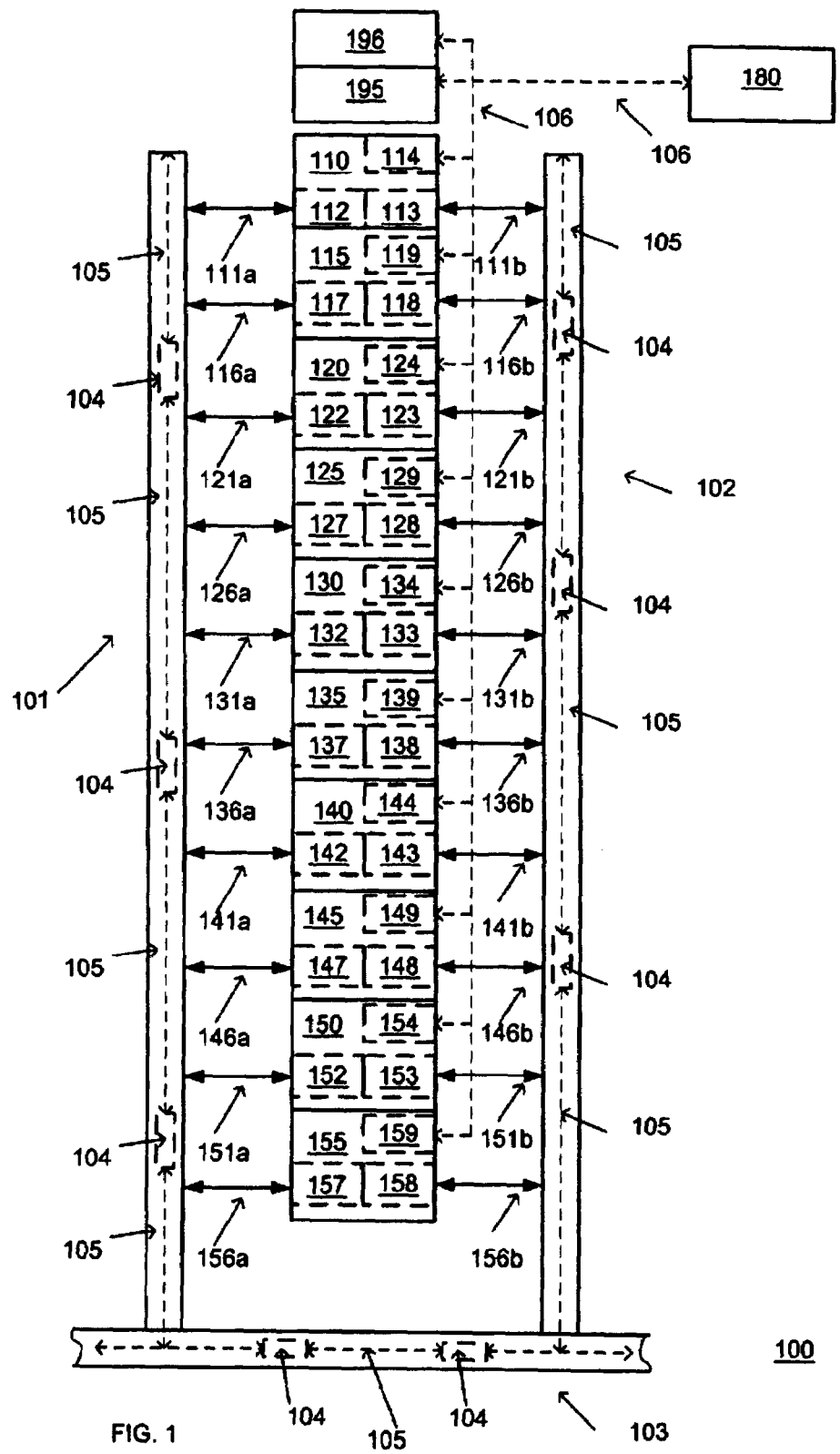
FIG. 1 shows an exemplary block diagram of a processing system in accordance with embodiments of the invention.

The present invention provides apparatus and methods for processing wafers having a large number of semiconductor devices thereon using Site-Dependent (S-D) procedures, sequences, and/or subsystems. When wafers are received, the wafers can be identified as Site-Dependent (S-D) wafers or Non-Site-Dependent (N-S-D) wafers. In various embodiments, apparatus and methods are provided for performing S-D transfer sequences, for processing S-D wafers, for creating an S-D evaluation library, for performing S-D processing sequences that can include one or more S-D creation procedures, and/or one or more S-D evaluation procedures, for performing S-D verification procedures.

Processing systems can include S-D processing elements, S-D evaluation elements, and one or more S-D transfer subsystem coupled to one or more of the S-D processing elements and one or more of the S-D evaluation elements. Alternatively, other configurations may be used.

One or more sites can be provided at various locations on an S-D wafer. Sites can be process-related, and one or more of the sites can be used in S-D evaluation and/or verification procedures. S-D evaluation and/or verification procedures can be used to evaluate and/or verify S-D transfer sequences, S-D wafers, S-D procedures, S-D evaluation libraries, S-D processing sequences, or specific sites used in a processing step, or any combination thereof.

S-D wafers can have wafer data associated with them, and the wafer data can include real-time and historical data. The wafer data can be S-D and/or N-S-D data. In addition, the wafer data can include confidence data and/or risk data for the wafer. S-D wafers can have site data associated with them, and the site data can include the number of required sites, the number of visited sites, confidence data and/or risk data for one or more of the sites, site ranking data, transferring sequence data, or process-related data, or evaluation/verification-related data, or any combination thereof. The wafer data can include one or more transfer sequence variables that can be used to establish the S-D transfer sequence properties. S-D transfer sequences can be changed in real-time to optimize throughput, to maximize the use of processing elements, to maximize the use of evaluation elements, to rework faulty wafers as soon as possible. The wafer data can include one or more processing sequence variables that can be used to establish the S-D processing sequence properties. S-D transfer sequences can be changed in real-time to optimize throughput, to maximize the use of processing elements, to maximize the use of evaluation elements, to rework faulty wafers as soon as possible, to avoid off-line and/or faulty elements, to transfer wafers when one or more sites have been evaluated and/or verified.

S-D transfer and/or S-D processing sequences can also be established for each S-D wafer using the wafer data. S-D processing sequences can be established based on a variety of conditions detailed herein, and S-D transfer sequences can be established based on a variety of conditions detailed herein.

S-D transfer sequences can be established based on the number of sites required for each wafer, the number of wafers that require processing, the number of available S-D processing elements, and the loading data for the S-D transfer subsystem.

S-D transfer sequences can also be established to obtain confidence data for a first one of the required sites on a first wafer in the shortest amount of time, to obtain confidence data for one or more of the required sites on a first wafer in the shortest amount of time, to obtain confidence data for all of the required sites on a first wafer in the shortest amount of time, to obtain confidence data for a first one of the required sites on one or more additional wafers in the shortest amount of time, to obtain confidence data for one or more of the required sites on one or more additional wafers in the shortest amount of time, to obtain confidence data for all of the required sites on one or more additional wafers in the shortest amount of time, to obtain confidence data for a first required site on all of the wafers in a first group in the shortest amount of time, to obtain confidence data for one or more of the required sites on all of the wafers in a first group in the shortest amount of time, or to obtain confidence data for all of the required sites on all of the wafers in a first group in the shortest amount of time, or any combination thereof.

In other embodiments, S-D transfer sequences can be established to obtain risk data for a first wafer in the shortest amount of time, to obtain risk data for one or more additional wafers in the shortest amount of time, or to obtain risk data for all of the wafers in a first group in the shortest amount of time, or any combination thereof. In addition, transfer sequences can be established to obtain new wafer data for a first wafer in the shortest amount of time, to obtain new wafer data for one or more additional wafers in the shortest amount of time, or to obtain new wafer data for all of the wafers in a first group in the shortest amount of time, or any combination thereof. For example, S-D and/or N-S-D wafers can be used, S-D and/or N-S-D confidence data can be obtained, and S-D and/or N-S-D risk data can be obtained.

In still other embodiments, S-D transfer sequences can be established to obtain risk data for a first procedure in the shortest amount of time, to obtain risk data for one or more additional procedures in the shortest amount of time, or to obtain risk data for all of the procedures in a first group from a first library in the shortest amount of time, or any combination thereof.

In additional embodiments, S-D transfer sequences can be established to obtain first library-related data in the shortest amount of time, to obtain additional library-related data in the shortest amount of time, or to obtain all of the library-related data in a first subset of a first library in the shortest amount of time, or any combination thereof. For example, S-D and/or N-S-D library-related data can be obtained.

In addition, S-D transfer sequences can be established to transfer wafers to one or more designated processing elements and/or evaluation elements, to one or more available processing elements and/or evaluation elements, to one or more "golden" processing elements and/or evaluation elements, to one or more low-risk processing elements and/or evaluation elements, to one or more high-confidence processing elements and/or evaluation elements. For example, S-D and/or N-S-D wafers can be used, S-D and/or N-S-D processing elements can be used, and S-D and/or N-S-D evaluation elements can be used.

In additional embodiments, when one or more processing elements and/or evaluation elements are not available, S-D transfer sequences can be established to use a S-D transfer subsystem to "delay" and/or "store" wafers for the shortest amount of time, or when one or more processing elements and/or evaluation elements are not available, S-D transfer sequences can be established to use a S-D transfer subsystem to "delay" and/or "store" wafers for a predetermined amount of time, or when one or more processing elements and/or evaluation elements are not available in a first subsystem, S-D transfer sequences can be established to use a S-D transfer subsystem to transfer the wafers to another subsystem in the shortest amount of time.

S-D transfer sequences can also be established to transfer "delayed" and/or "stored" wafers to one or more processing elements and/or evaluation elements in the shortest amount of time, to one or more newly-available processing elements and/or evaluation elements, to one or more available processing elements and/or evaluation elements after a period of time, to one or more low-risk processing elements and/or evaluation elements, or to one or more high-confidence processing elements and/or evaluation elements.

In other additional embodiments, S-D transfer sequences can be established to transfer "delayed" and/or "stored" wafers to one or more processing elements and/or evaluation elements in the shortest amount of time, to one or more newly-available processing elements and/or evaluation elements, to one or more available processing elements and/or evaluation elements after a period of time, to one or more low-risk processing elements and/or evaluation elements, or to one or more high-confidence processing elements and/or evaluation elements.

S-D transfer sequences can be established to transfer wafers to one or more subsystems for pre- and/or post-processing. For example, S-D wafer data such as wafer profile data, wafer thickness data, wafer temperature data, or optical data, or any combination thereof can be obtained during pre- and/or post-processing. S-D transfer sequences can be established to transfer wafers to one or more rework subsystems in the shortest amount of time when an error occurs.

S-D transfer sequences can be established to allow wafers to continue through processing with at least one verified device thereon to maximize yield, to allow operator intervention, to allow host system intervention, or to minimize the delays caused by a scanner subsystem, or any combination thereof. Current factory systems do not include S-D transfer subsystems for transferring wafers and/or S-D processing subsystems for processing wafers. In addition, current factory systems do not include S-D procedures for processing wafers and/or for communicating S-D wafer data from one subsystem to another subsystem after the wafer is processed. S-D variations caused by a wafer process may not be uniform across the wafer, and S-D variations can include chamber-to-chamber variations, processing times, processing chemistries, and chamber drift over time.

As feature sizes decrease below the 65 nm node accurate processing and/or measurement data becomes more important and more difficult to obtain. S-D procedures can be used to more accurately process and/or measure these ultra-small features. The S-D data can be compared with the warning and/or control limits, and when a run-rule is violated, an alarm can be generated, indicating a processing problem.

FIG. 1 shows an exemplary block diagram of a processing system in accordance with embodiments of the invention. In the illustrated embodiment, processing system 100 comprises system controller 195, a first lithography subsystem 110, a scanner subsystem 115, a second lithography subsystem 120, a third lithography subsystem 125, a thermal processing subsystem 130, an inspection subsystem 135, an etching subsystem 140, a deposition subsystem 145, a evaluation subsystem 150, and a rework subsystem 155. Single subsystems (110, 115, 120, 125, 130, 135, 140, 145, 150, and 155) are shown in the illustrated embodiment; however, multiple subsystems can also be used. For example, in some embodiments, multiple subsystems (110, 115, 120, 125, 130, 135, 140, 145, 150, and 155) may be used in a processing system 100. In addition, one or more of the subsystems (110, 115, 120, 125, 130, 135, 140, 145, 150, and 155) can comprise one or more processing elements that can be used to perform one or more processes.

The system controller 195 can be coupled to the first lithography subsystem 110, the scanner subsystem 115, the second lithography subsystem 120, the third lithography subsystem 125, the thermal processing subsystem 130, the inspection subsystem 135, the etching subsystem 140, the deposition subsystem 145, the evaluation subsystem 150, and the rework subsystem 155 using a data transfer subsystem 106. For example, the second lithography subsystem 120 can include a (post immersion) cleaning subsystem (not shown).

The first lithography subsystem 110 can be coupled 111a to a first S-D transfer subsystem 101 and coupled 111b to a second S-D transfer subsystem 102. The scanner subsystem 115 can be coupled 116a to a first S-D transfer subsystem 101 and coupled 116b to a second S-D transfer subsystem 102. The second lithography subsystem 120 can be coupled 121a to a first S-D transfer subsystem 101 and coupled 122 to a second S-D transfer subsystem 102. The third lithography subsystem 125 can be coupled 126a to a first S-D transfer subsystem 101 and coupled 126b to a second S-D transfer subsystem 102. The thermal processing subsystem 130 can be coupled 131a to a first S-D transfer subsystem 101 and coupled 131b to a second S-D transfer subsystem 102. The inspection subsystem 135 can be coupled 136a to a first S-D transfer subsystem 101 and coupled 136b to a second S-D transfer subsystem 102. The etching subsystem 140 can be coupled 141a to a first S-D transfer subsystem 101 and coupled 141b to a second S-D transfer subsystem 102. The deposition subsystem 145 can be coupled 146a to a first S-D transfer subsystem 101 and coupled 146b to a second S-D transfer subsystem 102. The evaluation subsystem 150 can be coupled 151a to a first S-D transfer subsystem 101 and coupled 151b to a second S-D transfer subsystem 102. The rework subsystem 155 can be coupled 156a to a first S-D transfer subsystem 101 and coupled 156b to a second S-D transfer subsystem 102. Alternatively, other coupling configurations can be used.

In addition, a third transfer subsystem 103 can be coupled to the first S-D transfer subsystem 101 and coupled to the second S-D transfer subsystem 102. The third transfer subsystem 103 can be coupled to other transfer systems and/or processing systems (not shown). For example, transfer systems (101, 102, and 103) can use transfer elements 104 that are coupled to delivery elements 105 to receive wafers, transfer wafers, align wafers, store wafers, and/or delay wafers. Alternatively, other transferring means may be used.

A manufacturing execution system (MES) 180 can be coupled to the system controller 195 using the data transfer subsystem 106. Alternatively, a factory level and/or host system may be used and other coupling techniques may be used. In alternate embodiments, one or more additional subsystems may be required. For example, system controller 195 may be coupled to other processing systems and/or subsystems (not shown). Alternatively, other configurations may be used and other coupling techniques may be used.

The first lithography subsystem 110 can comprise one or more processing elements 112 that can be coupled to the internal transfer device 113 and/or can be coupled 111a to the first S-D transfer subsystem 101. The scanner subsystem 115 can comprise one or more processing elements 117 that can be coupled to the internal transfer device 118 and/or can be coupled 116a to the first S-D transfer subsystem 101. The second lithography subsystem 120 can comprise one or more processing elements 122 that can be coupled to the internal transfer device 123 and/or can be coupled 121a to the first S-D transfer subsystem 101. The third lithography subsystem 125 can comprise one or more processing elements 127 that can be coupled to the internal transfer device 128 and/or can be coupled 126a to the first S-D transfer subsystem 101. The thermal processing subsystem 130 can comprise one or more processing elements 132 that can be coupled to the internal transfer device 133 and/or can be coupled 131a to the first S-D transfer subsystem 101. The inspection subsystem 135 can comprise one or more S-D evaluation elements 137 that can be coupled to the internal transfer device 138 and/or can be coupled 136a to the first S-D transfer subsystem 101. The etching subsystem 140 can comprise one or more processing elements 142 that can be coupled to the internal transfer device 143 and/or can be coupled 141a to the first S-D transfer subsystem 101. The deposition subsystem 145 can comprise one or more processing elements 147 that can be coupled to the internal transfer device 148 and/or can be coupled 146a to the first S-D transfer subsystem 101. The evaluation subsystem 150 can comprise one or more S-D evaluation elements 152 that can be coupled to the internal transfer device 153 and/or can be coupled 151a to the first S-D transfer subsystem 101. The rework subsystem 155 can comprise one or more processing elements 157 that can be coupled to the internal transfer device 158 and/or can be coupled 156a to the first S-D transfer subsystem 101. Various numbers of processing elements may be used in a subsystem. The processing elements can be coupled in series and/or in parallel and can have one or more input ports and/or one or more output ports. For example, the processing elements may include tools, modules, chambers, sensors, and/or other devices.

In some embodiments, the subsystems can comprise additional transfer devices. The first lithography subsystem 110 can comprise one or more internal transfer devices 113 that can be coupled 111b to the second S-D transfer subsystem 102. The scanner subsystem 115 can comprise one or more internal transfer devices 118 that can be coupled 116b to the second S-D transfer subsystem 102. The second lithography subsystem 120 can comprise one or more internal transfer devices 123 that can be coupled 121b to the second S-D transfer subsystem 102. The third lithography subsystem 125 can comprise one or more internal transfer devices 128 that can be coupled 126b to the second S-D transfer subsystem 102. The thermal processing subsystem 130 can comprise one or more internal transfer devices 133 that can be coupled 131b to the second S-D transfer subsystem 102. The inspection subsystem 135 can comprise one or more internal transfer devices 138 that can be coupled 136b to the second S-D transfer subsystem 102. The etching subsystem 140 can comprise one or more internal transfer devices 143 that can be coupled 141b to the second S-D transfer subsystem 102. The deposition subsystem 145 can comprise one or more internal transfer devices 148 that can be coupled 146b to the second S-D transfer subsystem 102. The evaluation subsystem 150 can comprise one or more internal transfer devices 153 that can be coupled 151b to the second S-D transfer subsystem 102. The rework subsystem 155 can comprise one or more internal transfer devices 158 that can be coupled 156b to the second S-D transfer subsystem 102. Alternatively, other coupling configurations can be used. In other embodiments, any number of transfer devices and/or transfer subsystems may be used in a system. The transfer devices and/or transfer subsystems can be coupled in series and/or in parallel and can have one or more input ports and/or one or more output ports.

The first lithography subsystem 110 can comprise one or more controllers 114 that can be coupled to the system controller 195 and/or other controllers using a data transfer subsystem 106. The scanner subsystem 115 can comprise one or more controllers 119 that can be coupled to the system controller 195 and/or other controllers using a data transfer subsystem 106. The second lithography subsystem 120 can comprise one or more controllers 124 that can be coupled to the system controller 195 and/or other controllers using a data transfer subsystem 106. The third lithography subsystem 125 can comprise one or more controllers 129 that can be coupled to the system controller 195 and/or other controllers using a data transfer subsystem 106. The thermal processing subsystem 130 can comprise one or more controllers 134 that can be coupled to the system controller 195 and/or other controllers using a data transfer subsystem 106. The inspection subsystem 135 can comprise one or more controllers 139 that can be coupled to the system controller 195 and/or other controllers using a data transfer subsystem 106. The etching subsystem 140 can comprise one or more controllers 144 that can be coupled to the system controller 195 and/or other controllers using a data transfer subsystem 106. The deposition subsystem 145 can comprise one or more controllers 149 that can be coupled to the system controller 195 and/or other controllers using a data transfer subsystem 106. The evaluation subsystem 150 can comprise one or more controllers 154 that can be coupled to the system controller 195 and/or controllers using a data transfer subsystem 106. The rework subsystem 155 can comprise one or more controllers 159 that can be coupled to the system controller 195 and/or other controllers. Alternatively, other coupling configurations can be used. In other embodiments, any number of controllers may be used in a system. The controllers can be coupled in series and/or in parallel and can have one or more input ports and/or one or more output ports. For example, the controllers may include 8-bit, 16-bit, 32-bit, and/or 64-bit processors.

In addition, subsystems (110, 115, 120, 125, 130, 135, 140, 145, 150, and 155) can be coupled to each other and to other devices using intranet, internet, and wired, and/or wireless connections. The controllers (114, 119, 124, 129, 134, 139, 144, 149, 154, 159, and 195) can be coupled to each other as required.

One or more of the controllers (114, 119, 124, 129, 134, 139, 144, 149, 154, 159, and 195) can be used when performing real-time S-D procedures. A controller can receive real-time data to update subsystem, processing element, process, recipe, profile, and/or model data. One or more of the controllers (114, 119, 124, 129, 134, 139, 144, 149, 154, 159, and 195) can perform real-time S-D procedures using real-time data and provide real-time S-D data as described herein. In some embodiments, one or more controllers can be used to exchange one or more SECS messages with the MES 180, read and/or remove S-D information, feed forward and/or feedback the S-D information, and/or send S-D information as an SECS message. One or more of the controllers (114, 119, 124, 129, 134, 139, 144, 149, 154, 159, and 195) can perform S-D procedures using real-time data and provide real-time S-D data. For example, a controller can be used to receive, process, and/or send the messages containing real-time data.

In addition, controllers (114, 119, 124, 129, 134, 139, 144, 149, 154, 159, and 195) can include memory (not shown) as required. For example, the memory (not shown) can be used for storing information and instructions to be executed by the controllers (114, 119, 124, 129, 134, 139, 144, 149, 154, and 159), and may be used for storing temporary variables or other intermediate information during the execution of instructions by the various computers/processors in the processing system 100. One or more controllers (114, 119, 124, 129, 134, 139, 144, 149, 154, and 159), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system executing one or more sequences of one or more instructions contained in a memory and/or received in a message. Such instructions may be received from another computer, a computer readable medium, or a network connection.

Stored on any one or on any combination of computer readable media, the present invention includes software for controlling the processing system, for driving a device or devices for implementing the invention, and for enabling the processing system 100 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The term "computer readable medium" as used herein refers to any medium that participates in providing instructions to the processor for execution. A computer readable medium may take many forms, including but not limited to, non-volatile media, volatile media, and transmission media.

Subsystems (110, 115, 120, 125, 130, 135, 140, 145, 150, and 155) can comprise processing tools (not shown). In some embodiments, an integrated system can be configured using system components from Tokyo Electron Limited (TEL). In other embodiments, external subsystems and/or tools may be included. The processing tools and/or processing elements can include one or more etch tools, deposition tools, ALD tools, measurement tools, ionizations tools, polishing tools, coating tools, developing tools, cleaning tools, exposure tools, and thermal treatment tools. In addition, measurement tools can be provided that can include a CD-Scanning Electron Microscopy (CDSEM) tool, a Transmission Electron Microscopy (TEM) tool, a focused ion beam (FIB) tool, an ODP tool, an Atomic Force Microscope (AFM) tool, or another optical metrology tool. The subsystems and/or processing elements can have different interface requirements, and the controllers can be configured to satisfy these different interface requirements.

One or more of the subsystems (110, 115, 120, 125, 130, 135, 140, 145, 150, and 155) can comprise control components, GUI components, and/or database components (not shown). For example, GUI components (not shown) that can provide easy to use interfaces that enable users to: view status; create/view/edit site dependent and/or non-S-D procedures, strategies, plans, errors, faults, databases, rules, recipes, modeling applications, simulation and/or spreadsheet applications, email messages, and diagnostics screens. As should be apparent to those skilled in the art, the GUI components need not provide interfaces for all functions, and may provide interfaces for any subset of these functions or others not listed here.

One or more of the controllers (114, 119, 124, 129, 134, 139, 144, 149, 154, 159, and 195) and/or the system controller 195 can be coupled to data transfer system 190 for exchanging information with the MES 180 and other subsystems. The data transfer system 190 can comprise hardwire and wireless components.

Subsystems (110, 115, 120, 125, 130, 135, 140, 145, 150, and 155), controllers (114, 119, 124, 129, 134, 139, 144, 149, 154, and 159), and/or the system controller 195 can include Advanced Process Control (APC) applications, Fault Detection and Classification (FDC), and/or Run-to-Run (R2R) applications. In some embodiments, S-D APC applications, S-D FDC applications, and/or S-D R2R applications can be performed.

In some embodiments, one or more of the controllers (114, 119, 124, 129, 134, 139, 144, 149, 154, 159, and 195) can perform S-D process optimization procedures, S-D model optimization procedures, or can perform S-D library optimization procedures, or any combination thereof. The S-D optimization procedures can use wafer data, models, recipes, and profile data to update and/or optimize a procedure. For example, the S-D optimization procedures can be operating in real-time. By using real-time S-D optimization, more accurate process results can be achieved. In smaller geometry technologies below the 65 nm node, results that are more accurate are required.

Material and/or process variations that can affect process recipes, profiles, models, and/or process results can change from site-to-site within a wafer, from wafer-to-wafer, and from lot-to-lot. These variations can be caused by changes and/or problems in the one or more of the subsystems (110, 115, 120, 125, 130, 135, 140, 145, 150, and 155). Non-uniform films and/or non-uniform processes can cause problems. In addition, tool-to-tool variations, chamber-to-chamber variations, and chamber drift can lead to problems over time. Thicknesses and/or uniformities can change from site-to-site within a wafer, from wafer to wafer, and from lot to lot during the etch process due to the nature of using end pointing and sacrificial films to control a bottom CD. In addition, thickness variations can cause changes in the optical properties and other physical properties. S-D procedures can be used to eliminate or minimize the problems caused by "over-etching".

Output data and/or messages from S-D procedures can be used in subsequent procedures to optimize the process accuracy and precision. Data can be passed to S-D calculation procedures in real-time as real-time variable parameters, overriding current model default values and narrowing the search space for resolving accurate results. Information can be used with a library-based system or in real-time regression steps or any combination thereof to optimize a procedure.

An evaluation subsystem, such as 150, can include an integrated Optical Digital Profiling (iODP) system (not shown). Alternatively, other metrology systems may be used. An iODP tool is available from Timbre Technologies Inc. (a TEL company). For example, ODP techniques can be used to obtain critical dimension (CD) information, structure profile information, or via profile information, and the wavelength ranges for an iODP system can range from less than approximately 200 nm to greater than approximately 900 nm. An exemplary iODP system can include an ODP Profiler Library, a Profiler Application Server (PAS), and ODP Profiler Software. The ODP Profiler Library can comprise an application specific database of optical spectra and its corresponding semiconductor profiles, CDs, and film thicknesses. The PAS can comprise at least one computer that connects with optical hardware and computer network. The PAS handles the data communication, ODP library operation, measurement process, results generation, results analysis, and results output. The ODP Profiler Software includes the software installed on PAS to manage measurement recipe, ODP Profiler library, ODP Profiler data, ODP Profiler results search/match, ODP Profiler results calculation/analysis, data communication, and PAS interface to various metrology tools and computer network.

An evaluation subsystem, such as 150, can use polarizing reflectometry, spectroscopic ellipsometry, reflectometry, or other optical measurement techniques to measure accurate device profiles, accurate critical dimensions (CD), and multiple layer film thickness of a wafer. The integrated metrology process (iODP) can be executed in-line, which eliminates the need to break the wafer for performing the analyses or waiting for long periods for data from external tools. ODP techniques can be used with the existing thin film metrology tools for inline profile and CD measurement, and can be integrated with TEL processing tools and/or lithography systems to provide real-time process monitoring and control. An exemplary optical metrology system is described in U.S. Pat. No. 6,913,900, entitled GENERATION OF A LIBRARY OF PERIODIC GRATING DIFFRACTION SIGNAL, by Niu, et al., issued on Sep. 13, 2005, and is incorporated in its entirety herein by reference.

An alternative procedure for generating an S-D library of simulated-diffraction signals can include using a machine learning system (MLS). Prior to generating the library of simulated-diffraction signals, the MLS is trained using known input and output data. In one exemplary embodiment, simulated diffraction signals can be generated using a machine learning system (MLS) employing a machine learning algorithm, such as back-propagation, radial basis function, support vector, kernel regression, and the like. For a more detailed description of machine learning systems and algorithms, see "Neural Networks" by Simon Haykin, Prentice Hall, 1999, which is incorporated herein by reference in its entirety. See also U.S. patent application Ser. No. 10/608, 300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

For detailed description of metrology model optimization, refer to U.S. patent application Ser. No. 10/206,491, OPTIMIZED MODEL AND PARAMETER SELECTION FOR OPTICAL METROLOGY, by Vuong, et al., filed Jun. 27, 2002; Ser. No. 10/946,729, OPTICAL METROLOGY MODEL OPTIMIZATION BASED ON GOALS, by Vuong, et al., filed Sep. 21, 2004; and U.S. patent application Ser. No. 11/061,303, OPTICAL METROLOGY OPTIMIZATION FOR REPETITIVE STRUCTURES, by Vuong, et al., filed on Apr. 27, 2004, all of which are incorporated herein by reference in their entireties.

When a regression-based process is used, a measured diffraction signal measured off the patterned structure can be compared to simulated diffraction signals. The simulated diffraction signals can be iteratively generated based on sets of profile parameters, to get a convergence value for the set of profile parameters that generates the closest match simulated diffraction signal compared to the measured diffraction signal. For a more detailed description of a regression-based process, see U.S. Pat. No. 6,785,638, titled METHOD AND SYSTEM OF DYNAMIC LEARNING THROUGH A REGRESSION-BASED LIBRARY GENERATION PROCESS, issued on Aug. 31, 2004, which is incorporated herein by reference in its entirety.

When a library-based process is used, an optical metrology data library can be generated and/or enhanced using S-D and/or optimized recipes, profiles, and/or models. The optical metrology data library can comprise pairs of simulated diffraction signals and corresponding set of profile parameters. A detailed description of generating optical metrology data such as a library of simulated diffraction signals and corresponding set of profile parameters is described in U.S. Pat. No. 6,913,900, entitled GENERATION OF A LIBRARY OF PERIODIC GRATING DIFFRACTION SIGNAL, by Niu, et al., issued on Sep. 13, 2005, and is incorporated in its entirety herein by reference. The regression-based and/or the library-based process can include S-D and/or non-S-D steps.

One or more of the controllers (114, 119, 124, 129, 134, 139, 144, 149, 154, 159, and 195) can perform APC, R2R, FDC, and/or S-D procedures that can operate as control strategies, control plans, control models, and/or recipe managers to provide real-time S-D processing. S-D control and/or analysis strategies/plans can cover multiple process steps within a wafer processing sequence, and can be used to analyze the real-time and/or collected data, and establish error conditions. An S-D analysis procedure can be executed when a context is matched. During the execution of an S-D analysis procedure, one or more analysis plans can be executed. An S-D plan can create an error when a data failure occurs, an execution problem occurs, or a control problem occurs. An S-D data collection plan and/or analysis plan can reject the data at one or more of the evaluation sites for a wafer or reject the data because an S-D procedure fails. For example, dynamic S-D context matching allows for custom configuration at each site.

In one embodiment, an S-D procedure failure may not terminate the S-D procedure. For example, an S-D procedure can indicate a failure when a limit is exceeded. Successful S-D procedures can create warning messages when limits are being approached. Pre-specified failure actions for S-D procedures errors can be stored in a database, and can be retrieved from the database when an error occurs.

In some embodiments, one or more of the subsystems (110, 115, 120, 125, 130, 135, 140, 145, 150, and 155), can use S-D data received via the data transfer system 190 to perform S-D procedures.

When a 25-wafer lot is being processed in a processing system, the processing throughput may be enhanced by providing 25 parallel processing paths, but this is impractical. However, an S-D processing system 100 can be used to efficiently and cost-effectively process one or more 25-wafer lots. In addition, an S-D processing system 100 can be used to efficiently and cost-effectively process smaller and/or larger wafer lots.

Transfer subsystems (101, 102, and 103) and transfer devices (113, 118, 123, 128, 133, 138, 143, 148, 153, and 158) can use S-D transfer sequences and/or procedures to efficiently and cost-effectively transfer, align, delay, and/or store one or more wafers in one or more wafer lots. Some S-D procedures can be wafer-dependent, lot-dependent, and/or product dependent procedures.

The first lithography subsystem 110 can comprise one or more processing elements 112 that can process, measure, inspect, align, and/or store one or more wafers using S-D procedures and/or non-S-D procedures. The transfer device 113, the first S-D transfer subsystem 101, and/or the second S-D transfer subsystem 102 can transfer, measure, inspect, align, and/or store one or more wafers using S-D procedures and/or non-S-D procedures. In some embodiments, the first lithography subsystem 110 can comprise one or more processing elements 112 that can perform coating procedures, thermal procedures, measurement procedures, inspection procedures, alignment procedures, and/or storage procedures on one or more wafers using S-D procedures and/or non-S-D procedures. For example, one or more of the processing elements 112 can be used to deposit one or more masking layers that can include photoresist material, and/or anti-reflective coating (ARC) material, and one or more of the processing elements 112 can be used to thermally process (bake) one or more of the masking layers. In addition, one or more processing elements 112 can be used to measure and/or inspect one or more of the masking layers. S-D procedures and/or non-S-D procedures can be used to measure and/or inspect one or more of the wafers. One or more controllers 113 can perform S-D procedures and/or non-S-D procedures to determine if the wafer has been processed correctly or if a rework procedure is required. The internal transfer device 113, the first S-D transfer subsystem 101, and/or the second S-D transfer subsystem 102 can transfer a defective wafer to a rework subsystem.

In other embodiments, the first lithography subsystem 110 can comprise one or more processing elements 112 that can perform the potentially contaminating processes. One or more processing elements 112 can be isolated from the other subsystems, and this can provide lower defectivity and minimize possible contamination. One or more processing elements 112 can comprise airborne particle counters that can be established in the wafer path and/or in critical process areas to monitor ambient defect levels. Detection levels can be established for warning and/or alarm conditions. For example, these processes can include the "dirty" bake processes, and this allows these "dirty" processes to be isolated from the rest of the system. In addition, one or more rework procedures may be performed by processing elements isolated from the other subsystems.

The scanner subsystem 115 can comprise one or more processing elements 117 that can process, measure, inspect, align, and/or store one or more wafers using S-D procedures and/or non-S-D procedures. The internal transfer device 118, the first S-D transfer subsystem 101, and/or the second S-D transfer subsystem 102 can transfer, measure, inspect, align, and/or store one or more wafers using S-D procedures and/or non-S-D procedures. In some embodiments, the scanner subsystem 115 can comprise one or more processing elements 117 that can perform exposure procedures, thermal procedures, drying procedures, measurement procedures, inspection procedures, alignment procedures, and/or storage procedures on one or more wafers using S-D procedures and/or non-S-D procedures. In addition, the scanner subsystem 115 can be used to perform wet and/or dry exposure procedures that can be S-D. In other processing sequences, the scanner subsystem 115 can be used to perform extreme ultraviolet (EUV) exposure procedures that can be S-D. For example, one or more of the processing elements 117 can be used to expose one or more masking layers that can include photoresist material, and/or anti-reflective coating (ARC) material, and one or more of the processing elements 117 can be used to pattern one or more of the masking layers. In addition, one or more processing elements 112 can be used to measure and/or inspect one or more of the patterned layers. S-D procedures and/or non-S-D procedures can be used to measure and/or inspect one or more of the wafers. One or more controllers 113 can perform S-D procedures and/or non-S-D procedures to determine if the wafer has been processed correctly or if a rework procedure is required. The internal transfer device 118, the first S-D transfer subsystem 101, and/or the second S-D transfer subsystem 102 can transfer a defective wafer to a rework subsystem.

The second lithography subsystem 120 can comprise one or more processing elements 112 that can process, measure, inspect, align, and/or store one or more wafers using S-D procedures and/or non-S-D procedures. The internal transfer device 123, the first S-D transfer subsystem 101, and/or the second S-D transfer subsystem 102 can transfer, measure, inspect, align, and/or store one or more wafers using S-D procedures and/or non-S-D procedures. In some embodiments, the second lithography subsystem 120 can comprise one or more processing elements 122 that can perform cleaning procedures, thermal procedures, measurement procedures, inspection procedures, alignment procedures, and/or storage procedures on one or more wafers using S-D procedures and/or non-S-D procedures. For example, one or more of the processing elements 122 can be used to perform post-immersion cleaning procedures, and one or more of the processing elements 122 can be used to thermally process (dry) one or more of the wafers. In addition, one or more processing elements 122 can be used to measure and/or inspect one or more of the cleaned and/or dried wafers. S-D procedures and/or non-S-D procedures can be used to measure and/or inspect one or more of the wafers. One or more controllers 124 can perform S-D procedures and/or non-S-D procedures to determine if the wafer has been cleaned correctly or if a rework procedure is required. For example, water spots and/or other abnormalities can be detected. The internal transfer device 123, the first S-D transfer subsystem 101, and/or the second S-D transfer subsystem 102 can transfer a defective wafer to a rework subsystem.

The third lithography subsystem 125 can comprise one or more processing elements 127 that can process, measure, inspect, align, and/or store one or more wafers using S-D procedures and/or non-S-D procedures. The internal transfer device 128, the first S-D transfer subsystem 101, and/or the second S-D transfer subsystem 102 can transfer, measure, inspect, align, and/or store one or more wafers using S-D procedures and/or non-S-D procedures. In some embodiments, the third lithography subsystem 125 can comprise one or more processing elements 127 that can perform developing procedures, thermal procedures, measurement procedures, inspection procedures, alignment procedures, and/or storage procedures on one or more wafers using S-D procedures and/or non-S-D procedures. For example, one or more of the processing elements 127 can be used to develop one or more patterned mask layers that can include photoresist material, and/or anti-reflective coating (ARC) material, and one or more of the processing elements 127 can be used to thermally process (bake) one or more of the patterned mask layers. In addition, one or more processing elements 127 can be used to measure and/or inspect one or more of the patterned mask layers. S-D procedures and/or non-S-D procedures can be used to measure and/or inspect one or more of the wafers. One or more controllers 129 can perform S-D procedures and/or non-S-D procedures to determine if the wafer has been processed correctly or if a rework procedure is required. The internal transfer device 128, the first S-D transfer subsystem 101, and/or the second S-D transfer subsystem 102 can transfer a defective wafer to a rework subsystem.

In other embodiments, the third lithography subsystem 125 can comprise one or more processing elements 127 that can perform the potentially contaminating processes. One or more processing elements 127 can be isolated from the other subsystems, and this can provide lower defectivity and minimize possible contamination. One or more processing elements 127 can comprise airborne particle counters that can be established in the wafer path and/or in critical process areas to monitor ambient defect levels. Detection levels can be established for warning and/or alarm conditions. For example, these processes can include the "dirty" bake processes, and this allows these "dirty" processes to be isolated from the rest of the system. In addition, one or more rework procedures may be performed by processing elements isolated from the other subsystems.

The thermal processing subsystem 130 can comprise one or more processing elements 132 that can process, measure, inspect, align, and/or store one or more wafers using S-D procedures and/or non-S-D procedures. The internal transfer device 133, the first S-D transfer subsystem 101, and/or the second S-D transfer subsystem 102 can transfer, measure, inspect, align, and/or store one or more wafers using S-D procedures and/or non-S-D procedures. In some embodiments, the thermal processing subsystem 130 can comprise one or more processing elements 132 that can perform baking procedures, annealing procedures, spike-annealing procedures, thermal procedures, measurement procedures, inspection procedures, alignment procedures, and/or storage procedures on one or more wafers using S-D procedures and/or non-S-D procedures. For example, one or more of the processing elements 132 can be used to raise and/or control the temperature of one or more of the wafers, and one or more of the processing elements 132 can be used to lower and/or control the temperature of one or more of the wafers. In addition, one or more processing elements 132 can be used to measure and/or inspect one or more of the wafers. S-D procedures and/or non-S-D procedures can be used to measure and/or inspect one or more of the wafers. One or more controllers 134 can perform S-D procedures and/or non-S-D procedures to determine if the wafer has been processed correctly or if a rework procedure is required. The internal transfer device 133, the first S-D transfer subsystem 101, and/or the second S-D transfer subsystem 102 can transfer a defective wafer to a rework subsystem.

The inspection subsystem 135 can comprise one or more S-D evaluation elements 137 that can evaluate, process, measure, inspect, align, verify, and/or store one or more wafers using S-D procedures and/or non-S-D procedures. The internal transfer device 138, the first S-D transfer subsystem 101, and/or the second S-D transfer subsystem 102 can transfer, measure, inspect, align, and/or store one or more wafers using S-D procedures and/or non-S-D procedures. In some embodiments, the inspection subsystem 135 can comprise one or more S-D evaluation elements 137 that can perform evaluation procedures, inspection procedures, particle detection procedures, measurement procedures, alignment procedures, verification procedures, and/or storage procedures on one or more wafers using S-D procedures and/or non-S-D procedures. For example, one or more of the S-D evaluation elements 137 can be used to perform optical inspections, and one or more of the S-D evaluation elements 137 can be used to perform inspections at shorter wavelengths on one or more of the wafers. In addition, one or more S-D evaluation elements 137 can be used to detect particles on one or more of the wafers. S-D procedures and/or non-S-D procedures can be used to measure and/or inspect one or more surfaces of the wafers. One or more controllers 139 can perform S-D procedures and/or non-S-D procedures to determine if the wafer has been processed correctly or if a rework procedure is required. The internal transfer device 138, the first S-D transfer subsystem 101, and/or the second S-D transfer subsystem 102 can transfer a defective wafer to a rework subsystem.

The etching subsystem 140 can comprise one or more processing elements 142 that can process, measure, inspect, align, and/or store one or more wafers using S-D procedures and/or non-S-D procedures. The internal transfer device 143, the first S-D transfer subsystem 101, and/or the second S-D transfer subsystem 102 can transfer, measure, inspect, align, and/or store one or more wafers using S-D procedures and/or non-S-D procedures. In some embodiments, the etching subsystem 140 can comprise one or more processing elements 142 that can perform etching procedures, chemical oxide removal (COR) procedure, ashing procedures, inspection procedures, rework procedures, measurement procedures, alignment procedures, and/or storage procedures on one or more wafers using S-D procedures and/or non-S-D procedures. For example, one or more of the processing elements 142 can be used to create and/or modify patterned wafers using one or more S-D and/or non-S-D plasma etching procedures, and one or more of the processing elements 142 can be used to create and/or modify patterned wafers using one or more S-D and/or non-S-D non-plasma etching procedures. In addition, one or more processing elements 142 can be used to remove layer material and/or process residue from one or more of the wafers. S-D procedures and/or non-S-D procedures can be used to measure and/or inspect one or more surfaces of the wafers. One or more controllers 144 can perform S-D procedures and/or non-S-D procedures to determine if the wafer has been processed correctly or if a rework procedure is required. The internal transfer device 143, the first S-D transfer subsystem 101, and/or the second S-D transfer subsystem 102 can transfer a defective wafer to a rework subsystem.

The deposition subsystem 145 can comprise one or more processing elements 147 that can process, measure, inspect, align, and/or store one or more wafers using S-D procedures and/or non-S-D procedures. The internal transfer device 148, the first S-D transfer subsystem 101, and/or the second S-D transfer subsystem 102 can transfer, measure, inspect, align, and/or store one or more wafers using S-D procedures and/or non-S-D procedures. In some embodiments, the deposition subsystem 145 can comprise one or more processing elements 147 that can perform deposition procedures, inspection procedures, measurement procedures, alignment procedures, and/or storage procedures on one or more wafers using S-D procedures and/or non-S-D procedures. For example, one or more of the processing elements 147 can be used to perform physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. S-D procedures and/or non-S-D procedures can be used to measure and/or inspect one or more surfaces of the wafers. One or more controllers 149 can perform S-D procedures and/or non-S-D procedures to determine if the wafer has been processed correctly or if a rework procedure is required. The internal transfer device 148, the first S-D transfer subsystem 101, and/or the second S-D transfer subsystem 102 can transfer a defective wafer to a rework subsystem.

The evaluation subsystem 150 can comprise one or more S-D evaluation elements 152 that can evaluate, measure, inspect, align, verify, and/or store one or more wafers using S-D procedures and/or non-S-D procedures. The internal transfer device 153, the first S-D transfer subsystem 101, and/or the second S-D transfer subsystem 102 can transfer, measure, inspect, align, and/or store one or more wafers using S-D procedures and/or non-S-D procedures. In some embodiments, the evaluation subsystem 150 can comprise one or more S-D evaluation elements 152 that can perform evaluation procedures, inspection procedures, temperature control procedures, measurement procedures, alignment procedures, verification procedures, and/or storage procedures on one or more wafers using S-D procedures and/or non-S-D procedures. For example, one or more of the S-D evaluation elements 152 can be used to perform optical metrology procedures that can be used to measure features and/or structures on the wafer, and one or more of the S-D evaluation elements 152 can be used to perform measurements of the wafer surface. In addition, one or more S-D evaluation elements 152 can be used to determine wafer curvature or to measure and/or inspect one or more surfaces of the wafers. An S-D evaluation element 152 can perform S-D evaluation procedures and/or non-S-D evaluation procedures. One or more controllers 154 can perform S-D procedures and/or non-S-D procedures to determine if the wafer has been processed correctly or if a rework procedure is required. The internal transfer device 153, the first S-D transfer subsystem 101, and/or the second S-D transfer subsystem 102 can transfer a defective wafer to a rework subsystem.

The rework subsystem 155 can comprise one or more processing elements 157 that can process, measure, inspect, align, and/or store one or more wafers using S-D procedures and/or non-S-D procedures. The internal transfer device 158, the first S-D transfer subsystem 101, and/or the second S-D transfer subsystem 102 can transfer, measure, inspect, align, and/or store one or more wafers using S-D procedures and/or non-S-D procedures. In some embodiments, the rework subsystem 155 can comprise one or more processing elements 157 that can perform cleaning procedures, etching procedures, layer removal procedures, ashing procedures, inspection procedures, residue removal procedures, measurement procedures, alignment procedures, and/or storage procedures on one or more wafers using S-D procedures and/or non-S-D procedures. For example, one or more of the processing elements 157 can be used to remove material from one or more patterned wafers using one or more S-D and/or non-S-D plasma etching procedures, and one or more of the processing elements 157 can be used to remove material from one or more patterned using one or more S-D and/or non-S-D non-plasma etching procedures. In addition, one or more processing elements 157 can be used to remove damaged material from one or more of the wafers. S-D procedures and/or non-S-D procedures can be used to measure and/or inspect one or more surfaces of the wafers. One or more controllers 159 can perform S-D procedures and/or non-S-D procedures to determine if the wafer has been processed correctly or if a rework procedure is required. The internal transfer device 158, the first S-D transfer subsystem 101, and/or the second S-D transfer subsystem 102 can transfer a defective wafer to a rework subsystem.

Each subsystem can process one or more wafers in parallel, and one or more S-D procedures and/or non-S-D procedures can be performed.

One or more of the formatted messages can be exchanged between subsystems. The controllers can process messages and extract new data. When new data is available, a controller can either use the new data to update a recipe, profile, and/or model currently being used for the wafer lot or can use the new data to update a recipe, profile, and/or model for the next wafer lot. When the controller uses the new data to update recipe data, profile data, and/or modeling data for the wafer lot currently being processed, the controller can determine if a recipe, a profile, and/or a model can be updated before the current wafer is processed. The current wafer can be processed using the updated recipe, profile, and/or model when the recipe, profile, and/or model can be updated before the current wafer is processed. The current wafer can be processed using a non-updated recipe, profile, and/or model when the data cannot be updated before the current wafer is processed. For example, when a new S-D etching recipes, profiles, and/or models are available, an etching subsystem and/or etching controller may determine when to use the new S-D etching recipes, profiles, and/or models.

One or more evaluation procedures can provide S-D damage-assessment data and/or non-S-D damage-assessment data that can include data for damaged layers, features, and/or structures for different sites, wafers, and/or lots. One or more processing subsystems can use the damage-assessment data to update, and/or optimize processing recipe data, process profile data, and/or modeling data. For example, the etching subsystem 140 can use the damage-assessment data to update, and/or optimize an etching chemistry and/or etching time. In addition, the deposition subsystem 145 and/or lithography subsystem (110, 120, and 125) can use the damage-assessment data to update, and/or optimize recipe data, profile data, and/or modeling data.

S-D procedures can be used to create, modify, and/or evaluate isolated and/or nested structures at different times and/or sites. For example, wafer thickness data can be different near isolated and/or nested structures, and wafer thickness data can be different near open areas and/or trench array areas. A processing subsystem can use new S-D data for isolated and/or nested structures to update and/or optimize an S-D process recipe and/or process time. S-D procedures can use end-point detection (EPD) data and process time data to improve the computational accuracy. While a wafer and/or lot is being processed, S-D data can be generated, and this data can be fed forward and/or fed back in real time by the processing system to update process, measurement, and/or simulation recipes before the current wafer is processes or before additional wafers in the wafer lot are processed. Alternatively, non-S-D data may be used. When EPD data is used to stop an S-D procedure, the EPD time data and the process rate data can be used to calculate and/or estimate an S-D film thickness. During processing, monitor and/or verification wafers can be run periodically, and S-D measurement procedures can be used to verify the S-D film thicknesses before and/or after S-D processing procedures, such as etch, deposition, lithography, cleaning, and polishing procedures.

Evaluation subsystem 150 data can include measured and/or simulated signals associated with S-D patterned structures or un-patterned structures, and the S-D signals can be stored using processing state data, and wafer, lot, recipe, site, or wafer location data. Measurement data can include variables associated with patterned structure profile, metrology device type and associated variables, and ranges used for the variables floated in the modeling and values of variables that were fixed in the modeling. The library profile data, the S-D data may include fixed and/or variable profile parameters (such as CD, sidewall angle, N&K parameters), and/or metrology device parameters (such as wavelengths, angle of incidence, and/or azimuth angle).

In some embodiments, S-D procedures can use measured, predicted, and/or simulated diffraction signals to optimize an optical metrology recipe, structure, and/or model. S-D procedures may utilize context/identification information such as site ID, wafer ID, slot ID, lot ID, recipe, state, and patterned structure ID as a means for organizing and indexing data. In some example, the library data can include verified data associated with products, devices, wafers, procedures, lots, recipes, sites, locations, patterned and/or un-patterned structures. S-D data may include underlying film data and the underlying film data may be used by the S-D procedures to make real-time updates and/or corrections. During processing, some measurement sites can be non-measurable due to interference from underlying layers and or structures. S-D interference-based maps can be created and used to determine site locations that can be used for the measurements. In addition, S-D interference profiles and/or models can be created can be used to overcome these problems.

In addition, the S-D procedures may create, update, and/or optimize a library of S-D signals and the corresponding set of S-D profile parameters. The S-D procedures may create, update, and/or optimize a data set from a trained machine learning system (MLS), and the MLS may be trained with a subset of the library data. Changed and/or updated values can be stored and/or used to improve performance. S-D and/or non-S-D libraries and databases can be used.

Intervention and/or judgment rules can be defined in an S-D strategy, plan, model, subsystem, element, or procedure. Intervention and/or judgment rules can be assigned to execute whenever a matching context is encountered. The intervention and/or judgment rules can be for various procedures and can be maintained in the database.

In some examples, the MES 180 may be configured to monitor some system processes, and factory level intervention and/or judgment rules can be used to determine which processes are monitored and which data can be used. In addition, factory level intervention and/or judgment rules can be used to determine how to manage the data when a process can be changed, paused, and/or stopped. In addition, the MES 180 can provide S-D configuration information and S-D update information. Data can be exchanged using GEM SECS communications protocol.

In general, rules allow S-D procedures to change based on the dynamic state of a semiconductor processing system and/or the processing state of a product. Some setup and/or configuration information can be determined by the processing system subsystems when they are initially configured. In addition, rules can be used to establish a control hierarchy for S-D procedures. Rules can be used to determine when a process can be paused and/or stopped, and what can be done when a process is paused and/or stopped. In addition, processing rules can be used to determine what corrective actions are to be performed. Processing sequence rules and transfer sequence rules can also be used to determine what wafers are to be processes and/or transferred. Exemplary methods of processing a wafer can include receiving one or more wafers and associated wafer data, and establishing a processing sequence and/or state data for each wafer.

The wafer state data can include a sequencing state ($SQ_{n,m}$) variable that can be determined from the processing sequence. In some embodiments, the processing sequence can be obtained from a MES 180 and cannot be modified. In other embodiments, a virtual (modifiable) processing sequence can be established, and the sequencing state and/or process start time can be changed by a subsystem computer and/or an operator. For example, additional sequence states altered start times may be used to establish additional processing steps, to hold wafers while processing steps are being performed, to hold wafers while calculations are being performed, to route wafers to different tools when a tool goes off-line, and/or to correct and/or analyze fault conditions. In addition, additional sequence steps and/or delayed start times may be used to hold and/or re-route wafers while S-D data and/or messages are created, processed, sent, and/or received.

In some examples, an S-D transfer subsystem can use loading data to determine where to transfer a wafer. In other examples, an S-D transfer subsystem can use processing sequence data to determine where to transfer a wafer. In still other examples, an S-D transfer subsystem can use confidence data to determine where to transfer a wafer. Alternatively, other procedures may be used.

The confidence data can include an assessment of each process that was performed on the wafer. When processing data from an S-D procedure is close to expected values, the confidence value for that S-D procedure can be high, and when processing data from an S-D procedure is not close to the expected values, the confidence value for that S-D procedure can be low. For example, confidence values can range from zero to nine, where zero indicates a failure condition and nine indicates a correct performance.

Wafer state data can include wafer number (WN) data, processing sequence (PS) data, step counter (SC) data, process type (PT) data, process state (PS) data, site dependency (SD) data, status (ST) data, and delay time (DT) data. The wafer number (WN) data can be used to identify a wafer, the processing sequence (PS) data can be used to identify the processing sequences associated with a wafer, step counter (SC) data can be used to identify the number of process steps for a wafer, process type (PT) data can be used to establish the type of process that was performed at each process step, site dependency (SD) can be a site dependency number and can be used to establish the one or more sites that were used to establish the type of S-D procedure to perform at each process step, the status (ST) and can be used to establish if a process step has been performed and whether or not the process step was successful, and the delay time (DT) data can include timing data. A delay time data can be used to delay wafer sequencing, calculations, processes, and/or measurements.

In some embodiments, the wafer data can include a variable data. For example, when a feed-forward variable is a first value, the data and/or messages can be fed forward, and when the feed-forward variable is a second value, the data and/or messages are not fed forward. When an S-D variable is a first value, an S-D procedure can be performed, and when the S-D variable is a second value, a non-S-D procedure can be performed.

In some embodiments, input and output messages can include fault messages, response messages, error messages, S-D messages, feedback messages, non-S-D messages, internal messages, external messages, optimization messages, status messages, timing messages, process results messages, and/or other messages. In addition, messages can include real-time command, configuration, calculation, and/or override information. The data can be used in real-time as S-D procedure variables/parameters, can be used to override current recipe data, profile, and/or model default values, to override current transfer sequence data, to override current start times, and can be used to narrow the search space for determining recipes, profiles, and/or models and their associated accuracy limits.

In various embodiments, one or more input messages can be received and/or processed by one or more of the controllers (114, 119, 124, 129, 134, 139, 144, 149, 154, and 159), and one or more output messages can be created and/or sent by one or more of the controllers (114, 119, 124, 129, 134, 139, 144, 149, 154, and 159). In some examples, an input message can be a formatted message comprising S-D data and non-S-D data. A controller can process a formatted message to create an S-D message and/or a separate non-S-D message for a subsystem. The S-D message can include S-D wafer data that can be used to reduce search times in libraries and databases, to reduce calculation errors, to improve accuracy. For example, a smaller profile space within a library space can be identified using the S-D data. In addition, S-D thickness and/or temperature data can be used and an S-D procedure can use this data to determine profiles from the profile library in real-time, thereby decreasing measurement time and increasing throughput. The controller can examine the input message in real time to determine when the input message includes an S-D message that it can use, and/or the controller can determine how to extract in real-time the S-D message. Messages can use XML format and/or SML format. The system can provide and manage exception handling with S-D messages that are being sent, split, and/or parsed for multiple subsystems.

For example, some devices/products may require 20-30 nm gate structures, and there may millions of these structures on every wafer being produced. S-D processing can be used to minimize the amount of testing that must be performed to guarantee that the structures are correct.

The processing sequence can also depend on the throughput of other subsystems including the scanner subsystem. The S-D transfer system can be configured to maximize the overall throughput. For example, S-D transfer sequences can be established and used to minimize throughput issues caused by slower subsystems, such as the scanner subsystem. In some embodiments, the S-D transfer subsystem can delay wafers having a lower confidence value and/or higher risk. In other embodiments, the S-D transfer subsystem can immediately send wafers having a lower confidence value and/or higher risk to a rework subsystem when a rework processing sequence can be established and performed in a relatively short amount of time.

An S-D procedure can produce a specific result at a specific location on a wafer. When a process is mature, confidence values should be high, and a minimum amount of wafers should require evaluation, one site on a wafer can be used to declare a wafer and/or group of wafers. When the process is mature, the process results from all of the sites on a wafer should be the same (within a uniformity limit). When a product is being developed, evaluation features/properties/structures at a large number of sites can be used to establish low risk procedures.

The processing system 100 can be used to verify one or more S-D processing procedures.

In some embodiments, one or more wafers can be received by one or more S-D transfer subsystems (101, 102), and the S-D TRANSFER subsystems (101, 102) can be coupled to one or more subsystems (110, 115, 120, 125, 130, 135, 140, 145, 150, and 155) in the processing system 100. Each wafer can have one or more layers thereon, can have wafer data associated therewith, and the wafer data can include historical and/or real-time data. An S-D transfer subsystem can use business rules to determine when to send wafers to the rework subsystem and or storage locations. These business rules can be different as the wafers are processed (acquire additional layers).

For example, a "golden wafer" can be produced using a "golden" S-D processing sequence. At some locations on the wafer, measurement structure can be established that are near one or more of the gate structures. At these locations, CDSEM data can be processed using the first wafer data and first confidence data can be obtained during the comparisons. The confidence data can be compared to confidence limits. If the first confidence limit is not with a first delta, the processing (measurement) sequence for that wafer can be changed and measurement data can be obtained from one or more additional sites on the wafer. If the confidence data is bad, the wafer can be reworked. If the confidence data at more than one site is bad, the wafer can be reworked. If the confidence data for more than one wafer is bad, the entire group can be reworked.

The S-D transfer system can be configured to maximize the overall throughput. For example, S-D transfer sequences can be established and used to minimize throughput issues caused by slower subsystems, such as the scanner subsystem. In some embodiments, the S-D transfer subsystem can delay wafers having a lower confidence value and/or higher risk. In other embodiments, the S-D transfer subsystem can immediately send wafers having a lower confidence value and/or higher risk to a rework subsystem when a rework processing sequence can be established and performed in a relatively short amount of time.

An S-D procedure will produce a specific result at a specific location on a wafer. When a process is mature, confidence values should be high, and a minimum amount of wafers should require evaluation, one site on a wafer can be used to declare a wafer and/or group of wafers. When the process is mature, the process results from all of the sites on a wafer should be the same (within a uniformity limit).

When a product is being developed, evaluation features/properties/structures at a large number of sites can be used to establish low risk procedures.

The processing system 100 can be used to verify one or more S-D processing procedures.

In some embodiments, one or more wafers can be received by one or more S-D transfer subsystems (101, 102), and the S-D transfer subsystems (101, 102) can be coupled to one or more subsystems (110, 115, 120, 125, 130, 135, 140, 145, 150, and 155) in the processing system 100. Each wafer can have one or more layers thereon, can have wafer data associated therewith, and the wafer data can include historical and/or real-time data. An S-D transfer subsystem can use business rules to determine when to send wafers to the rework subsystem and or storage locations. These business rules can be different as the wafers are processed (acquire additional layers).

One or more of the controllers (114, 119, 124, 129, 134, 139, 144, 149, 154, 159, and 195) can be configured for determining wafer state data for each wafer, for determining a first unverified S-D procedure using the wafer data and/or the wafer state data. The first unverified S-D procedure being performed using one or more subsystems (110, 115, 120, 125, 130, 135, 140, 145, 150, and 155).

One or more of the controllers (114, 119, 124, 129, 134, 139, 144, 149, 154, 159, and 195) can be configured for establishing a first number of S-D wafers to be processed using the first unverified S-D procedure, for establishing a number of required verification sites for each S-D wafer using the wafer data and the first unverified S-D procedure, for determining operational state data for the one or more S-D processing elements in the first processing subsystem, for determining loading data for the one or more S-D transfer elements (104) in the one or more S-D transfer subsystems (101, 102), for establishing a first transfer sequence for a first S-D wafer in the first number of S-D wafers using the wafer data, the wafer state data, the operational state data, loading data, or the number of required verification sites, or any combination thereof, and for delaying the first S-D wafer for a first period of time using the S-D transfer subsystem coupled to the first processing subsystem when the first S-D processing element is not available.

One or more of the S-D transfer subsystems (101, 102) can be configured for transferring a first S-D wafer to one of the S-D processing elements (112, 117, 122, 127, 132, 142, 147, and 157) in one or more subsystems (110, 115, 120, 125, 130, 135, 140, 145, 150, and 155). In addition, the one or more of the S-D transfer subsystems (101, 102) can be configured for delaying the first S-D wafer for the first period of time using a transfer element 104 in the S-D transfer subsystems (101, 102), and the transfer element 104 can support two or more wafers. After the first period of time, the delayed first S-D wafer can be processed in one or more of the subsystems (110, 115, 120, 125, 130, 135, 140, 145, 150, and 155).

After the first S-D wafer is transferred, the first unverified S-D procedure can be performed using the first S-D wafer, and during the first unverified S-D procedure a first set of S-D verification features can be created on a first processed S-D wafer. The first set of S-D verification features can include a first verification feature at a first site on the first processed S-D wafer.

A first processed S-D wafer can be created when the first unverified S-D procedure is performed on the first wafer, the first processed S-D wafer can be transferred to a first S-D evaluation element 137 in an inspection subsystem 135 or a first S-D evaluation element 152 in a first evaluation subsystem 150 using one or more of the S-D transfer subsystems (101, 102) that are coupled to the inspection subsystem 135 and the evaluation subsystem 150 when the first S-D evaluation element (137, 152) is available, and the first S-D wafer can be delayed for a second period of time using one or more of the S-D transfer subsystems (101, 102) when the first S-D evaluation element is not available. In addition, the one or more of the S-D transfer subsystems (101, 102) can be configured for delaying the first processed S-D procedure using a transfer element 104 in the S-D transfer subsystems (101, 102), and the transfer element 104 can support two or more wafers. After the second period of time, the first processed S-D wafer can be evaluated in the inspection subsystem 135 and/or the evaluation subsystem 150.

When an evaluation procedure is performed, a first site can be used. In some example, evaluation decisions can be made using the data from a first site. One or more of the controllers (114, 119, 124, 129, 134, 139, 144, 149, 154, 159, and 195)

can be configured for selecting a first site from the number of required sites on the first processed S-D wafer, wherein the first site has a first unverified feature associated therewith that was created using the first unverified S-D procedure, for obtaining first unverified data from the first site on the first S-D wafer, where the first site has first unverified measurement and/or inspection data associated therewith, for establishing first verification data for the first site on the first S-D wafer, wherein the first verification data comprises verified measurement and/or inspection data, for establishing a first confidence value for the first site using a first difference between the first unverified data and the first verification data, for establishing a first risk factor for the first unverified S-D procedure using the first confidence value, the first difference, or the wafer data, or any combination thereof; f) establishing a first total risk factor for the first unverified S-D procedure using the first risk factor, or any combination thereof; g) identifying the first unverified S-D procedure as a first verified procedure having the first risk factor associated therewith, decreasing the number of required sites by one, and increasing the number of visited sites by one, when the first risk factor is less than or equal to a new threshold limit; h) identifying the first unverified S-D procedure as a first unverified procedure having a second risk factor associated therewith, decreasing the number of required sites by one, and increasing the number of visited sites by one, when the first risk factor is greater than the first threshold limit, wherein the first unverified S-D procedure has confidence data, risk data, and/or verification data associated therewith.

In some examples, when an evaluation procedure is performed, additional sites can be used on the first S-D wafer. For example, evaluation decisions can be made using the data from a first site and data from one or more additional sites on the first S-D wafer. One or more of the controllers (114, 119, 124, 129, 134, 139, 144, 149, 154, 159, and 195) can also be configured to perform the following steps: a) selecting a new site from the number of required sites on the first S-D wafer, wherein the new site has a new unverified feature associated therewith that was created using the first S-D verification procedure; b) obtaining new unverified data from the new site on the first S-D wafer, wherein the new site has new unverified measurement and/or inspection data associated therewith; c) establishing new verification data for the new site; d) establishing a new confidence value for the new site on the first S-D wafer using a new difference between the new unverified data and the new verification data; e) establishing a new first risk factor for the first unverified S-D procedure using the new confidence value, the new difference, first confidence value, the first difference, or the wafer data, or any combination thereof; f) establishing a new first total risk factor for the first unverified S-D procedure using the wafer data, the first risk factor, or the new first risk factor, or any combination thereof; g) identifying the first unverified S-D procedure as a new verified procedure having the new first total risk factor associated therewith, decreasing the number of required sites by one, and increasing the number of visited sites by one, when the new first total risk factor is less than or equal to a new threshold limit; h) identifying the first unverified S-D procedure as a new unverified procedure having a new second risk factor associated therewith, decreasing the number of required sites by one, and increasing the number of visited sites by one, when the new first total risk factor is greater than the new threshold limit; i) repeating steps a)-h) when the number of required sites is greater than zero; and j) stopping the verification of the first wafer when the number of required sites is equal to zero.

In other examples, when an evaluation procedure is performed, sites on additional S-D wafers can be used. For example, evaluation decisions can be made using the data from sites on one or more S-D wafers. One or more of the controllers (114, 119, 124, 129, 134, 139, 144, 149, 154, 159, and 195) can also be configured for establishing an additional procedure-verification sequence for an additional S-D wafer in the first set of S-D wafers using the wafer data, the process state data, the number of required verification sites, the number of verification visited sites, or the number of required verification sites or any combination thereof, and for determining a first unverified S-D procedure for the additional S-D wafer, wherein the first unverified S-D procedure is determined using the additional procedure-verification sequence and comprises one or more processing procedures.

One or more of the S-D transfer subsystems (101, 102) can be configured for transferring an additional S-D wafer to one of the S-D processing elements (112, 117, 122, 127, 132, 142, 147, and 157) in one or more subsystems (110, 115, 120, 125, 130, 135, 140, 145, 150, and 155). In addition, the one or more of the S-D transfer subsystems (101, 102) can be configured for delaying the additional S-D wafer for a second period of time using a transfer element 104 in the S-D transfer subsystems (101, 102), and the transfer element 104 can support two or more wafers. After the second period of time, the additional S-D wafer can be processed in one or more of the subsystems (110, 115, 120, 125, 130, 135, 140, 145, 150, and 155).

After the additional S-D wafer is transferred, the first unverified S-D procedure can be performed using the additional S-D wafer, and during the first unverified S-D procedure a first set of S-D verification features can be created on an additional processed S-D wafer. The first set of S-D verification features can include a first verification feature at a first site on the additional processed S-D wafer.

A additional processed S-D wafer can be created when the first unverified S-D procedure is performed on the additional wafer, the additional processed S-D wafer can be transferred to a first S-D evaluation element 137 in an inspection subsystem 135 or a first S-D evaluation element 152 in a first evaluation subsystem 150 using one or more of the S-D transfer subsystems (101, 102) that are coupled to the inspection subsystem 135 and the evaluation subsystem 150 when the first S-D evaluation element (137, 152) is available, and the additional processed S-D wafer can be delayed for a third period of time using one or more of the S-D transfer subsystems (101, 102) when the first S-D evaluation element is not available. In addition, the one or more of the S-D transfer subsystems (101, 102) can be configured for delaying the additional processed S-D wafer for the third period of time using a transfer element 104 in the S-D transfer subsystems (101, 102), and the transfer element 104 can support two or more wafers. After the third period of time, the first processed S-D wafer can be evaluated in the inspection subsystem 135 and/or the evaluation subsystem 150.

When first sites on additional processed S-D wafers are used, one or more of the controllers (114, 119, 124, 129, 134, 139, 144, 149, 154, 159, and 195) can also be configured to perform the following steps: a1) selecting a first site from the number of required sites on an additional processed S-D wafer, where the first site has a first verification feature associated therewith; b1) obtaining additional unverified data from the first site on the additional processed S-D wafer, wherein the first site has first unverified measurement and/or inspection data associated therewith; c1) establishing additional verification data for the additional processed S-D wafer using the first site on the additional S-D wafer, where the first verification data comprises verified measurement and/or inspection data; d1) establishing an additional confidence value for the first site on the additional processed S-D wafer using an additional difference between the additional unverified data and the additional verification data; e1) establishing an additional risk factor for the first unverified S-D procedure using the additional confidence value, the additional difference the first confidence value, the first difference, or the wafer data, or any combination thereof; f1) establishing an additional total risk factor for the first unverified S-D procedure using the additional risk factor, the additional confidence value, the additional difference, the first risk factor, the first confidence value, the first difference, or the wafer data, or any combination thereof; g1) identifying the first unverified S-D procedure as a verified procedure having the additional total risk factor associated therewith, decreasing the number of required sites by one, and increasing the number of visited sites by one, when the additional total risk factor is less than or equal to an additional threshold limit; h1) identifying the first unverified S-D procedure as an additional unverified procedure having an additional second risk factor associated therewith, decreasing the number of required sites by one, and increasing the number of visited sites by one, when the additional total risk factor is greater than the additional threshold limit; i1) repeating steps a1)-h1) when the number of required additional S-D wafers is greater than zero; and j1) stopping the verification of the first wafer when the number of required additional S-D wafers is equal to zero.

When additional required sites on additional processed S-D wafers are used, one or more of the controllers (114, 119, 124, 129, 134, 139, 144, 149, 154, 159, and 195) can also be configured to perform the following steps: a2) selecting a new site from the number of required sites on an additional processed S-D wafer, wherein the new site has a first verification feature associated therewith that was created using the first unverified S-D procedure; b2) obtaining additional new unverified data from the new site on the additional processed S-D wafer, where the new site has new unverified measurement and/or inspection data associated therewith; c2) establishing new additional verification data for the additional processed S-D wafer using the new site on the additional processed S-D wafer, where the new verification data comprises new verified measurement and/or inspection data; d2) establishing a new additional confidence value using the new site on the additional processed S-D wafer using a new additional difference between the new additional unverified data and the new additional verification data; e2) establishing a new additional risk factor for the first unverified S-D procedure using the new additional confidence value, the new additional difference, the additional confidence value, the additional difference, the first confidence value, the first difference, or the wafer data, or any combination thereof; f2) establishing a new additional total risk factor for the first unverified S-D procedure using the new additional risk factor, the new additional confidence value, the new additional difference, the additional risk factor, the additional confidence value, the additional difference, the first risk factor, the first confidence value, the first difference, or the wafer data, or any combination thereof; g2) identifying the first unverified S-D procedure as a verified procedure having the new additional total risk factor associated therewith, decreasing the number of required sites by one, and increasing the number of visited sites by one, when the new total first risk factor is less than or equal to a new additional threshold limit; h2) identifying the first unverified S-D procedure as an additional unverified procedure having an additional second risk factor associated therewith, decreasing the number of required sites by one, and increasing the number of visited sites by one, when the additional first risk factor is greater than the new additional threshold; i2) repeating steps a2)-h2) when the number of required additional S-D wafers is greater than zero; and j2) stopping the verification of the first wafer when the number of required additional S-D wafers is equal to zero.

When additional required sites on delayed processed S-D wafers are used, one or more of the controllers (114, 119, 124, 129, 134, 139, 144, 149, 154, 159, and 195) can also be configured to perform the following steps: a3) selecting a site from the number of remaining sites on a delayed processed S-D wafer, wherein the site has a first verification feature associated therewith; b3) obtaining delayed unverified data from the site on the delayed processed S-D wafer, where the site has delayed unverified measurement and/or inspection data associated therewith; c3) establishing delayed verification data for the delayed processed S-D wafer using the site on the delayed processed S-D wafer, where the delayed verification data comprises delayed verified measurement and/or inspection data; d3) establishing a delayed confidence value for the site on the delayed processed S-D wafer using a delayed difference between the delayed unverified data and the delayed verification data; e3) establishing a delayed risk factor for the first unverified S-D procedure using the delayed confidence value, the delayed difference, the additional confidence value, the additional difference, the first confidence value, the first difference, or the wafer data, or any combination thereof; f3) establishing a delayed total risk factor for the first unverified S-D procedure using the delayed risk factor, the delayed confidence value, the delayed difference, the first risk factor, the first confidence value, the first difference, or the wafer data, or any combination thereof; g3) identifying the first unverified S-D procedure as a verified procedure having the delayed total risk factor associated therewith, decreasing the number of remaining sites by one, and increasing the number of visited sites by one, when the delayed total risk factor is less than or equal to a delayed threshold limit; h3) identifying the first unverified S-D procedure as an additional unverified procedure having an additional second risk factor associated therewith, decreasing the number of remaining sites by one, and increasing the number of visited sites by one, when the delayed total risk factor is greater than the additional threshold limit; i3) repeating steps a3)-h3) when the number of remaining delayed S-D wafers is greater than zero; and j3) stopping the verification when the number of remaining delayed S-D wafers is equal to zero.

In various embodiments, the one or more S-D processing elements can include one or more S-D lithography-related processing elements, one or more S-D scanner-related processing elements, one or more S-D inspection-related processing elements, one or more S-D measurement-related elements, one or more S-D evaluation-related elements, one or more S-D etch-related processing elements, one or more S-D deposition-related processing elements, one or more S-D thermal processing elements, one or more S-D coating-related processing elements, one or more S-D alignment-related processing elements, one or more S-D polishing-related processing elements, one or more S-D storage-related elements, one or more S-D transfer elements, one or more S-D cleaning-related processing elements, one or more S-D rework-related processing elements, one or more S-D oxidation-related processing elements, one or more S-D nitridation-related processing elements, or one or more S-D external processing elements, or any combination thereof.

In addition, the first unverified S-D procedure can be performed in real-time and can include one or more S-D lithography-related procedures, one or more S-D scanner-related procedures, one or more S-D inspection-related procedures, one or more S-D measurement-related procedures, one or more S-D evaluation-related procedures, one or more S-D etch-related procedures, one or more S-D deposition-related procedures, one or more S-D thermal processing procedures, one or more S-D coating-related procedures, one or more S-D alignment-related procedures, one or more S-D polishing-related procedures, one or more S-D storage-related procedures, one or more S-D transfer procedures, one or more S-D cleaning-related procedures, one or more S-D rework-related procedures, one or more S-D oxidation-related procedures, one or more S-D nitridation-related procedures, or one or more S-D external procedures, or any combination thereof.

In some embodiments, the unverified data can include S-D intensity data, S-D transmission data, S-D absorption data, S-D reflectance data, or S-D diffraction data, S-D optical properties data, S-D image data, or any combination thereof. The verification data can include historical data, library data, optical metrology data, imaging data, particle data, CD-scanning electron microscope (CD-SEM) data, transmission electron microscope (TEM) data, and/or focused ion beam (FIB) data. The threshold limit can include S-D data including goodness of fit data, CD data, accuracy data, wavelength data, sidewall data, particle data, process data, historical data, or a combination thereof.

In one example, the first set of S-D verification features are created on the first S-D processed wafer by developing an exposed masking. In another example, the first set of S-D verification features are created on the first S-D processed wafer by etching one or more layers. In other examples, the first set of S-D verification features are created on the first S-D processed wafer by exposing a deposited masking layer.

In the various embodiments disclosed herein, the wafers can include one or more layers that can include semiconductor material, carbon material, dielectric material, glass material, ceramic material, metallic material, oxidized material, mask material, or planarization material, or a combination thereof.

In some examples, the lithography-related processing elements can perform mask layer deposition procedures, mask layer exposure procedures, and/or development procedures that can be S-D and/or non-S-D, and the evaluation elements can be used to verify mask layer deposition procedures, mask layer exposure procedures, and/or development procedures that can be S-D and/or non-S-D.

An S-D transfer sequence can be used to determine the S-D transfer subsystem to use, the number of transfer devices to use, the number of transfer elements to use, the transfer times, and/or the transfer speeds.

S-D wafer state data can be dependent on the number of required sites, the number of visited (evaluated/completed) site, or the number of remaining sites, or any combination thereof. S-D process state data can be dependent on the number of required procedures, the number of completed procedures, or the number of remaining procedures, or any combination thereof. In some cases, the number of evaluations actually performed can be less than the original number when excellent results are obtained at the sites already measured.

A throughput time can be used to determine the number of processing elements required to process the one or more wafers.

When an S-D procedure is verified, the S-D procedure and the data associated with the S-D procedure can be stored in a library and/or database.

When a product is being developed, one or more S-D libraries can be created, refined, updated, and/or used. S-D evaluation libraries can include site dependent S-D features, properties, structures, procedures, images, and/or optical data.

The processing system 100 can use S-D creation procedures and/or S-D evaluation procedures to create S-D data for one or more S-D evaluation libraries.

In some embodiments, one or more wafers can be received by one or more processing elements (112, 117, 122, 127, 132, 142, 147, and 157) coupled to one or more S-D transfer subsystems (101, 102), and the S-D transfer subsystems (101, 102) can be coupled to one or more subsystems (110, 115, 120, 125, 130, 135, 140, 145, 150, and 155) in the processing system 100. Each wafer can have one or more layers thereon, can have wafer data associated therewith, and the wafer data can include historical and/or real-time data.

One or more of the controllers (114, 119, 124, 129, 134, 139, 144, 149, 154, 159, and 195) can be configured for receiving wafer data for the first set of S-D wafers.

One or more processing elements (112, 117, 122, 127, 132, 142, 147, and 157) can perform one or more first S-D creation procedures, wherein a first set of processed S-D wafers are created that have one or more library-related reference features at a first number of evaluation sites. wafers;

One or more of the controllers (114, 119, 124, 129, 134, 139, 144, 149, 154, 159, and 195) can also be configured for establishing S-D wafer state data for each processed S-D wafer, and the S-D wafer state data can include a number of required creation sites and a number of required evaluation sites for each processed S-D wafer, for establishing a first set of evaluation wafers comprising a first number of the processed S-D wafers, wherein the first set of evaluation wafers are to be evaluated using a first S-D evaluation procedure, for establishing first operational states for a plurality of S-D evaluation elements in the one or more subsystems coupled to the one or more S-D transfer subsystems, for determining a first number of available evaluation elements using the first operational states for one or more of the S-D evaluation elements, for establishing a first S-D transfer sequence using the wafer data, the S-D wafer state data, the first number of S-D evaluation wafers, or the first number of available evaluation elements, or any combination thereof, and for applying a first corrective action when the number of S-D evaluation wafers is greater than the first number of available evaluation elements.

The first set of S-D evaluation wafers can be transferred to the first number of available evaluation elements (137, 152) IN the one or more evaluation subsystem (135, 150) using the first S-D transfer sequence when the number of S-D evaluation wafers is less than or equal to the first number of available evaluation elements. The one or more of the S-D transfer subsystems (101, 102) can be coupled to the inspection subsystem 135 and the evaluation subsystem 150.

In addition, one or more of the controllers (114, 119, 124, 129, 134, 139, 144, 149, 154, 159, and 195) can be configured for determining a number of required evaluation sites for each S-D evaluation wafer using the wafer data, data from the first S-D creation procedure, the S-D wafer state data, or S-D evaluation library creation rules, or any combination thereof, for selecting a first site from the number of required sites on a first S-D evaluation wafer, wherein the first site has a first library-related reference feature associated therewith that was created using the first S-D creation procedure, for obtaining first library-related evaluation data from the first site on the first S-D evaluation wafer, wherein the first site has first library-related measurement and/or inspection data associated therewith, for establishing first predicted data for the first site on the first S-D evaluation wafer, wherein the first predicted data comprises predicted measurement and/or inspection data, establishing a first confidence value for the first site on the first S-D evaluation wafer using a first library-related difference calculated using the first library-related evaluation data and the first predicted data, for establishing a first risk factor for the first site on the first S-D evaluation wafer using the first confidence value, the first library-related difference, or the wafer data, or any combination thereof, for establishing a first total risk factor for the first site on the first S-D evaluation wafer using the first risk factor, the first confidence value, the first library-related difference, or the wafer data, or any combination thereof, for identifying the first site on the first S-D evaluation wafer as a first verified site having the first total risk factor associated therewith, decreasing the number of remaining sites by one, increasing the number of visited sites by one, and storing data associated with the first site as verified data in a S-D evaluation library, when the first total risk factor is less than or equal to a first library-related creation limit, and for identifying the first site as a first unverified site having a second risk factor associated therewith, decreasing the number of remaining sites by one, and increasing the number of visited sites by one, when the first total risk factor is greater than the first library-related creation limit, wherein the first verified site has verified library-related data associated therewith.

When a S-D evaluation library is created, additional sites on the first S-D evaluation wafer can be used, and one or more of the controllers (114, 119, 124, 129, 134, 139, 144, 149, 154, 159, and 195) can be configured to perform the following steps: a) selecting a new site from the number of required sites on the first S-D evaluation wafer, wherein the new site has a new library-related reference (evaluation) feature associated therewith that was created using the first S-D creation procedure; b) obtaining new library-related evaluation data from the new site on the first S-D evaluation wafer, wherein the new site has new library-related measurement and/or inspection data associated therewith; c) establishing new predicted data for the new site on the on the first S-D evaluation wafer, wherein the new predicted data comprises new predicted measurement and/or inspection data; d) establishing a new confidence value for the new site on the first S-D evaluation wafer using a new library-related difference calculated using the new library-related evaluation data and the new predicted data; e) establishing a new risk factor for the new site on the first S-D evaluation wafer using the new confidence value, the new library-related difference, the first confidence value, the first library-related difference, or the wafer data, or any combination thereof; f) establishing a new total risk factor for the new site on the first S-D evaluation wafer using the new risk factor, the new confidence value, the new library-related difference, the first risk factor, the first confidence value, the first library-related difference, or the wafer data, or any combination thereof; g) identifying the new site on the first S-D evaluation wafer as a new verified site having the new total risk factor associated therewith, decreasing the number of required sites by one, increasing the number of visited sites by one, and storing data associated with the new site as verified data in the evaluation library, when the new total risk factor is less than or equal to a new library-related creation limit; h) identifying the new site on the first S-D evaluation wafer as a new unverified site having a new second risk factor associated therewith, decreasing the number of required sites by one, and increasing the number of visited sites by one, when the new total risk factor is greater than the new library-related creation limit, wherein the new verified site has new verified library-related data associated therewith; i) repeating steps a)-h) when the number of required sites is greater than zero; and j) stopping the S-D library creation process when the number of required sites is equal to zero.

When a S-D evaluation library is created, additional sites on additional S-D evaluation wafers can be used, and one or more of the controllers (114, 119, 124, 129, 134, 139, 144, 149, 154, 159, and 195) can also be configured to perform the following steps: a1) selecting an additional S-D evaluation wafer; b1) determining a first number of required sites for the additional S-D evaluation wafer; c1) selecting an additional site from the first number of required sites on an additional S-D evaluation wafer, wherein the additional site has an additional library-related reference (evaluation) feature associated therewith that was created using the first S-D creation procedure; d1) obtaining additional library-related evaluation data from the additional site on the additional S-D evaluation wafer, wherein the additional site has additional library-related measurement and/or inspection data associated therewith; e1) establishing additional predicted data for the additional site on the additional S-D evaluation wafer, wherein the additional predicted data comprises additional predicted measurement and/or inspection data; f1) establishing an additional confidence value for the additional site on the additional S-D evaluation wafer using an additional library-related difference calculated using the additional library-related evaluation data and the additional predicted data; g1) establishing an additional risk factor for the additional site on the additional S-D evaluation wafer using the additional confidence value, the additional library-related difference, the new confidence value, the new library-related difference, the first confidence value, the first library-related difference, or the wafer data, or any combination thereof; h1) establishing an additional total risk factor for the additional site on the additional S-D evaluation wafer using the additional risk factor, the additional confidence value, the additional library-related difference, the new risk factor, the new confidence value, the new library-related difference, the first risk factor, the first confidence value, the first library-related difference, or the wafer data, or any combination thereof; i1) identifying the additional site on the additional S-D evaluation wafer as an additional verified site having the additional total risk factor associated therewith, decreasing the number of required sites by one, increasing the number of visited sites by one, and storing data associated with the additional site as verified data in the evaluation library, when the additional total risk factor is less than or equal to an additional library-related creation limit; j1) identifying the additional site on the additional S-D evaluation wafer as an additional unverified site having an additional second risk factor associated therewith, decreasing the number of required sites by one, and increasing the number of visited sites by one, when the additional total risk factor is greater than the additional library-related creation limit, wherein the additional verified site has additional verified library-related data associated therewith; k1) repeating steps a1)-j1) when an additional S-D evaluation wafer is available and the number of required sites on the additional S-D evaluation wafer is greater than zero; and l1) stopping the S-D library creation process when an additional S-D evaluation wafer is NOT available or the number of required sites on the additional S-D evaluation wafer is equal to zero.

In some examples, when a first corrective action is performed, one or more of the controllers (114, 119, 124, 129, 134, 139, 144, 149, 154, 159, and 195) can be configured for determining a first number of delayed S-D wafers using a difference between the first number of S-D process wafers and the first number of available processing elements, and one or more transfer elements 104 in the one or more S-D transfer subsystems (101, 102) can be configured for storing and/or delaying the first number of delayed wafers for a first period of time.

In another example, when a first corrective action is performed, one or more of the controllers (114, 119, 124, 129, 134, 139, 144, 149, 154, 159, and 195) can be configured for determining a first number of delayed S-D wafers using a difference between the first number of S-D evaluation wafers and the first number of available evaluation elements, for determining updated S-D wafer state data for a first delayed S-D evaluation wafer, for determining updated operational state data for the one or more S-D processing elements in the first processing subsystem, for determining a first updated transfer sequence for the first delayed S-D evaluation wafer, for identifying one or more newly-available S-D processing elements using the updated operational state data, and for applying a second corrective action when the first newly-available S-D evaluation element is NOT available. In addition, one or more transfer elements 104 in the one or more S-D transfer subsystems (101, 102) can be configured for transferring one or more of the delayed wafers using the first updated transfer sequence when one or more newly-available S-D evaluation elements become available.

In additional example, corrective actions can include stopping the processing, pausing the processing, re-evaluating one or more of the S-D evaluation wafers, re-measuring one or more of the S-D evaluation wafers, re-inspecting one or more of the S-D evaluation wafers, re-working one or more of the S-D evaluation wafers, storing one or more of the S-D evaluation wafers, cleaning one or more of the S-D evaluation wafers, delaying one or more of the S-D evaluation wafers, or stripping one or more of the S-D evaluation wafers, or any combination thereof.

One set of additional processing steps can include calculating S-D confidence maps for the processed S-D wafers, a first S-D confidence map including confidence data for the one or more library-related reference features created at a first number of evaluation sites on each of the processed S-D wafers; and establishing the first set of evaluation wafers using the S-D confidence maps for the processed S-D wafers.

A second set of additional processing steps can include calculating S-D confidence maps for the processed S-D wafers, a first S-D confidence map including confidence data for the one or more library-related reference features created at a first number of evaluation sites on each of the processed S-D wafers; decreasing the number of required evaluation sites by one or more when one or more values in the first S-D confidence map are not within a first confidence limit; and increasing the number of required evaluation sites by one or more when one or more values in the first S-D confidence map are within the first confidence limit.

A third set of additional processing steps can include calculating S-D risk assessment maps for the processed S-D wafers, a first S-D risk assessment map including risk assessment data for the one or more library-related reference features created at a first number of evaluation sites on each of the processed S-D wafers; decreasing the number of required evaluation sites by one or more when one or more values in the first S-D risk assessment map are not within a first confidence limit; and increasing the number of required evaluation sites by one or more when one or more values in the first S-D risk assessment map are within the first confidence limit;

In an alternate embodiment, a first set of non-S-D wafers can be determined, these wafers can be processed using a first non-S-D processing sequence, and the first non-S-D processing sequence can include one or more non-S-D procedures. The first set of non-S-D wafers can be transferred to one or more first non-S-D processing elements in the one or more first subsystems using the S-D transfer subsystem, and the first non-S-D processing sequence can be used to determine the one or more first non-S-D processing elements in the one or more first subsystems.

In some embodiments, the S-D evaluation library data can include goodness of fit data, creation rules data, S-D measurement data, S-D inspection data, S-D verification data, S-D map data, S-D confidence data, S-D accuracy data, S-D process data, or S-D uniformity data, or any combination thereof.

Figure 2:
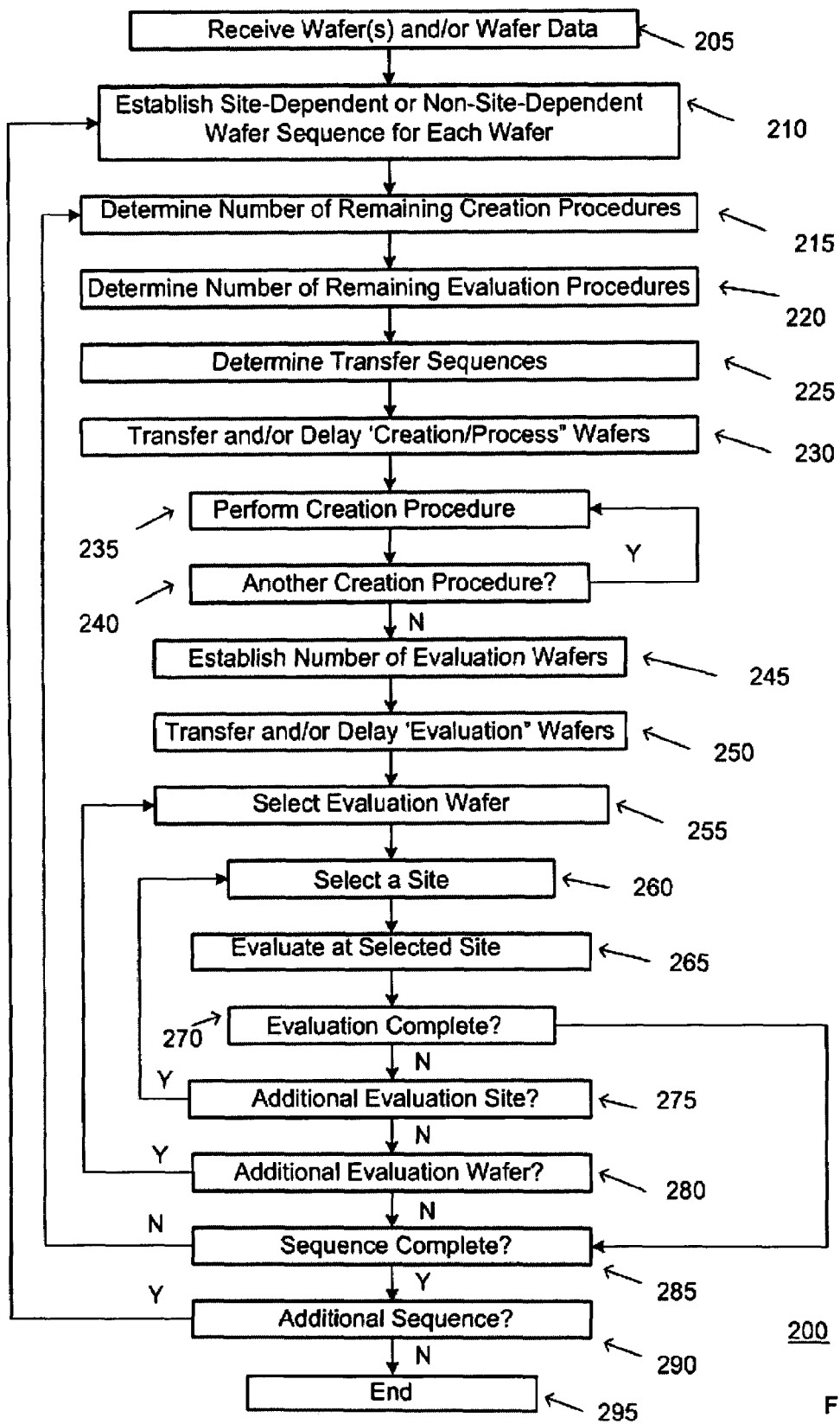
FIG. 2 illustrates an exemplary flow diagram of method for processing wafers using S-D procedures in accordance with embodiments of the invention.

FIG. 2 illustrates an exemplary flow diagram of method for processing wafers using S-D procedures in accordance with embodiments of the invention. The wafers can include one or more layers that can include semiconductor material, carbon material, dielectric material, glass material, ceramic material, metallic material, oxidized material, doped material, implanted material, mask material, or planarization material, or a combination thereof. In some cases, S-D procedures can be used throughout the production cycle, and in other cases, S-D procedures can be used the early stages of the production cycle when the more critical processing steps are performed. In some example, S-D procedures may be used account for mobility differences between NMOS and PMOS structures, to locate test structures, to improve line width roughness and/or line edge roughness, and to improve overlay problems.

In some examples, wafer data can include real-time data, historical data, S-D confidence data, non-S-D confidence data, S-D risk data, non-S-D risk data, S-D limit data, or non-S-D limit data, or any combination thereof.

In 205, one or more wafers can be received by one or more subsystems (101, 102, 110, 115, 120, 125, 130, 135, 140, 145, 150, and 155) in a processing system (100). In some embodiments, one or more of the wafers can be received by one or more transfer subsystems (101, 102) coupled to one or more of the subsystems (101, 102, 110, 115, 120, 125, 130, 135, 140, 145, 150, and 155). Alternatively, one or more of the wafers can be received by a different subsystem. In addition, a system controller 195 can be used to receive the wafer data for the one or more wafers. Alternatively, some of the wafer date may be received by a different controller. The wafer data can include historical and/or real-time data. For example, the wafer data can include S-D and/or non-S-D maps that can include wafer-related maps, process-related maps, damage-assessment maps, reference maps, measurement maps, prediction maps, risk maps, inspection maps, verification maps, evaluation maps, particle maps, and/or confidence map(s), for one or more wafers. In some cases, a MES 180 system can exchange data with the system controller 195 and one or more of the subsystems (110, 115, 120, 125, 130, 135, 140, 145, 150, and 155), and the data can be used to determine and/or control the processing sequence and/or the transfer sequences. The exchanged data may be used to determine which S-D and/or non-S-D procedures to use for each wafer. The data can include system data, subsystem data, chamber data, product data, sensor data, and historical data.

The wafers can include S-D wafers and non-S-D wafers. S-D wafer state data can be established for S-D wafers, and non-S-D wafer state data can be established for non-S-D wafers.

In 210, S-D processes and/or transfer sequences can be established for the S-D wafers using the wafer data and the S-D wafer state data. Non-S-D processes and/or transfer sequences can be established for the non-S-D wafers using the wafer data and the non-S-D wafer state data. Alternatively, other sequences and additional data may be used.

Verification-related sequences can be established for verifying sites used in S-D procedures, S-D wafers, S-D procedures, and/or S-D libraries. Verification-related sequences can include S-D creation procedures, S-D transfer procedures, S-D verification procedures, S-D evaluation procedures, S-D measurement procedures S-D inspection procedures, or any combination thereof. Alternatively, non-S-D procedures may be included. One or more S-D wafers can be processed using one or more process-related procedures and can be verified using the process-verification processing sequence.

Sites in S-D procedures can be associated with a gate structure in a transistor, a drain structure in a transistor, a source structure in a transistor, a capacitor structure, a via structure, a trench structure, a two-dimensional memory structure, a three-dimensional memory structure, a sidewall angle, a bottom critical dimension (CD), a top CD, a middle CD, an array, a periodic structure, an alignment feature, a doping feature, a strain feature, a damaged-structure, or a reference structure, or any combination thereof.

The S-D processing sequences and/or the non-S-D processing sequences can include one or more mask creation procedures, one or more deposition procedures, one or more coating procedures, one or more etching procedures, one or more thermal procedures, one or more implanting procedures, one or more doping procedures, one or more exposure procedures, one or more oxidation procedures, one or more nitridation procedures, one or more ionization procedures, one or more development procedures, one or more lithography procedures, one or more scanner-related procedures, one or more measurement procedures, one or more inspection procedures, one or more evaluation procedures, one or more simulation procedures, one or more prediction procedures, one or more rework procedures, one or more storage procedures, one or more transfer procedures, one or more loadlock procedures, or one or more cleaning procedures, or any combination thereof.

In some examples, S-D processing sequences can include pre- and/or post-processing procedures that can be performed using a smaller number of wafers. The pre- and/or post-processing procedures can be S-D and can include processing, evaluation, measurement, inspection, verification, and/or damage-assessment procedures. Alternatively, procedures may be non-S-D. During a product lifetime, the processing sequence can change many times as the product matures, and the amount of pre-processing and/or post-processing may be different for different wafers and/or different times. Some wafers may be identified as verification, inspection, evaluation, damage-assessment, test, and/or send-ahead wafers, and pre- and/or post-processing procedures can be performed on some of these wafers. When a product is being developed and/or verified, the process results can be varying, and additional procedures may be can be performed on a larger number of wafers. For example, when an additional S-D procedure is required, pre- and/or post-processing procedures can be performed using a pre-determined number of sites on a wafer.

In 215, the number of required creation procedures can be determined for each S-D wafer using one or more S-D verification-related sequences, the wafer data, the S-D wafer state data, and other data as required. In addition, the number of required creation procedures can be determined for each non-S-D wafer using one or more non-S-D processing sequences, the wafer data, and the non-S-D wafer state data. Alternatively, additional data may be used.

In some cases, the wafer state data can include the number of required process-related sites, the number of visited process-related sites, or the number of remaining process-related sites or any combination thereof. An S-D creation procedure can be determined for each "to-be-processed" S-D wafer, and the S-D creation procedure can include one or more process-related procedures. The S-D creation procedure can be used to identify an S-D processing subsystem and/or the S-D processing elements in a processing subsystem to use.

In 220, the number of required evaluation procedures can be determined for each S-D wafer using one or more S-D processing sequences, the wafer data, and the S-D wafer state data. In addition, the number of required evaluation procedures can be determined for each non-S-D wafer using one or more non-S-D processing sequences, the wafer data, and the non-S-D wafer state data. Alternatively, additional data may be used.

In some cases, the wafer state data can include the number of required evaluation-related sites, the number of visited evaluation-related sites, or the number of remaining evaluation-related sites or any combination thereof. A S-D evaluation procedure can be determined for "to-be-evaluated" sites, wafers, procedures, and/or libraries, and the S-D evaluation procedure can include one or more verification, evaluation, measurement, inspection, and/or test procedures. In addition, an S-D evaluation procedure can be determined for "to-be-verified" sites, wafers, procedures, and/or libraries. The S-D evaluation subsystems and/or the S-D evaluation elements that are to be used can be identified using an S-D evaluation procedure can be used to identify a in a verification subsystem to use.

In other cases, the wafer state data can include the number of required verification-related sites, the number of visited verification-related sites, or the number of remaining verification-related sites or any combination thereof. A S-D verification procedure can be determined for "to-be-verified" sites, wafers, procedures, and/or libraries, and the S-D verification procedure can include one or more verification, evaluation, measurement, inspection, and/or test procedures. The S-D verification procedure can be used to identify an S-D verification subsystem and/or the S-D verification elements in a verification subsystem to use.

In 225, one or more S-D transfer sequences can be established for each S-D wafer using S-D sequence data, loading data, availability data, operational state data, procedure data, system data, subsystem system data, wafer data, or S-D wafer state data, or any combination thereof. In addition, one or more non-S-D transfer sequences can be established for each non-S-D wafer. Alternatively, different data may be used.

In some examples, a first S-D transfer sequence can be determined and can be used to transfer a first wafer or a first group of wafers. Data from a first wafer or a first group of wafers can be used to make decisions regarding other related wafers. One or more "golden" wafers and/or "golden" chambers may be used during processing. In addition, transfer and/or processing sequences can be used to eliminated and/or reduce "first wafer effects". S-D transfer sequences can be used to determine the S-D transfer subsystem to use, the number of transfer devices and/or elements to use, the loading order, the transfer times, and/or the transfer speeds.

When a lithography-related sequence is performed, one or more lithography-related evaluation features can be created at one or more locations on one or more S-D wafers using a lithography-related creation procedure, and one or more of the lithography-related evaluation features can be evaluated and/or verified using a lithography-related evaluation procedure.

In some examples, a MES (180) can provide one or more verification-related sequences, one or more process-related sequences, one or more creation procedures, one or more S-D evaluation procedures, or one or more transfer sequences, or any combination thereof. In other examples, a MES (180) can provide information that can be used to establish one or more verification-related sequences, one or more process-related sequences, one or more creation procedures, one or more S-D evaluation procedures, or one or more transfer sequences, or any combination thereof.

S-D transfer sequences can be established for internal transfer elements coupled to an internal S-D delivery element within a subsystem, for transfer elements coupled to a S-D delivery element within a S-D transfer subsystem, for exchanges between transfer elements, exchanges between transfer elements and processing elements, exchanges between transfer elements and loadlock elements, and exchanges between transfer elements and non-S-D subsystems.

In 230, a first set of S-D "processing" wafers can be transferred to one or more available S-D processing elements in one or more of the processing subsystems. Operational state data can be determined for one or more S-D processing elements in the one or more processing subsystems, and the operational state data can be used to determine the one or more available S-D processing elements. In some alternate cases, processing can be performed using non-S-D processing elements, and transfer sequences may be established to allow this processing to occur.

For example, the operational state data for the processing elements can include availability data, matching data for the processing elements, expected processing times for some process steps and/or sites, confidence data and/or risk data for the processing elements, confidence data, and/or risk data for one or more process-related sites.

In some example, real-time operational states can be established for one or more S-D processing elements in one or more processing subsystem. A first number of a set of S-D processing wafers can be transferred to a first number of the S-D processing elements using the S-D transfer subsystem when the first number of first S-D processing elements is available. Other S-D wafers in the set of S-D processing wafers can be delayed for a first amount of time using the S-D transfer subsystem when S-D processing elements are not available for the other S-D wafers in the set of S-D processing wafers. Operational states can change as wafers are transferred into and out of the S-D processing elements. Real-time transfer sequences can be established and used to transfer wafers into and out of the first S-D processing elements in the lithography-related subsystem. Updated operational states can be obtained by querying in real-time one or more processing elements, and/or one or more subsystems. Updated loading data can be obtained by querying in real-time one or more transfer elements, and/or one or more transfer subsystems.

Delayed wafers can be processed and/or transferred using "delayed" processing sequences and/or "delayed" transfer sequences that can include delayed procedures and provide delayed data. For example, when a "newly-available" S-D evaluation element is identified, a delayed S-D evaluation wafer can be transferred to the "newly-available" S-D evaluation element in the one or more evaluation subsystems using a "delayed" transfer sequence.

In 235, a creation procedure can be performed. A verified S-D creation procedure can be used to create a verified wafer having one or more verified features and/or structures at one or more sites. An un-verified creation procedure can be used to create an un-verified wafer having one or more un-verified features and/or structures at one or more sites. Wafer data, processing element, and/or processing subsystem data can be obtained and/or stored before, during, and/or after an S-D and/or non-S-D creation procedure are performed.

During some creation procedures, output data can be obtained from one or more process-dependent sites during one or more process steps in the S-D procedure, and S-D confidence data can be obtained for one or more wafers by comparing the S-D output data to one or more S-D product requirements established for a process-dependent site.

In 240, a query can be performed to determine when an additional creation procedure is required for the current wafer. When another creation procedure is required for the current wafer, procedure 200 can branch back to 240, and when another creation procedure is not required for the current wafer, procedure 200 can branch to 250.

In 245, a first set of S-D evaluation wafers can be established, and the first set of S-D evaluation wafers can include a first number of S-D wafers.

In 250, one or more of the first set of S-D evaluation wafers can be transferred to one or more available S-D evaluation elements in one or more of the evaluation subsystems. Operational state data can be determined for one or more S-D evaluation elements in the one or more evaluation subsystems, and the operational state data can be used to determine the one or more available S-D evaluation elements. In some alternate cases, evaluation can be performed using non-S-D evaluation elements, and transfer sequences may be established to allow this evaluation to occur. In addition, one or more of the first set of S-D evaluation wafers can be transferred to one or more available S-D evaluation elements in one or more of the inspection subsystems. Operational state data can be determined for one or more S-D evaluation elements in the one or more inspection subsystems, and the operational state data can be used to determine the one or more available S-D evaluation elements. In some alternate cases, inspections can be performed using non-S-D evaluation elements, and transfer sequences may be established to allow this evaluation to occur.

For example, the operational state data for the evaluation elements can include matching data for the evaluation elements, expected evaluation times for some evaluation steps and/or sites, confidence data, and/or risk data for the evaluation elements, confidence data, and/or risk data for one or more evaluation sites.

In some examples, a transfer sequence can be used to determine how and when to transfer a first number of the S-D evaluation wafers to a first number of available evaluation elements, when the first number of the S-D evaluation wafers is less than or equal to the first number of available evaluation elements. One or more corrective actions can be applied when the first number of the first set of S-D wafers is greater than the first number of available evaluation elements, wherein the first number of available evaluation elements is determined using the first operational states.

In 255, an evaluation wafer can be selected. Evaluation wafers can include first wafers, additional wafers, and/or delayed wafers. The remaining evaluation wafers can be examined. The selection decisions can be based on the S-D wafer state data, the processing sequence, the number of remaining wafers, the number of required evaluation and/or verification sites, the number of visited evaluation and/or verification sites, or the number of remaining evaluation and/or verification sites, or any combination thereof.

In 260, a site can be selected on the current wafer. In some examples, a first site can be selected from the number of required sites on a first S-D evaluation wafer, and the first site can have a first unverified evaluation feature associated therewith that was created using the first S-D creation procedure. One or more additional sites can be selected from the number of required sites on a first S-D evaluation wafer, and the additional site can have an additional unverified evaluation feature associated therewith that was created using the first S-D creation procedure. The first wafer can be one of the most important wafers and decisions can be made for a group of wafers based on the results from the first wafer. In other examples, decisions can be based on data from additional wafers and/or delayed wafers.

In 265, an evaluation procedure can be performed using the selected site. Evaluation data can be obtained for the site using an S-D evaluation procedure performed using an S-D evaluation element. For example, a measurement procedure can provide measurement data, and/or an inspection procedure can provide inspection data.

In some examples, a first site can be selected from the number of remaining sites on an evaluation and/or verification wafer, and the first site can have a first unverified feature associated therewith. First unverified data can be obtained from the first site, and the First unverified data for the first site can have first unverified measurement and/or inspection data associated therewith. First verification data can be established for the first site, and the first verification data can include verified measurement and/or inspection data. First confidence data can be established for the first site using a first difference between the first unverified data and the first verification data, and a first risk data can be established for a first site, wafer, and/or procedure using the first confidence value. When the first confidence data is greater than or equal to a first threshold limit, the first site can be identified as a first verified site having a first confidence level associated therewith, the number of remaining sites can be decreased by one, and the number of visited sites can be increased by one. When the first confidence data is less than the first threshold limit, the first site can be identified as a first unverified site having a second confidence level associated therewith, the number of remaining sites can be decreased by one, and the number of visited sites can be increased by one.

In some embodiments, the unverified data can include evaluation data for a gate structure in a transistor, a drain structure in a transistor, a source structure in a transistor, a capacitor structure, a via structure, a trench structure, a two-dimensional memory structure, a three-dimensional memory structure, a sidewall angle, a critical dimension (CD), an array, a periodic structure, an alignment feature, a doping feature, a strain feature, a damaged-structure, or a reference structure, or any combination thereof. In other embodiments, the unverified data can include evaluation data, measurement data, inspection data, alignment data, verification data, process data, wafer data, library data, historical data, real-time data, optical data, layer data, thermal data, or time data, or any combination thereof. Alternatively, other data may be used.

In some embodiments, the verified data can include verified, predicted, simulated, and/or library data for a gate structure in a transistor, a drain structure in a transistor, a source structure in a transistor, a capacitor structure, a via structure, a trench structure, a two-dimensional memory structure, a three-dimensional memory structure, a sidewall angle, a critical dimension (CD), an array, a periodic structure, an alignment feature, a doping feature, a strain feature, a damaged-structure, or a reference structure, or any combination thereof. In other embodiments, the verified data can include evaluation data, measurement data, inspection data, alignment data, verification data, process data, wafer data, library data, historical data, real-time data, optical data, layer data, thermal data, or time data, or any combination thereof. Alternatively, other data may be used.

In other examples, one or more of the evaluation wafers can be identified as evaluated and/or verified wafers when one or more confidence and/or risk limits are met or corrective action can be applied if one or more limits are not met.

The historical verification data can include first S-D verified data in a S-D verification library, the first S-D verified data in the S-D verification library can include first verified structure data and associated first verified evaluation data, and the first verified signal data can be characterized by a first S-D set of wavelengths.

The real-time verification data can include verified data obtained in real-time. For example, real-time verification data can be established using data from one or more wafers that are similar to the wafer, part of the same wafer lot, or from similarly processes wafers, or any combination thereof. Historical verification data can be stored data.

S-D evaluation features, structures, data, wafers, procedures, and/or images can be verified, when one or more limits are met. When multiple sites and/or wafers are evaluated, confidence and/or risk data can be established for individual wafers and/or groups of wafers. Alternatively, other data may be used. For example, confidence data values can range from zero to nine, where zero indicates a failure condition and nine indicates the most accurate performance. In addition, risk data values can range from zero to nine, where zero indicates a failure or high-risk condition and nine indicates the lowest risk condition. Alternatively, other range may be used. Ranges can be established for the limits to provide for multi-valued confidence data and/or risk data When a first (most accurate) threshold limit is met, the item being evaluated can be identified as having the highest level of confidence and/or the lowest risk factor associated therewith. When another (less accurate) threshold limit is met, the item being evaluated can be identified as having a lower level of confidence and/or a higher risk factor associated therewith. When one or more (varying in accuracy) threshold limits are not met, the item being evaluated can be identified as an unverified item having a low level of confidence and/or a high risk factor associated therewith.

In 275, a query can be performed to determine if an additional site is required. When an additional site is required, procedure 200 can branch back to step 260, and when an additional site is not required, procedure 200 can branch to step 280.

In 280, a query can be performed to determine if an additional evaluation wafer is required. When an additional evaluation wafer is required, procedure 200 can branch back to step 255, and when an additional evaluation wafer is not required, procedure 200 can branch to step 285.

In 285, a query can be performed to determine if the current sequence has been completed. When the current sequence has been completed, procedure 200 can branch back to step 290, and when the current sequence has not been completed, procedure 200 can branch to step 215.

In 290, a query can be performed to determine if an additional sequence is required. When an additional sequence is required, procedure 200 can branch back to step 210, and when an additional sequence is not required, procedure 200 can branch to step 295. Procedure can end in 295.

In some embodiments, a first double-patterning sequence can be performed followed by a second double-patterning sequence. A first set of wafers can be received by one or more subsystems (101, 102, 110, 115, 120, 125, 130, 135, 140, 145, 150, and 155) in the processing system (100), and one or more first patterned layers can be created on one or more of the first set of patterned wafers using a first S-D DP processing sequence. The first S-D processing sequence can be performed using one or more of the subsystems (101, 102, 110, 115, 120, 125, 130, 135, 140, 145, 150, and 155) in the processing system (100). Next, first confidence data and/or first risk data can be established for the first set of patterned wafers using a first S-D evaluation procedure, and a first set of high confidence wafers can be established using data from the first S-D evaluation procedure. Then, one or more second patterned layers can be created on a second set of patterned wafers, and the second set of patterned wafers can be created by performing a second S-D processing sequence using the first set of high confidence wafers. The second S-D processing sequence can be performed using one or more of the subsystems (101, 102, 110, 115, 120, 125, 130, 135, 140, 145, 150, and 155) in a processing system (100), and the one or more second patterned layers are aligned relative to the one or more first patterned layers using a scanner subsystem (115). In addition, second confidence data and/or second risk data can be established for the second set of patterned wafers using a second S-D evaluation procedure, and a second set of high confidence wafers can be established using the data from the first and/or second S-D evaluation procedure.

In some embodiments, a first S-D processing sequence can be used to create a first damascene layer; and the new S-D processing sequence can be used to create a second damascene layer.

In various embodiment, the S-D processing sequence can be performed in real-time and can include one or more S-D lithography-related procedures, one or more S-D scanner-related procedures, one or more S-D inspection-related procedures, one or more S-D measurement-related procedures, one or more S-D evaluation-related procedures, one or more S-D etch-related procedures, one or more S-D deposition-related procedures, one or more S-D thermal processing procedures, one or more S-D coating-related procedures, one or more S-D alignment-related procedures, one or more S-D polishing-related procedures, one or more S-D storage-related procedures, one or more S-D transfer procedures, one or more S-D cleaning-related procedures, one or more S-D rework-related procedures, one or more S-D oxidation-related procedures, one or more S-D nitridation-related procedures, or one or more S-D external procedures, or any combination thereof.

Figure 3:
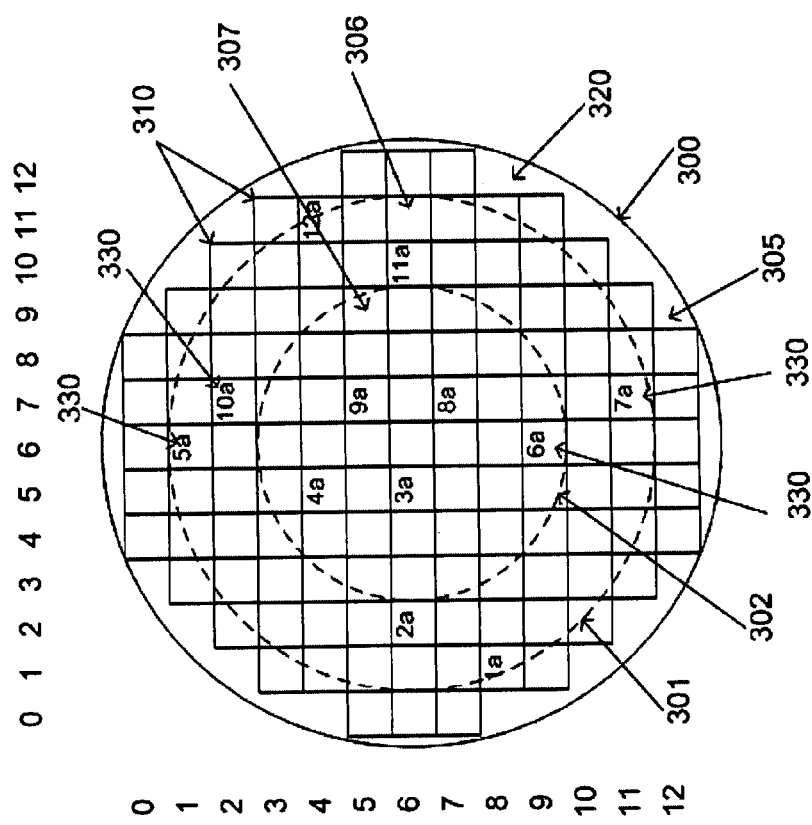
FIG. 3 shows a simplified view of a wafer map in accordance with embodiments of the invention.

FIG. 3 shows a simplified view of a wafer map in accordance with embodiments of the invention. In the illustrated embodiment, a wafer map is shown having one-hundred twenty-five chip/dies, but this is not required for the invention. Alternatively, a different number of chip/dies may be shown. In addition, the circular shapes shown are for illustration purposes and are not required for the invention. For example, the circular wafer may be replaced by a non-circular wafer, and the chip/dies may have non-circular shapes.

The illustrated view shows a wafer map 320 on a wafer 300 that includes one or more chip/dies 310. Rows and columns are shown that are numbered from zero to twelve for illustration. In addition, twelve sites 330 labeled (1*a*-12*a*) can be used to define the location of the sites for the S-D procedures associated with the illustrated wafer map 320. In addition, two circular lines (301 and 302) are shown, and these lines can be used to establish an outer region 305, a mid region 306, and an inner region 307 on the wafer 300. Alternatively, a different number of regions having different shapes may be established on wafer map 320, and a different number of sites for S-D and/or non-S-D procedures may be established at different locations on the wafer. When an S-D measurement, inspection, and/or evaluation plan is created for a wafer, one or more measurement, inspection, and/or evaluation sites can be established in one or more wafer areas. For example, when the S-D strategy, plan, and/or recipe is created, measurement, inspection, and/or evaluation procedures do not have to include and/or use all of the sites 330 shown in FIG. 3.

The S-D procedures can be specified by a semiconductor manufacturer based on data stored in a historical database. For example, a semiconductor manufacturer may have historically chosen a number of positions on the wafer when making SEM measurements and would like to correlate the measurement data, inspection data, and/or evaluation data from one tool to the data measured using a SEM tool, a TEM tool, and/or a FIB tool.

In addition, the number of sites used in S-D and/or non-S-D procedures can be reduced as the manufacturer becomes more confident that the process is and will continue to produce high quality products and/or devices.

When new and/or additional measurement data, inspection data, and/or evaluation data is required, additional S-D data can be obtained from one or more sites on the wafer. For example, measurement features, such as periodic gratings, periodic arrays, and/or other periodic structures, on a wafer can be measured at one or more of the sites shown in FIG. 3.

The S-D measurement, inspection, and/or evaluation procedures can be time consuming and can affect the throughput of a processing system. During process runs, a manufacturer may wish to minimize the amount of time used to measure, inspect, verify, and/or evaluate a wafer. The S-D procedures can be time-dependent, and different S-D procedures may be selected based on their execution time. A smaller number of sites may be used when execution time are too long.

During a development portion of the semiconductor process, one or more S-D reference maps can be created and stored for later use. An S-D reference measurement map can include measured data at measurement sites that are different from those shown in FIG. 3. An S-D reference inspection map can include inspection data at sites that are different from those shown in FIG. 3. An S-D reference verification map can include verification data from sites that are different from those shown in FIG. 3. An S-D reference evaluation map can include evaluation data from sites that are different from those shown in FIG. 3. Alternatively, a reference map can use the same set of sites or one or more reference maps may not be required.

In addition, during an S-D procedure, one or more S-D prediction maps can be created and/or modified, and the S-D prediction maps can include predicted measured data, predicted inspection data, predicted verification data, and/or predicted evaluation data, and/or predicted process data. For example, predicted data can be obtained using an S-D model.

Furthermore, one or more S-D and/or non-S-D confidence maps can be created and/or modified, and the confidence maps can include confidence values for the measured data, the inspection data, the verification data, the evaluation data, the predicted data, and/or the process data.

The wafer maps can include one or more Goodness Of Fit (GOF) maps, one or more grating thickness maps, one or more via-related maps, one or more Critical Dimension (CD) maps, one or more CD profile maps, one or more material related maps, one or more trench-related maps, one or more sidewall angle maps, one or more differential width maps, or a combination thereof. The data can also include site result data, site number data, CD measurement flag data, number of measurement sites data, coordinate X data, and coordinate Y data, among others.

In some embodiments, curve-fitting procedures can be performed to calculate data for the sites on the wafer that are not included in an S-D procedure. Alternatively, the wafer maps may be determined using surface estimating, surface fitting techniques, or other mathematical techniques. When maps are created for a wafer, the measurement sites can be chosen based on expected, predicted, and/or actual accuracy values and/or requirements.

Some errors that are generated by mapping applications can be sent to the FDC system, and the FDC system can decide how the processing system should respond to the error. Other errors can be resolved by the mapping applications.

When wafer maps are created and/or modified, values may not be calculated and/or required for the entire wafer, and a wafer map may include data for one or more sites, one or more chip/dies, one or more different areas, and/or one or more differently shaped areas. For example, a processing chamber may have unique characteristics that may affect the quality of the processing results in certain areas of the wafer. In addition, a manufacturer may allow less accurate process and/or evaluation data for chips/dies in one or more regions of the wafer to maximize yield. A mapping application and/or the FDC system can use business rules to determine confidence, risk, uniformity, and/or accuracy limits.

When a value in a map is close to a limit, the confidence value may be lower than when the value in a map is not close to a limit. In addition, the accuracy values can be weighted for different chips/dies and/or different areas of the wafer. For example, a higher confidence weight can be assigned to the accuracy calculations and/or accuracy data associated with one or more of the previously used evaluation sites.

In addition, process result, measurement, inspection, verification, evaluation, and/or prediction maps associated with one or more processes may be used to calculate a confidence map for a wafer. For example, values from another map may be used as weighting factors.

Figure 4:
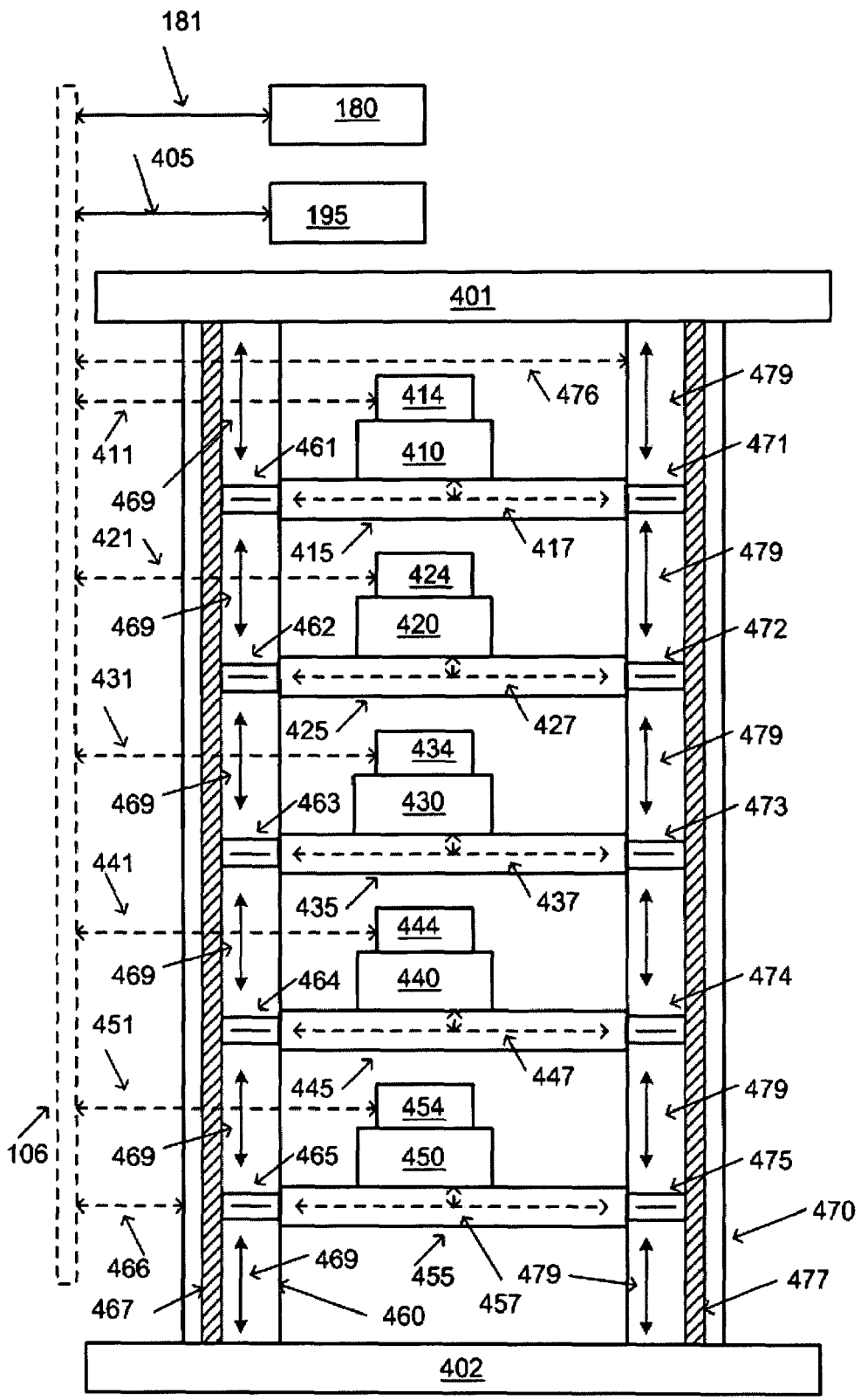
FIG. 4 shows a simplified block diagram of an exemplary subsystem in accordance with embodiments of the invention.

FIG. 4 shows a simplified block diagram of an exemplary subsystem in accordance with embodiments of the invention. In the illustrated embodiment, an exemplary S-D subsystem 400 is shown that includes five S-D elements (410, 420, 430, 440, and 450), a first S-D transfer subsystem 460, and a second S-D transfer subsystem 470. The first S-D transfer subsystem 460 can be coupled to a first non-S-D transfer subsystem 401, and to a second non-S-D transfer subsystem 402. The second S-D transfer subsystem 470 can be coupled to the first non-S-D transfer subsystem 401, and to the second non-S-D transfer subsystem 402. The first non-S-D transfer subsystem 401, and the second non-S-D transfer subsystem 402 can be coupled to and/or part of the transfer subsystems (101, 102, 103, FIG. 1). Alternatively, a different number of subsystems may be used, a different number of transfer subsystems may be used, and the subsystem may be configured differently. In addition, non-S-D subsystems may be used.

The exemplary S-D subsystem 400 can comprise five S-D loadlock elements (415, 425, 435, 445, and 455) that can be coupled to the first S-D transfer subsystem 460, and to the second S-D transfer subsystem 470. Alternatively, a different number of loadlock elements may be used and may be configured differently. In other embodiments, the loadlock elements may not be required. S-D loadlock element 415 can be coupled to one or more S-D processing elements 410; S-D loadlock element 425 can be coupled to one or more S-D processing elements 420; S-D loadlock element 435 can be coupled to one or more S-D processing elements 430; S-D loadlock element 445 can be coupled to one or more S-D processing elements 440; and S-D loadlock element 455 can be coupled to one or more S-D processing elements 450. In various embodiments, the S-D loadlock elements (415, 425, 435, 445, and 455) can comprise S-D internal transfer devices (417, 427, 437, 447, and 457, respectively) for transferring, delaying, storing, aligning, and/or inspecting one or more wafers at substantially the same time.

The first S-D transfer subsystem 460 can comprise a first S-D delivery element 467 that can be coupled to a first number of first S-D transfer elements (461, 462, 463, 464, and 465). In some embodiments, a first S-D transfer element can be dynamically coupled or decoupled to the first S-D delivery element 467 and can move in one or more directions 469. In addition, the coupling and/or decoupling can be S-D and can be determined using the first S-D delivery element 467, a first S-D transfer element, wafer data, system data, processing sequence data, or transfer sequence data, or any combination thereof. The first S-D delivery element 467 can include one or more levels (not shown) and can operate at one or more speeds. Alternatively, other wafer transfer techniques may be used.

Furthermore, the first S-D transfer subsystem 460 and the second S-D transfer subsystem 470 can load, carry, and/or unload wafers based on a processing sequence, a transfer sequence, operational states, the wafer and/or processing states, the processing time, the current time, the wafer data, the number of sites on the wafer, the type of sites on the wafers, the number of required sites, the number of completed sites, the number of remaining sites, or confidence data, or any combination thereof.

Five first S-D transfer elements (461, 462, 463, 464, and 465) are shown in the illustrated embodiment, but this is not required for the invention. In other embodiments, a different number of first S-D transfer elements may be used. In addition, the illustrated first S-D transfer elements (461, 462, 463, 464, and 465) are shown at first transfer points in FIG. 4, but this is not required for the invention. When a first S-D transfer element is located at a first transfer point, one or more wafers (not shown) can be transferred between a first S-D transfer element and an S-D loadlock element.

The second S-D transfer subsystem 470 can comprise a second S-D delivery element 477 that can be coupled to a second number of second S-D transfer elements (471, 472, 473, 474, and 475). In some embodiments, a second S-D transfer element can be dynamically coupled or decoupled to the second S-D delivery element 477 and can move in one or more directions 479. In addition, the coupling and/or decoupling can be S-D and can be determined using the second S-D delivery element 477, a second S-D transfer element, wafer data, system data, processing sequence data, or transfer sequence data, or any combination thereof. The second S-D delivery element 477 can include one or more levels (not shown) and can operate at one or more speeds. Alternatively, other wafer transfer techniques may be used.

Five second S-D transfer elements (471, 472, 473, 474, and 475) are shown in the illustrated embodiment, but this is not required for the invention. In other embodiments, a different number of second S-D transfer elements may be used. In addition, the illustrated second S-D transfer elements (471, 472, 473, 474, and 475) are shown at second transfer points in FIG. 4, but this is not required for the invention. When a second S-D transfer element is located at a second transfer point, one or more wafers (not shown) can be transferred between a second S-D transfer element and an S-D loadlock element.

For example, an S-D processing sequence, and/or an S-D transfer sequence can be used by the first S-D transfer subsystem 460, and/or the second S-D transfer subsystem 470 to transfer wafers.

The exemplary S-D subsystem 400 can comprise five controllers (414, 424, 434, 444, and 454). The first controller 414 can be coupled to the one or more first S-D processing elements 410 and can be used to control the one or more first S-D processing elements 410 and the first S-D loadlock elements 415. In addition, the first controller 414 can be coupled 411 to the data transfer subsystem (106, FIG. 1). The second controller 424 can be coupled to the one or more second S-D processing elements 420 and can be used to control the one or more second S-D processing elements 420 and the second S-D loadlock elements 425. In addition, the second controller 424 can be coupled 421 to the data transfer subsystem (106, FIG. 1). The third controller 434 can be coupled to the one or more third S-D processing elements 430 and can be used to control the one or more third S-D processing elements 430 and the third S-D loadlock elements 435. In addition, the third controller 434 can be coupled 431 to the data transfer subsystem (106, FIG. 1). The fourth controller 444 can be coupled to the one or more fourth S-D processing elements 440 and can be used to control the one or more fourth S-D processing elements 440 and the fourth S-D loadlock element 445. In addition, the fourth controller 444 can be coupled 441 to the data transfer subsystem (106, FIG. 1). The fifth controller 454 can be coupled to the one or more fifth S-D processing elements 450 and can be used to control the one or more fifth S-D processing elements 450 and the fifth S-D loadlock element 455. In addition, the fifth controller 454 can be coupled 451 to the data transfer subsystem (106, FIG. 1). Alternatively, a different number of controllers may be used, a different number of processing elements may be used, and the data transfer subsystem may be configured differently.

One or more of the controllers (414, 424, 434, 444, and 454) can create, process, modify, send, and/or receive one or more messages in real time. The first S-D transfer subsystem 460 can be coupled 466 to the data transfer subsystem (106, FIG. 1), and can create, process, modify, send, and/or receive one or more messages in real time. The second S-D transfer subsystem 470 can be coupled 476 to the data transfer subsystem (106, FIG. 1) and can create, process, modify, send, and/or receive one or more messages in real time. Data transfer subsystem 106 can also be used to create, process, modify, send, and/or receive one or more messages in real time. Messages can include S-D data and/or non-S-D data, and the messages can include real-time data and/or historical data.

In some embodiments, one or more wafers can be received by the first S-D transfer subsystem 460, and/or the second S-D transfer subsystem 470. A processing sequence can be established for the wafer by the system 400. For example, wafer and/or process state data can be used before and/or when a wafer is received to establish a processing sequence. Alternatively, a wafer can be received by a processing element.

One or more messages can be processed in real time by one or more of the controllers (414, 424, 434, 444, and 454). One or more wafers can be processed at substantially the same time by one or more of the subsystems (410, 420, 430, 440, and 450). One or more messages can be used to determine a processing sequence for each wafer. For example, a first wafer can be sent to the first processing element 410 using the first loadlock element 415; a second wafer can be sent to the second processing element 420 using the second loadlock element 425; a third wafer can be sent to the third processing element 430 using the third loadlock element 435; a fourth wafer can be sent to the fourth processing element 440 using the fourth loadlock element 445; and a fifth wafer can be sent to the fifth processing element 450 using the fifth loadlock element 455. In addition, one or more of the messages can include wafer data, recipe data, profile data, modeling data, tool data, and/or processing data.

One or more of the controllers (414, 424, 434, 444, and 454) can be used to determine how and when to process the one or more wafers using the one or more of the S-D processing elements (410, 420, 430, 440, and 450). A controller can be used to determine when an S-D processing element in an S-D subsystem is available and/or when an S-D processing element in an S-D subsystem is not available. For example, an S-D message and/or data may not be available because of timing issues, and a controller can wait until the S-D message and/or data is available. In addition, when new (updated) S-D data is not available, the wafer can be processed using non-updated S-D data.

In some embodiments, establishing a first number of wafers to be processed using the first processing sequence can be established. A second number of available processing elements in the S-D subsystem can be identified by querying one or more processing elements in the S-D subsystem. For example, an operational state can be determined for each processing element, and first operational state can be a first value when a processing element is available and can be a second value when a processing element is not available for the second number of available processing elements.

When the second number is equal to or greater than the first number, the first number of wafers can be transferred to the second number of available processing elements in the S-D subsystem. When the second number is less than the first number, one or more corrective actions can be performed.

The corrective actions can include: 1) processing as many wafers as possible and storing the remaining wafers; 2) processing as many wafers as possible and processing the remaining wafers as soon as processing elements become available; 3) processing as many wafers as possible and sending one or more of the remaining wafers to another subsystem as soon as processing elements become available in the other subsystem In some embodiments, a first S-D mask procedure can be performed. For example, a mask deposition procedure can be performed using the first S-D elements 410; an exposure procedure can be performed using the second S-D elements 420; a drying and/or inspection procedure can be performed using the third S-D elements 430; a rework procedure can be performed using the fourth S-D elements 440; and a development procedure can be performed using the fifth S-D elements 450. In other examples, other subsystems may be substituted and/or additional subsystems can be used. Other S-D processing sequences can be used to determine the number, and/or type of subsystems to use and when to use them.

In additional embodiments, S-D measurement procedures can be performed. S-D processing sequences and/or S-D transfer sequences can be established for some wafers using wafer data, and the sequences can include S-D measurement procedures. S-D processing sequences and/or S-D transfer sequences can be performed using S-D processing elements (410, 420, 430, 440, and 450) and transfer subsystems (401, 460, and 470). For example, the first non-S-D transfer subsystem 401, and/or the second non-S-D transfer subsystem 402 can receive a number of wafers that can include S-D and/or non-S-D wafers. A first set of wafers can be received by the first S-D transfer subsystem 460 and/or the second S-D transfer subsystem 470.

Each wafer can have wafer data associated therewith, and the wafer data can include S-D data and/or non-S-D data. One or more of the wafers have one or more evaluation structures thereon. S-D and/or non-S-D confidence data can be determined for the wafers, the subsystems, the processing elements, the procedures, or the process result data, or any combination thereof.

A first set of S-D measurement wafers can be established, and each wafer in the first set of S-D measurement wafers can have one or more evaluation structures thereon. The first set of S-D measurement wafers can be established using the S-D data and/or non-S-D data, and the first set of S-D measurement wafers can be transferred to one or more the S-D processing elements (410, 420, 430, 440, and 450). For example, confidence data, wafer state data, processing sequence data, or historical data may be used.

First S-D measurement procedures can be determined for the first set of S-D measurement wafers, and the first set of S-D measurement wafers being measured in first S-D evaluation element 410 using the first S-D measurement procedures. For example, confidence data, wafer state data, processing sequence data, or historical data may be used to establish the first S-D measurement procedures.

The first set of S-D measurement wafers can be transferred to one or more first S-D measurement-related elements 410 in the first S-D subsystems 400 using one or more of the S-D transfer subsystems (460, 470). A first S-D transfer sequence, a first S-D processing sequence, or the first S-D measurement procedures, or any combination thereof can be used to determine the one or more first S-D measurement-related elements 410. The one or more first S-D measurement-related elements 410 can perform the first S-D measurement procedures.

In some embodiment, a first measurement wafer can be selected from the first set of S-D measurement wafers, and the first measurement wafer can have a first S-D evaluation feature thereon. First measurement data can be obtained that includes first S-D measured signal data from the first S-D feature. First S-D best estimate signal data and associated first S-D best estimate structure can be selected from a library of S-D measurement signals and associated structures. For example, the signals may include diffraction signals and/or spectra, refraction signals and/or spectra, reflection signals and/or spectra, or transmission signals and/or spectra, or any combination thereof.

In addition, the S-D evaluation features can include mask structures, etched structures, doped structures, filled structures, semi-filled structures, damaged structures, dielectric structures, gate structures, gate electrode structures, gate stack structures, transistor structures, FinFET structures, CMOS structures, photoresist structures, periodic structures, alignment structures, trench structures, or via structures, array structures, grating structures, or any combination thereof.

First S-D differences can be calculated between the first S-D measured signal data and the first S-D best estimate signal data, and first S-D confidence data can be established for the first measurement wafer using the first S-D differences. The first S-D confidence data can be compared to first S-D product requirements and either the first measurement wafer can be identified as a first high confidence wafer and the processing can continue if one or more of the first S-D product requirements are met, or a first corrective action can be applied if one or more of the first S-D product requirements are not met.

The S-D measured signal data can be obtained from a S-D evaluation structure, or from other structures, or any combination thereof;

The first S-D evaluation feature can be identified using the first S-D best estimate structure and associated first S-D best estimate signal data when one or more of the first S-D product requirements are met.

In some embodiments, a first corrective action can include: selecting new S-D best estimate signal data and associated new S-D best estimate structure from the library of S-D diffraction signals and associated structures; calculating new S-D differences between the first S-D measured signal data and the new S-D best estimate signal data; establishing new S-D confidence data for the first measurement wafer using the new S-D differences; comparing the new S-D confidence data to new S-D product requirements; and either identifying the first measurement wafer as a new high confidence wafer and continuing the processing if one or more of the new S-D product requirements are met, or stopping the selecting, the calculating, the establishing, the comparing, and the identifying if one or more of the new S-D product requirements are not met. The first S-D evaluation feature can be identified using the new S-D best estimate structure and associated new S-D best estimate signal data when the first S-D profile library creation criteria is met. Alternatively, other best estimate data may be used, and other comparisons may be made.

In other embodiments, a first corrective action can include: selecting a second measurement wafer from the first set of S-D measurement wafers, the second measurement wafer having the first S-D evaluation feature thereon; obtaining second measurement data including second S-D measured signal data from the first S-D feature; selecting second S-D best estimate signal data and associated second S-D best estimate structure from the library of S-D measurement data [diffraction signals] and associated structures; calculating second S-D differences between second S-D measured signal data and the second S-D best estimate signal data; establishing second S-D confidence data for the second measurement wafer using the second S-D differences; comparing the second S-D confidence data to second S-D product requirements; and either identifying the second measurement wafer as a second high confidence wafer and continuing the processing if one or more of the second S-D product requirements are met, or applying a second corrective action if one or more of the second S-D product requirements are not met.

In still other embodiments, a first corrective action can include: selecting a second S-D evaluation feature on a measurement wafer; obtaining second measurement data including second S-D measured signal data from the second S-D feature; selecting second S-D best estimate signal data and associated second S-D best estimate structure from the library of S-D measurement data [diffraction signals] and associated structures; calculating second S-D differences between second S-D measured signal data and the second S-D best estimate signal data; establishing second S-D confidence data for the first measurement wafer using the second S-D differences; comparing the second S-D confidence data to second S-D product requirements; and either identifying the first measurement wafer as a second high confidence wafer and continuing the processing if one or more of the second S-D product requirements are met, or applying a second corrective action if one or more of the second S-D product requirements are not met.

In some embodiments, additional corrective actions can include: selecting additional S-D evaluation features on one or more measurement wafers; obtaining additional measurement data including additional S-D measured signal data from the additional S-D feature; selecting additional S-D best estimate signal data and associated additional S-D best estimate structure from the library of S-D measurement data and associated structures; calculating additional S-D differences between the additional S-D measured signal data and the additional S-D best estimate signal data; establishing additional S-D confidence data for the one or more measurement wafers using the additional S-D differences; comparing the additional S-D confidence data to additional S-D product requirements; and either identifying the one or more measurement wafers as additional high confidence wafers and continuing the processing if one or more of the additional S-D product requirements are met, or stopping the selecting, the calculating, the establishing, the comparing, and the identifying if one or more of the additional S-D product requirements are not met.

When new sites are selected, library creation rules can be used.

In other embodiments, a double-patterning processing sequence can be performed using one or more S-D procedures. A first set of wafers can be received by the first S-D transfer subsystem 460 and/or the second S-D transfer subsystem 470. The first set of wafers can be transferred to one or more the first S-D elements 410. A first masking layer can be deposited on each wafer using a first S-D mask deposition procedure, and a first set of high confidence wafers can be established using a first S-D evaluation procedure. The first set of high confidence wafers can be received by the first S-D transfer subsystem 460 and/or the second S-D transfer subsystem 470. The first set of high confidence wafers can be transferred to one or more the second S-D elements 420. The masking layer on each wafer can be exposed to first patterned radiation using a first S-D exposure procedure, and a second set of high confidence wafers can be established using a second S-D evaluation procedure. The second set of high confidence wafers can be received by the first S-D transfer subsystem 460 and/or the second S-D transfer subsystem 470. The second set of high confidence wafers can be transferred to one or more the third S-D elements 430. The exposed layer can be developed using an S-D development procedure, and a third set of high confidence wafers can be established using a third S-D evaluation procedure. The third set of high confidence wafers can be received by the first S-D transfer subsystem 460 and/or the second S-D transfer subsystem 470. The third set of high confidence wafers can be transferred to one or more the fourth S-D elements 440. The developed wafers can be etched using an S-D etching procedure, a first set of etched structures can be created in one or more layers on each wafer, and a fourth set of high confidence wafers can be established using a fourth S-D evaluation procedure. The fourth set of high confidence wafers can be received by the first S-D transfer subsystem 460 and/or the second S-D transfer subsystem 470. The fourth set of high confidence wafers can be transferred to one or more the fifth S-D elements 450. One or more first materials can be deposited on the etched wafers using a S-D deposition procedure, a first set of filled structures can be created in one or more layers on each wafer, and a fifth set of high confidence wafers can be established using a fifth S-D evaluation procedure.

The fifth set of high confidence wafers can be received by the first S-D transfer subsystem 460 and/or the second S-D transfer subsystem 470. The fifth set of high confidence wafers can be transferred to one or more the first S-D elements 410. A second masking layer can be deposited on each wafer using a second S-D mask deposition procedure, and a sixth set of high confidence wafers can be established using a sixth S-D evaluation procedure. The sixth set of high confidence wafers can be received by the first S-D transfer subsystem 460 and/or the second S-D transfer subsystem 470. The sixth set of high confidence wafers can be transferred to one or more the second S-D elements 420. The second masking layer on each wafer can be exposed to second patterned radiation using a second S-D exposure procedure, and a seventh set of high confidence wafers can be established using a seventh S-D evaluation procedure. The seventh set of high confidence wafers can be received by the first S-D transfer subsystem 460 and/or the second S-D transfer subsystem 470.

The seventh set of high confidence wafers can be transferred to one or more the third S-D elements 430. The second exposed layer can be developed using a second S-D development procedure, and an eighth set of high confidence wafers can be established using an eighth S-D evaluation procedure. The eighth set of high confidence wafers can be received by the first S-D transfer subsystem 460 and/or the second S-D transfer subsystem 470. The eighth set of high confidence wafers can be transferred to one or more the fourth S-D elements 440. The developed wafers can be etched using a second S-D etching procedure, a second set of etched structures can be created in one or more layers on each wafer, and a ninth set of high confidence wafers can be established using a ninth S-D evaluation procedure. The ninth set of high confidence wafers can be received by the first S-D transfer subsystem 460 and/or the second S-D transfer subsystem 470. The ninth set of high confidence wafers can be transferred to one or more the fifth S-D elements 450. One or more second materials can be deposited on the etched wafers using a second S-D deposition procedure, a second set of filled structures can be created in one or more layers on each wafer, and a tenth set of high confidence wafers can be established using a tenth S-D evaluation procedure.

The first sets of high confidence wafers can be established by: 1a) obtaining S-D confidence data from one or more mask creation evaluation sites during the first S-D mask creation procedures; 2a) comparing the S-D confidence data for each wafer in the first set of wafers to one or more confidence requirements established for the one or more mask creation evaluation sites; and 3a) identifying a wafer in the first set of wafers as a member of the first set of high confidence wafers if a first mask creation confidence requirement is met.

The second sets of high confidence wafers can be established by: 1b) obtaining S-D confidence (mapping) data from one or more exposure dependent sites during the S-D exposure procedures; 2b) comparing the S-D confidence (mapping) data for each wafer in the first set of high confidence wafers to one or more confidence (mapping) requirements established for the one or more exposure dependent sites; and 3b) identifying a wafer in the first set of high confidence wafers as a member of the second set of high confidence wafers if a first exposure-related confidence (mapping) requirement is met.

The third sets of high confidence wafers can be established by: 1c) obtaining S-D confidence (mapping) data from one or more development dependent sites during the S-D developing procedures; 2c) comparing the S-D confidence (mapping) data for each wafer in the second set of high confidence wafers to one or more confidence (mapping) requirements established for the one or more development dependent sites; and 3c) identifying a wafer in the second set of high confidence wafers as a member of the third set of high confidence wafers if a first developing-related confidence (mapping) requirement is met.

The fourth sets of high confidence wafers can be established by: 1d) obtaining S-D confidence (mapping) data from one or more etch dependent sites during the S-D etching procedures; 2d) comparing the S-D confidence (mapping) data for each wafer in the third set of high confidence wafers to one or more confidence (mapping) requirements established for the one or more etch dependent sites; and 3d) identifying a wafer in the third set of high confidence wafers as a member of the fourth set of high confidence wafers if a first etching-related confidence (mapping) requirement is met.

The fifth sets of high confidence wafers can be established by: 1e) obtaining S-D confidence (mapping) data from one or more deposition dependent sites during the S-D deposition procedures; 2e) comparing the S-D confidence (mapping) data for each wafer in the fourth set of high confidence wafers to one or more confidence (mapping) requirements established for the one or more deposition dependent sites; and 3e) identifying a wafer in the fourth set of high confidence wafers as a member of the fifth set of high confidence wafers if a first deposition-related confidence (mapping) requirement is met.

Additional sets of high confidence wafers can be established using similar procedures.

The evaluation sites can include process-dependent sites, measurement-dependent sites, inspection-dependent sites, layer-dependent sites wafer-dependent sites, the S-D confidence data can include confidence values for S-D (mask creation) data including accuracy data, S-D processing data, S-D measurement data, S-D inspection data, S-D simulation data, S-D prediction data, or S-D historical data, or any combination thereof and the first mask creation confidence requirement can include confidence data limits for the mask creation data including accuracy limits, processing data limits, measurement data limits, inspection data limits, simulation data limits, prediction data limits, and/or historical data limits.

In some additional embodiments, the first non-S-D transfer subsystem 401, and/or the second non-S-D transfer subsystem 402 can receive S-D and/or non-S-D wafers can be included. The S-D wafers can be transferred to the first S-D transfer subsystem 460 and/or the second S-D transfer subsystem 470. The data associated with the wafers can include S-D confidence data and/or non-S-D confidence data.

A first set of S-D wafers can be established using the S-D confidence data and/or non-S-D confidence data, and first S-D processing sequences can be determined for the first set of S-D wafers. The first set of S-D wafers can be processed in one or more of the S-D elements (410, 420, 430, 440, and 450) using the first S-D processing sequences, and wafer state data can be used to establish the first S-D processing sequences. The first set of S-D wafers can be transferred to one or more S-D processing elements (410, 420, 430, 440, and 450), and the first S-D processing sequence can be used to determine the one or more first S-D processing elements.

In addition, first S-D subsystem processing data can be collected before, during, and/or after the first S-D processing sequences are performed using the first set of S-D wafers, first S-D confidence data can be established for one or more wafers in the first set of S-D wafers using the wafer data and/or the first S-D subsystem processing data. In some examples, a first S-D confidence value can be established for a first S-D wafer in the first set of S-D wafers using the first S-D subsystem processing data. The first S-D confidence value for the first S-D wafer can be compared to a first S-D confidence limit. The processing of the first set of S-D wafers can continue, if the first S-D confidence limit is met, or a first S-D corrective action can be applied if the first S-D confidence limit is not met. First S-D corrective actions can include establishing S-D confidence values for one or more additional wafers in the first set of S-D wafers using the first S-D subsystem processing data, comparing the S-D confidence values for one or more of the additional wafers to additional first S-D confidence limits; and either continuing to process the first set of S-D wafers, if one or more of the additional first S-D confidence limits are met, or stopping the establishing and the comparing, if one or more of the additional first S-D confidence limits are not met.

Other sets of S-D wafers can also be established using the S-D confidence data and/or non-S-D confidence data, and other S-D processing sequences can be determined for the other sets of S-D wafers. The other sets of S-D wafers can be processed in other S-D subsystems using the other S-D processing sequences, and wafer state data can be used to establish the other S-D processing sequences. The other sets of S-D wafers can be transferred to one or more other S-D processing elements in the other S-D subsystems, and the other S-D processing sequences can be used to determine the one or more other S-D processing elements. For example, the other sets of S-D wafers can be transferred to one or more S-D processing elements in the one or more other S-D subsystems.

During some wafer processing, a first set of non-S-D wafers can be established using the S-D confidence data and/or non-S-D confidence data, and first non-S-D processing sequences can be determined for the first set of non-S-D wafers. In some cases, the first set of non-S-D wafers can be processed in non-S-D subsystems using the first non-S-D processing sequences, and wafer state data can be used to establish the first non-S-D processing sequences. The first set of non-S-D wafers can be transferred to one or more non-S-D processing elements in the non-S-D subsystems, and the first non-S-D processing sequence can be used to determine the one or more first non-S-D processing elements. For example, the first set of non-S-D wafers can be transferred to one or more non-S-D processing elements in one or more of the other subsystems.

In various embodiments, a non-S-D wafer can be processed in non-S-D subsystems using non-S-D processing sequences, or a non-S-D wafer can be processed in S-D subsystems using non-S-D processing sequences, or a non-S-D wafer can be processed in non-S-D subsystems using non-S-D processing sequences and wafer state data can be used to establish the processing sequences. In addition, non-S-D wafers can be transferred using non-S-D transfer sequences and/or S-D transfer sequences. Processing sequences can be used to determine transfer sequences.

In addition, first non-S-D subsystem processing data can be collected before, during, and/or after the first non-S-D processing sequences are performed using the first set of non-S-D wafers, first non-S-D confidence data can be established for one or more wafers in the first set of non-S-D wafers using the wafer data and/or the first non-S-D subsystem processing data. In other examples, a first non-S-D confidence value can be established for a first non-S-D wafer in the first set of non-S-D wafers using the first non-S-D subsystem processing data. The first non-S-D confidence value for the first non-S-D wafer can be compared to a first non-S-D confidence limit. The processing of the first set of non-S-D wafers can continue, if the first non-S-D confidence limit is met, or a first non-S-D corrective action can be applied if the first non-S-D confidence limit is not met. First non-S-D corrective actions can include establishing non-S-D confidence values for one or more additional wafers in the first set of non-S-D wafers using the first non-S-D subsystem processing data, comparing the non-S-D confidence values for one or more of the additional wafers to additional first non-S-D confidence limits; and either continuing to process the non-S-D wafers, if one or more of the additional first non-S-D confidence limits are met, or stopping the establishing and the comparing, if one or more of the additional first non-S-D confidence limits are not met.

Other sets of non-S-D wafers can also be established using the S-D confidence data and/or non-S-D confidence data, and other non-S-D processing sequences can be determined for the other sets of non-S-D wafers. The other sets of non-S-D wafers can be processed in other non-S-D subsystems using the other non-S-D processing sequences, and wafer state data can be used to establish the other non-S-D processing sequences. The other sets of non-S-D wafers can be transferred to one or more other non-S-D processing elements in the other non-S-D subsystems, and the other non-S-D processing sequences can be used to determine the one or more other non-S-D processing elements. For example, the other sets of non-S-D wafers can be transferred to one or more processing elements in one or more other subsystems.

The S-D processing sequences and/or the non-S-D processing sequences can include one or more coating procedures, one or more etching procedures, one or more thermal procedures, one or more exposure procedures, one or more oxidation procedures, one or more nitridation procedures, one or more development procedures, one or more lithography procedures, one or more scanner-related procedures, one or more measurement procedures, one or more inspection procedures, one or more evaluation procedures, one or more simulation procedures, one or more prediction procedures, one or more rework procedures, one or more storage procedures, one or more transfer procedures, one or more loadlock procedures, or one or more cleaning procedures, or any combination thereof.

The S-D subsystems and/or the non-S-D subsystems can include one or more coating subsystems, one or more etching subsystems, one or more thermal subsystems, one or more exposure subsystems, one or more oxidation subsystems, one or more nitridation subsystems, one or more development subsystems, one or more lithography subsystems, one or more scanner-related subsystems, one or more measurement subsystems, one or more inspection subsystems, one or more evaluation subsystems, one or more simulation subsystems, one or more prediction subsystems, one or more rework subsystems, one or more storage subsystems, one or more transfer subsystems, one or more loadlock subsystems, or one or more cleaning subsystems, or any combination thereof.

The S-D processing elements and/or the non-S-D processing elements can include one or more coating processing elements, one or more etching processing elements, one or more thermal processing elements, one or more exposure processing elements, one or more oxidation processing elements, one or more nitridation processing elements, one or more development processing elements, one or more lithography processing elements, one or more scanner-related processing elements, one or more measurement processing elements, one or more inspection processing elements, one or more evaluation processing elements, one or more simulation processing elements, one or more prediction processing elements, one or more rework processing elements, one or more storage processing elements, one or more transfer processing elements, one or more loadlock processing elements, or one or more cleaning processing elements, or any combination thereof.

Figure 5:
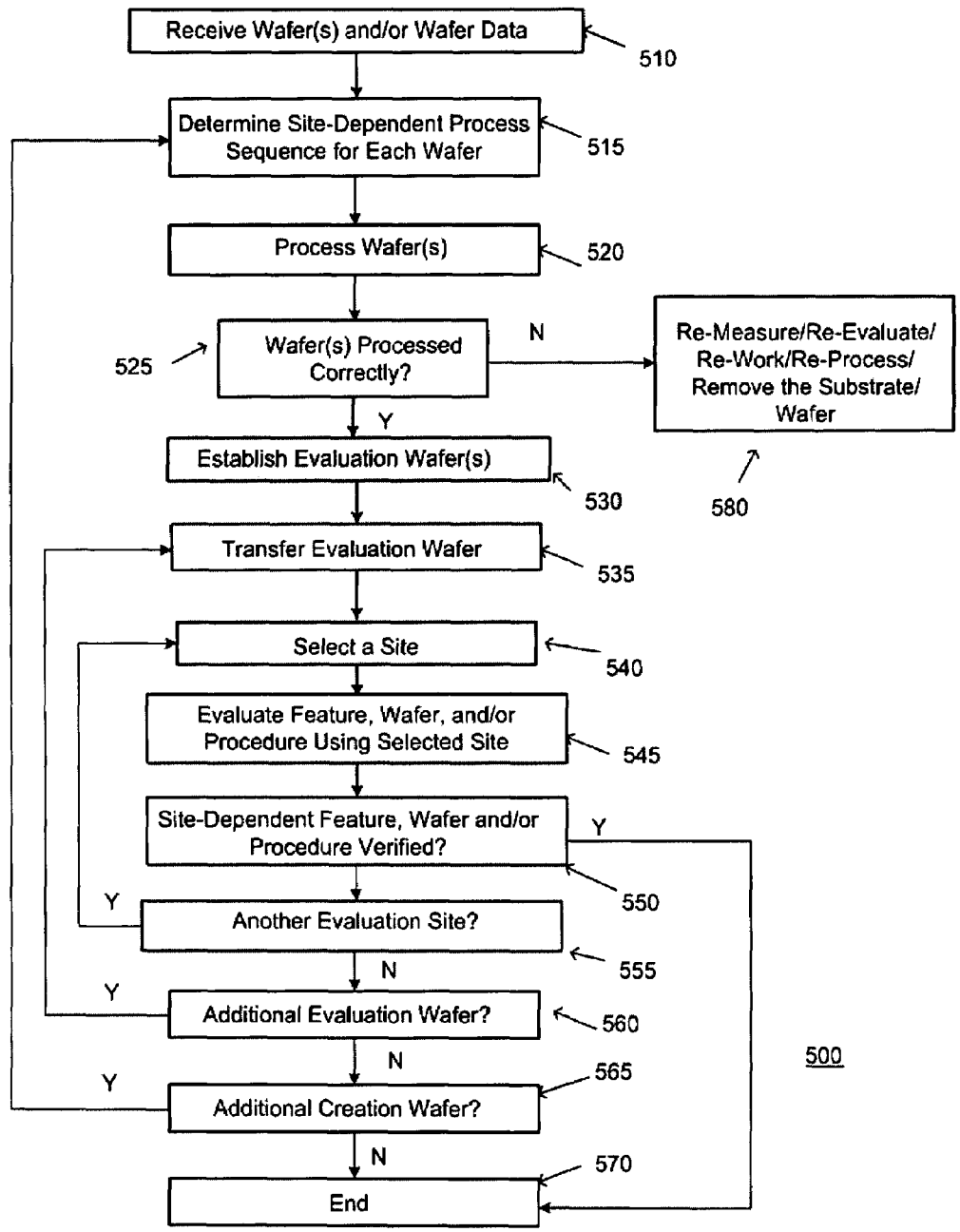
FIG. 5 illustrates an exemplary flow diagram of a method for verifying a S-D feature, a S-D wafer, and/or a S-D procedure in accordance with embodiments of the invention.

FIG. 5 illustrates an exemplary flow diagram of a method for verifying an S-D feature, an S-D wafer, and/or an S-D procedure in accordance with embodiments of the invention.

In 510, a first set of S-D wafers can be received by one or more S-D processing elements in one or more processing subsystems, and the one or more S-D processing elements can be coupled to one or more S-D transfer subsystems, and wafer data can be received for the one or more wafers. Alternatively, a wafer can be received by one or more S-D transfer subsystems. The wafer data can include historical and/or real-time data. Wafer state data can be established for one or more of the wafers, and the wafer state data can include S-D data, chip-dependent data, and/or die-dependent data.

In 515, an S-D processing sequence can be determined for the S-D wafers. In some cases, different S-D processing sequences can be determined for some of the S-D wafers. Alternatively, a non-S-D processing sequence may be established.

In 520, one or more S-D wafers can be processed. In some embodiments, a first set of unverified S-D wafers can be created by performing a first S-D creation procedure using the one or more S-D processing elements, and one or more unverified evaluation features can be created at a first number of evaluation sites on each of the unverified S-D wafers. S-D wafer state data can be established for each unverified S-D wafer, and the S-D wafer state data can include the number of required creation sites and the number of required evaluation sites for each unverified S-D wafer.

In 525, a query can be performed to determine if the one or more S-D creation procedures were performed correctly. When the one or more S-D creation procedures were performed correctly, procedure 500 can branch to step 530, and when the one or more S-D creation procedures were not performed correctly, procedure 500 can branch to step 580. For example, tool data, chamber data, particle data, image data, and/or fault data may be used.

In 580, the wafer can be post-processed using one or more additional procedures can include re-measuring, re-evaluating, re-working, and/or removing the wafer from the processing sequence.

In 545, an S-D wafer can be evaluated using the selected site. In some cases, first wafer-verification data can be obtained from the first site on the first S-D evaluation wafer. The first wafer-verification data can include first S-D measurement data and/or first S-D inspection data that can be obtained using S-D measurement procedures performed in S-D measurement elements and/or first S-D inspection procedures performed in S-D inspection elements. Next, first verified data can be established for the first site on the first S-D evaluation wafer, and the first verified data can include first verified measurement data and/or inspection data that can be obtained from historical and/or real-time databases. Then, a first confidence value can be established for the first site on the first S-D evaluation wafer using a first wafer-verify difference, and the first wafer-verify difference can be calculated using the first wafer-verification data and the first verified data.

A first risk factor can be established for the first site on the first S-D evaluation wafer using the first confidence value, the first wafer-verification difference, or the wafer data, or any combination thereof, and a first total risk factor can be established for the first S-D evaluation wafer using the first risk factor, the first confidence value, the first wafer-verify difference, or the wafer data, or any combination thereof.

In 550, a query can be performed to determine if one or more of the S-D evaluation wafers has been verified. When the one or more S-D evaluation wafers have been verified, procedure 500 can branch to step 565, and when the one or more S-D evaluation wafers have not been verified, procedure 500 can branch to step 555.

When the first total risk factor is less than or equal to a first wafer-verification limit; the first S-D evaluation wafer can be identified as a first verified S-D wafer having the first total risk factor associated therewith, the number of remaining sites can be decreased by one, the number of visited sites can be increased by one, and the first S-D creation procedure associated with the first S-D evaluation wafer can be identified as a first verified S-D procedure.

When the first total risk factor is greater than the first wafer-verification limit, the first site can be identified as a first unverified site having the first risk factor associated therewith, the number of remaining sites can be decreased by one, the number of visited sites can be increased by one, The first verified S-D evaluation wafer can have verified wafer data associated therewith.

In 555, a query can be performed to determine if an additional site is required. When an additional site is required, procedure 500 can branch back to step 540, and when an additional site is not required, procedure 500 can branch to step 555.

When an additional site is required for the current wafer, the following steps can be performed: a) selecting a new site from the number of required sites on the first S-D evaluation wafer, wherein the new site has a new unverified evaluation feature associated therewith that was created using the first S-D creation procedure; b) obtaining new wafer-verification data from the new site on the first S-D evaluation wafer, wherein the new wafer-verification data comprises new S-D measurement and/or new S-D inspection data; c) establishing new verified data for the new site on the on the first S-D evaluation wafer, wherein the new verified data includes new verified measurement and/or inspection data; d) establishing a new confidence value for the new site on the first S-D evaluation wafer using a new wafer-verify difference calculated using the new wafer-verification data and the new verified data; e) establishing a new risk factor for the new site on the first S-D evaluation wafer using the new confidence value, the new wafer-verify difference, the first confidence value, the first wafer-verify difference, or the wafer data, or any combination thereof; f) establishing a new total risk factor for the first S-D evaluation wafer using the new risk factor, the new confidence value, the new wafer-verify difference, the first risk factor, the first confidence value, the first wafer-verify difference, or the wafer data, or any combination thereof; g) identifying the first S-D evaluation wafer as a first verified S-D wafer having the new total risk factor associated therewith, decreasing the number of required sites by one, increasing the number of visited sites by one, and identifying the first S-D creation procedure associated with the first S-D evaluation wafer as a new verified S-D procedure, when the new total risk factor is less than or equal to a new wafer-verification limit; h) identifying the new site as a new unverified site having a new first risk factor associated therewith, decreasing the number of required sites by one, and increasing the number of visited sites by one, when the new total risk factor is greater than the new wafer-verification limit, wherein the first verified wafer has new verified wafer data associated therewith; i) repeating steps a)-h) when the number of required sites is greater than zero; and j) stopping the S-D library creation process when the number of required sites is equal to zero.

Alternatively, other procedures may be used.

In 560, a query can be performed to determine if an additional evaluation wafer is required. When an additional evaluation wafer is required, procedure 500 can branch back to step 535, and when an additional evaluation wafer is not required, procedure 500 can branch to step 565.

When an additional evaluation wafer is required, the following steps can be performed: a1) selecting an additional S-D evaluation wafer; b1) determining a first number of required sites for the additional S-D evaluation wafer; c1) selecting an additional site from the first number of required sites on an additional S-D evaluation wafer, wherein the additional site has an additional unverified evaluation feature associated therewith that was created using the first S-D creation procedure; d1) obtaining additional wafer-verification data from the additional site on the additional S-D evaluation wafer, wherein the additional wafer-verification data includes additional S-D measurement data and/or S-D inspection data; e1) establishing additional verified data for the additional site on the additional S-D evaluation wafer, wherein the additional verified data includes additional verified measurement and/or inspection data; f1) establishing an additional confidence value for the additional site on the additional S-D evaluation wafer using an additional wafer-verify difference calculated using the additional wafer-verification data and the additional verified data; g1) establishing an additional risk factor for the additional site on the additional S-D evaluation wafer using the additional confidence value, the additional wafer-verify difference, the new confidence value, the new wafer-verify difference, the first confidence value, the first wafer-verify difference, or the wafer data, or any combination thereof; h1) establishing an additional total risk factor for the additional S-D evaluation wafer using the additional risk factor, the additional confidence value, the additional wafer-verify difference, the new risk factor, the new confidence value, the new wafer-verify difference, the first risk factor, the first confidence value, the first wafer-verify difference, or the wafer data, or any combination thereof; i1) identifying the additional S-D evaluation wafer as an additional verified S-D wafer having the additional total risk factor associated therewith, decreasing the number of required sites by one, increasing the number of visited sites by one, and storing data associated with the additional site as verified data in the evaluation library, when the additional total risk factor is less than or equal to an additional wafer-verification limit; j1) identifying the additional S-D evaluation wafer as an additional unverified site having an additional first risk factor associated therewith, decreasing the number of required sites by one, and increasing the number of visited sites by one, when the additional total risk factor is greater than the additional wafer-verification limit, wherein the additional verified WAFER has additional verified WAFER data associated therewith; k1) repeating steps a1)-j1) when an additional S-D evaluation wafer is available and the number of required sites on the additional S-D evaluation wafer is greater than zero; and l1) stopping the S-D library creation process when an additional S-D evaluation wafer is NOT available or the number of required sites on the additional S-D evaluation wafer is equal to zero.

In 565, a query can be performed to determine if an additional creation wafer is required. When an additional evaluation wafer is required, procedure 500 can branch back to step 515, and processing can proceed as shown in FIG. 5. When an additional creation wafer is not required, procedure 500 can branch to step 570. Procedure 500 can end in 570.

Exemplary first corrective actions can include determining a first number of delayed S-D wafers using a difference between the first number of S-D evaluation wafers and the first number of available evaluation elements; and storing and/or delaying the first number of delayed S-D wafers for the first period of time using one or more transfer elements in the S-D transfer subsystem, wherein the transfer element includes means for supporting two or more wafers.

Additional corrective actions can include determining a first number of delayed S-D wafers using a difference between the first number of S-D evaluation wafers and the first number of available evaluation elements; determining updated S-D wafer state data for a first delayed S-D evaluation wafer; determining updated operational state data for the one or more S-D evaluation elements in the first evaluation subsystem; determining a first updated transfer sequence for the first delayed S-D evaluation wafer; identifying one or more newly-available S-D evaluation elements using the updated operational state data; transferring the first delayed S-D evaluation wafer to a first newly-available S-D evaluation element in the one or more evaluation subsystems using the first updated transfer sequence when a first newly-available S-D evaluation element is available; and applying a second corrective action when the first newly-available S-D evaluation element is NOT available.

Other corrective action can include stopping the processing, pausing the processing, re-evaluating one or more of the S-D evaluation wafers, re-measuring one or more of the S-D evaluation wafers, re-inspecting one or more of the S-D evaluation wafers, re-working one or more of the S-D evaluation wafers, storing one or more of the S-D evaluation wafers, cleaning one or more of the S-D evaluation wafers, delaying one or more of the S-D evaluation wafers, or stripping one or more of the S-D evaluation wafers, or any combination thereof.

In addition, S-D confidence maps and/or S-D risk assessment maps can be used to verify a wafer.

Figure 6:
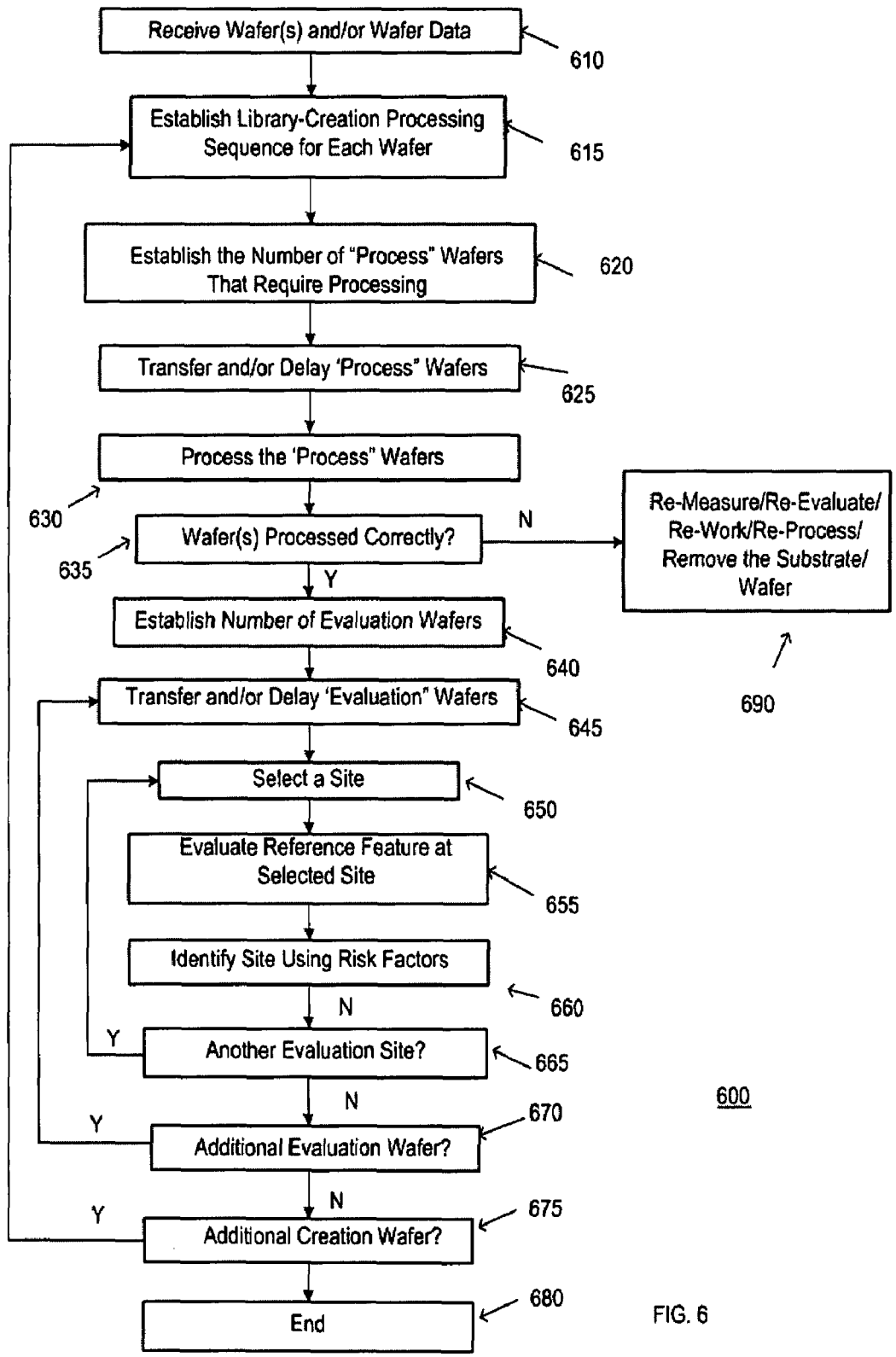
FIG. 6 illustrates an exemplary flow diagram of a method for creating a S-D evaluation library in accordance with embodiments of the invention.

FIG. 6 illustrates an exemplary flow diagram of a method for creating an S-D evaluation library in accordance with embodiments of the invention. A first set of S-D wafers can be received by one or more S-D processing elements in one or more processing subsystems, and the one or more S-D processing elements can be coupled to one or more S-D transfer subsystems. Each wafer can have wafer data associated therewith, and the wafer data includes historical and/or real-time data. Alternatively, a wafer can be received by a different subsystem. Wafer state data can be established for one or more of the wafers, and the wafer state data can include S-D data, chip-dependent data, and/or die-dependent data. In addition, one or more S-D processing sequence can be established for the wafers, and the S-D processing sequences can be established using S-D wafer state data, chip-dependent wafer state data, and/or die-dependent wafer state data.

Wafer state data can be established for each S-D wafer, and the wafer state data includes a number of required creation sites and a number of required evaluation sites for each S-D wafer.

In 610, a library-creation processing sequence can be established for creating a library of S-D evaluation data, and the library-creation processing sequence can be created using the wafer state data. The library-creation processing sequence can include an S-D transfer procedure, an S-D creation procedure, or an S-D evaluation procedure, or any combination thereof.

In 620, the first number of S-D process wafers to be processed can be determined using a first library-creation processing sequence, and a first S-D creation procedure and a first S-D evaluation procedure being can be determined using the first library-creation processing sequence.

First operational states establishing for a plurality of S-D processing elements in the one or more processing subsystems. The first number of available processing elements can be determined using the first operational states for one or more of the S-D processing elements.

A first S-D transfer sequence can be established using the wafer data, the wafer state data, the first number of S-D process wafers, or the first number of available processing elements, or any combination thereof.

In 625, when the first number of S-D process wafers is less than or equal to the first number of available processing elements, The first number of S-D process wafers can be transferred to the first number of available processing elements in the one or more processing subsystems using the first S-D transfer sequence. When the first number of S-D process wafers is greater than the first number of available processing elements, a first corrective action can be applied.

In 630, the first S-D creation procedure can be performed, and one or more library-related reference features can be created at a first number of evaluation sites on each of the S-D process wafers. Updated wafer data and/or updated wafer state data are created using the first S-D creation procedure and the updated wafer state data can include a number of required evaluation sites for each S-D process wafer.

In 635, a query can be performed to determine if the one or more S-D creation procedures were performed correctly. When the one or more S-D creation procedures were performed correctly, procedure 600 can branch to step 640, and when the one or more S-D creation procedures were not performed correctly, procedure 600 can branch to step 690. For example, tool data, chamber data, particle data, image data, and/or fault data may be used.

In 640, the first number of S-D evaluation wafers to be evaluated can be determined using the first S-D evaluation procedure. The number of required evaluation sites can be determined for each S-D evaluation wafer using the updated wafer data, the updated wafer state data, the wafer data, or the wafer state data, or any combination thereof.

The first operational states can be determined for a plurality of S-D evaluation elements in one or more evaluation subsystems, the S-D transfer subsystem being coupled to one or more of the S-D evaluation elements.

The first number of available evaluation elements can be determined using the first operational states for one or more of the S-D evaluation elements. A second S-D transfer sequence can be established using the updated wafer data, the updated wafer state data, the wafer data, the wafer state data, the first number of S-D evaluation wafers, or the first number of available evaluation elements, or any combination thereof.

In 645, when the first number of S-D evaluation wafers is less than or equal to the first number of available evaluation elements, The first number of S-D evaluation wafers can be transferred to the first number of available evaluation elements IN the one or more evaluation subsystems using the second S-D transfer sequence. When the first number of S-D evaluation wafers is greater than the first number of available evaluation elements, a second corrective action can be applied.

In 650, a first site can be selected from the number of required sites on a first S-D evaluation wafer, and the first site can have a first library-related reference (evaluation) feature associated therewith that was created using the first S-D creation procedure.

In 650, an evaluation procedure can be performed. First library-related evaluation data can be obtained from the first site on the first S-D wafer, and the first site has first library-related measurement and/or inspection data associated therewith. First predicted data can be established for the first site on the first S-D wafer, and the first predicted data can include predicted measurement and/or inspection data. A first confidence value can be established for the first site using a first library-related difference calculated using the first library-related evaluation data and the first predicted data. A first risk factor can be established for the first site using the first confidence value, the first library-related difference, or the wafer data, or any combination thereof. A first total risk factor can be established for the first site using the first risk factor, the first confidence value, the first library-related difference, or the wafer data, or any combination thereof.

In 660, when the first total risk factor is less than or equal to a first library-related creation limit, the first site as a first verified site can have the first total risk factor associated therewith, the number of remaining sites can be decreased by one, the number of visited sites can be increased by one, and the data associated with the first site can be stored as verified data in an evaluation library. When the first total risk factor is greater than the first library-related creation limit, the first site can be identified as a first unverified site having a second risk factor associated therewith, the number of remaining sites can be decreased by one, and the number of visited sites can be increased by one. The first verified site can have verified library-related data associated therewith.

In 665, a query can be performed to determine if an additional site is required. When an additional site is required, procedure 600 can branch back to step 650, and when an additional site is not required, procedure 600 can branch to step 670.

When a new site is required for the first wafer, one or more controllers can use the following steps: a) selecting a new site from the number of required sites on the first S-D evaluation wafer, wherein the new site has a new library-related reference feature associated therewith that was created using the first S-D creation procedure; b) obtaining new library-related evaluation data from the new site on the first S-D wafer, wherein the new site has new library-related measurement and/or inspection data associated therewith; c) establishing new predicted data for the new site on the first S-D wafer, wherein the new predicted data comprises new predicted measurement and/or inspection data; d) establishing a new confidence value for the new site using a new library-related difference calculated using the new library-related evaluation data and the new predicted data; e) establishing a new risk factor for the new site using the new confidence value, the new library-related difference, the first confidence value, the first library-related difference, or the wafer data, or any combination thereof; f) establishing a new total risk factor for the new site using the new risk factor, the new confidence value, the new library-related difference, the first risk factor, the first confidence value, the first library-related difference, or the wafer data, or any combination thereof; g) identifying the new site as a new verified site having the new total risk factor associated therewith, decreasing the number of required sites by one, increasing the number of visited sites by one, and storing data associated with the new site as verified data in the evaluation library, when the new total risk factor is less than or equal to a new library-related creation limit; h) identifying the new site as a new unverified site having a new second risk factor associated therewith, decreasing the number of required sites by one, and increasing the number of visited sites by one, when the new total risk factor is greater than the new library-related creation limit, wherein the new verified site has new verified library-related data associated therewith; i) repeating steps a)-h) when the number of required sites is greater than zero; and j) stopping the S-D library creation process when the number of required sites is equal to zero.

In 670, a query can be performed to determine if one or more of the S-D evaluation wafers are required. When the one or more S-D evaluation wafers are required, procedure 600 can branch to step 645, and when the one or more S-D evaluation wafers are not required, procedure 600 can branch to step 675.

When an additional wafer is used, one or more controllers can use the following steps: a1) selecting an additional site from the number of required sites on an additional S-D evaluation wafer, wherein the additional site has an additional library-related reference (evaluation) feature associated therewith that was created using the first S-D creation procedure; b1) obtaining additional library-related evaluation data from the additional site on the additional S-D wafer, wherein the additional site has additional library-related measurement and/or inspection data associated therewith; c1) establishing additional predicted data for the additional site on the additional S-D wafer, wherein the additional predicted data comprises additional predicted measurement and/or inspection data; d1) establishing an additional confidence value for the additional site using an additional library-related difference calculated using the additional library-related evaluation data and the additional predicted data; e1) establishing an additional risk factor for the additional site using the additional confidence value, the additional library-related difference, the new confidence value, the new library-related difference, the first confidence value, the first library-related difference, or the wafer data, or any combination thereof; f1) establishing an additional total risk factor for the additional site using the additional risk factor, the additional confidence value, the additional library-related difference, the new risk factor, the new confidence value, the new library-related difference, the first risk factor, the first confidence value, the first library-related difference, or the wafer data, or any combination thereof; g1) identifying the additional site as an additional verified site having the additional total risk factor associated therewith, decreasing the number of required sites by one, increasing the number of visited sites by one, and storing data associated with the additional site as verified data in the evaluation library, when the additional total risk factor is less than or equal to an additional library-related creation limit; h1) identifying the additional site as an additional unverified site having an additional second risk factor associated therewith, decreasing the number of required sites by one, and increasing the number of visited sites by one, when the additional total risk factor is greater than the additional library-related creation limit, wherein the additional verified site has additional verified library-related data associated therewith; i1) repeating steps a1)-h1) when an additional S-D evaluation wafer is available and the number of required sites on the additional S-D evaluation wafer is greater than zero; and j1) stopping the S-D library creation process when an additional S-D evaluation wafer is NOT available or the number of required sites on the additional S-D evaluation wafer is equal to zero.

In addition, delayed S-D evaluation wafer can be processed and/or evaluated at different times. Data from delayed wafers is used as soon as it is available. For example, data from delayed wafers can be fed forward and or fed back to be used in other procedures.

In 675, a query can be performed to determine if an additional creation wafer is required. When an additional creation wafer is required, procedure 600 can branch back to step 615, and processing can proceed as shown in FIG. 6. When an additional creation wafer is not required, procedure 600 can branch to step 680. Procedure 600 can end in 680.

Figure 7:
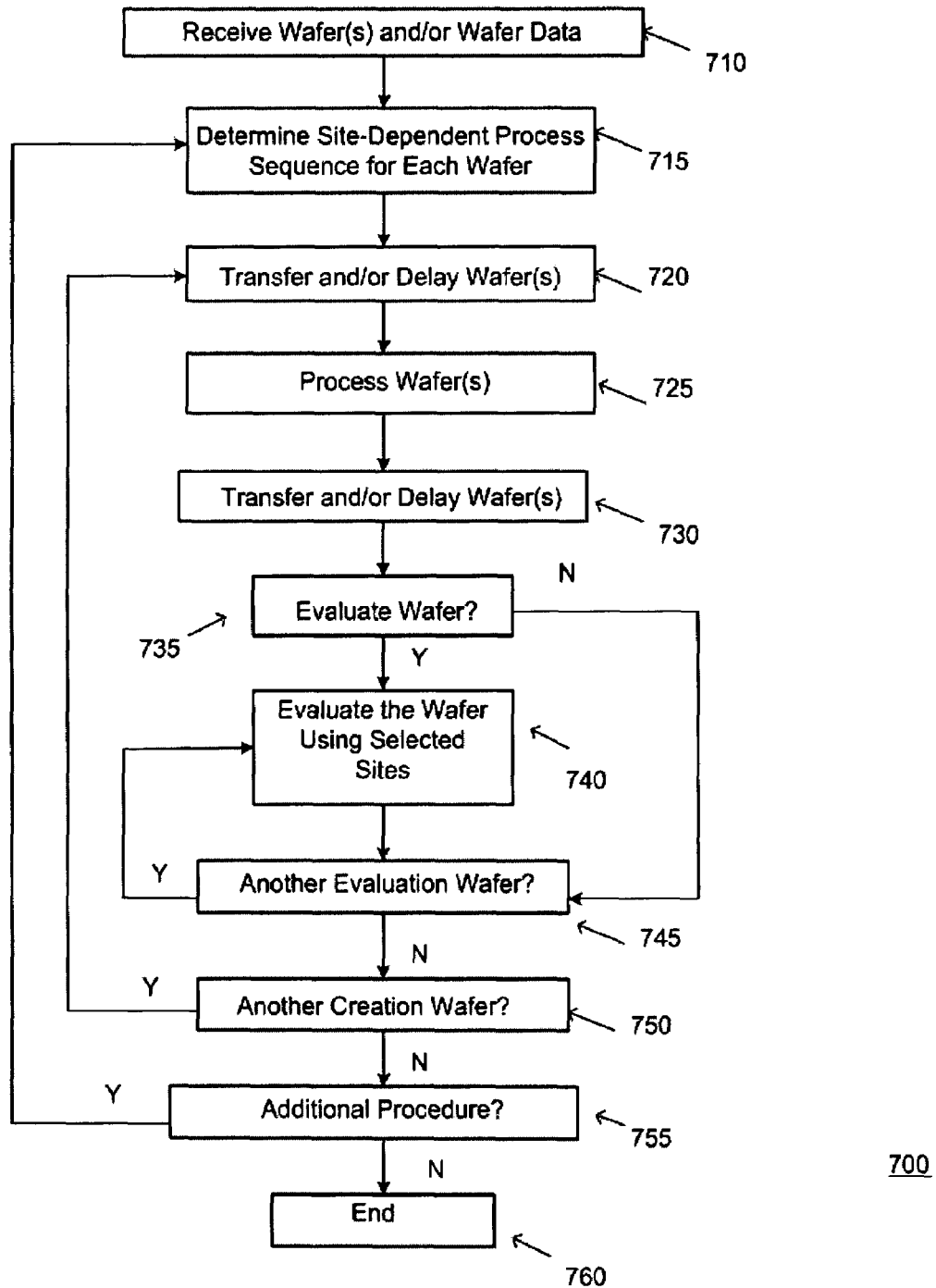
FIG. 7 illustrates an exemplary flow diagram of a method for creating a Dual Damascene structure on a wafer using S-D procedures.

FIG. 7 illustrates an exemplary flow diagram of a method for creating a Dual Damascene structure on a wafer using S-D procedures.

In 710, one or more wafers can be received by an S-D transfer subsystem, and wafer data can be received for the one or more wafers. Alternatively, a wafer can be received by a different subsystem. The wafer data can include historical and/or real-time data. Wafer state data can be established for one or more of the wafers, and the wafer state data can include S-D data, chip-dependent data, and/or die-dependent data. In addition, one or more S-D processing sequence can be established for the wafers, and the S-D processing sequences can be established using S-D wafer state data, chip-dependent wafer state data, and/or die-dependent wafer state data.

In a first exemplary embodiment, referring back to FIG. 1, an S-D wafer can be received by one of the S-D transfer subsystems (101, 102) that can be coupled to the first lithography subsystem 110. One or more controllers (114, 119, 124, 129, 134, 139, 144, 149, 154, 159, and 195) can receive data. In some embodiments, when a wafer is received, the data associated with the wafer and/or lot can be received, and the data can include S-D and/or non-S-D data and/or messages. For example, the data can include S-D maps, such as confidence maps, process maps, risk assessment maps, damage-assessment maps, reference maps, measurement maps, prediction maps, confidence maps, imaging maps, library-related maps, and/or other wafer-related maps for the in-coming S-D wafer and/or in-coming lot. The data can include data and/or messages from one or more subsystems associated with the processing system, a host system, and/or another processing system. For example, S-D messages and/or data can be used to determine and/or control the processing sequence and/or the transferring sequences.

The data can be processed to obtain wafer data that can include historical and/or real-time data. S-D wafer data can also be determined for each wafer, and the S-D wafer data can include S-D wafer state data and S-D confidence data When additional S-D wafers require processing, the additional S-D wafers can be transferred to additional S-D processing elements in one or more processing subsystems using a S-D transfer subsystem coupled to the one or more processing subsystem when the first S-D processing element is available, and the an additional S-D wafer can be delayed using the S-D transfer subsystem coupled to the one or more processing subsystems when the first S-D processing element is not available. Transfer elements in the S-D transfer subsystem can be used to store and/or delay wafers for a period of time.

In 715, one or more S-D processing sequence can be established for each S-D wafer using the wafer data. Wafer data and/or S-D wafer state data can be used before and/or when a wafer is received to establish an S-D processing sequence for each S-D wafer. In addition, a first processing subsystem can be identified for each wafer using the first S-D processing sequence and/or the S-D wafer data. In one example, a first processing sequence can be established for creating a number of etched features in one or more layer on the wafer.

In the first exemplary embodiment, an S-D Dual Damascene (DD) processing sequence can be established, the S-D DD processing sequence can include a first damascene creation procedure, a first damascene evaluation procedure, a second damascene creation procedure, and a second damascene evaluation procedure. A first set of S-D processing wafers can be established, and the S-D wafer data can be used to establish the first set of S-D processing wafers. A first set of S-D processing wafers can be processed using the first damascene creation procedure.

In 720, un-processed S-D wafers can either be transferred and/or delayed. A first S-D procedure can be determined for a first un-processed S-D wafer, and the first S-D procedure can include one or more process-related procedures. When the first S-D processing element is available, a first un-processed S-D wafer can be transferred to the first S-D processing element in a first processing subsystem using an S-D transfer subsystem coupled to the first processing subsystem. When the first S-D processing element is not available, the first un-processed S-D wafer can be delayed using the S-D transfer subsystem coupled to the first processing subsystem.

In the first exemplary embodiment, an S-D transfer sequence can be established the first set of S-D processing wafers. Real-time operational states can be established for one or more of the first S-D processing elements (112) in the first lithography subsystem (110). Operational states can change as wafers are transferred into and out of the S-D processing elements. Real-time transfer sequences can be established and used to transfer wafers into and out of the first S-D processing elements (110) in the lithography-related subsystem. In addition, internal transfer device 113 can also be used. An S-D transfer sequence can be established the first set of S-D processing wafers. Real-time operational states can be established for one or more of the first S-D processing elements (112) in the first lithography subsystem (110). Operational states can change as wafers are transferred into and out of the S-D processing elements. Real-time transfer sequences can be established and can change with time. When a first number of first S-D processing elements are available, a first number of the first set of S-D processing wafers can be transferred to the first number of the first S-D processing elements (112) in the first lithography subsystem (110) using the S-D transfer subsystem. When first S-D processing elements are not available for the other S-D wafers in the first set of S-D processing wafers, the other S-D wafers in the first set of S-D processing wafers can be delayed for a first amount of time using the S-D transfer subsystem. When the first set of S-D processing wafers are transferred, a first S-D transfer sequence can be used. For example, the other S-D wafers in the first set of S-D processing wafers can be delayed for the first amount of time using one or more transfer elements in the S-D transfer subsystem. A transfer element can be configured to support two or more wafers. The other S-D wafers in the first set of S-D processing wafers can be processed after the first period of time. When an S-D wafer is delayed, a new S-D transfer sequence can be established.

When a delayed un-processed S-D wafer has been identified, updated wafer state data can be determined for the delayed un-processed S-D wafer. After a first delay period, updated operational state data can be determined for the one or more S-D processing elements in the one or more processing subsystems, and one or more newly-available S-D processing elements can be identified using the updated operational state data. When a newly-available S-D processing element is available, a delayed un-processed S-D wafer can be transferred to the first newly-available S-D processing element in the one or more processing subsystems using an S-D transfer subsystem coupled to the one or more processing subsystems. When the first S-D processing element is not available, the first delayed un-processed S-D wafer can be delayed for a second period of time using one or more S-D transfer subsystems coupled to the processing subsystems. A delayed un-processed S-D wafer can be post-processed after being delayed for the second period of time, and the post-processing can include stopping the processing, pausing the processing, re-evaluating one or more wafers, re-measuring one or more wafers, re-inspecting one or more wafers, re-working one or more wafers, storing one or more wafers, cleaning one or more wafers, or stripping one or more wafers, or any combination thereof.

One or more of the S-D wafers can be transferred to one or more S-D processing elements in one or more processing subsystems identified by an S-D processing sequence for the wafer. In addition, one or more of the S-D wafers can be transferred using S-D transfer sequences.

In 725, one or more of the S-D wafers can be processed in one or more S-D processing elements in the one or more processing subsystems. A first S-D procedure can be used to process a first un-processed S-D wafer, and the first S-D procedure can include one or more process-related procedures. In alternate embodiments, one or more of the wafers can be processed in non-S-D subsystem. For example, a first procedure in the S-D processing sequence can be performed in the first processing subsystem, and an additional procedure in the S-D processing sequence can be performed in an additional subsystem.

When the first S-D verification procedure is performed, a first set of unverified S-D verification features can be created on the first verification wafer, and the first set of unverified S-D verification features can include a first unverified verification feature at a first site on the first verification wafer.

When an additional unprocessed S-D wafer has been identified, it can be processed using the first S-D procedure. An additional first set of unverified S-D verification features can be created on the additional verification wafer, and the additional first set of unverified S-D verification features can include a first unverified verification feature at a first site on each additional verification wafer.

When a delayed unprocessed S-D wafer has been identified, it can be processed using the first S-D procedure at a later time. An additional first set of unverified S-D verification features can be created on a delayed verification wafer, and the additional first set of unverified S-D verification features can include a first unverified verification feature at a first site on each delayed verification wafer. Alternatively, another unverified S-D procedure can be performed using the additional unprocessed wafer.

Continuing with the first exemplary embodiment, the first creation procedure can be performed when the first damascene layer is being produced, and the second creation procedure can be performed when the second damascene layer is being produced. During the first creation procedure, a first number of the first set of S-D processing wafers can be processed using the first damascene creation procedure, and a first set of processed wafers can be established. The first damascene creation procedure can be used to create a first set of S-D damascene features on the first number of the first set of S-D wafers, and the first set of S-b DAMASCENE features can include one or more verification feature at one or more sites on each of the first set of S-D processing wafers. During the second creation procedure, a first number of a second set of S-D processing wafers can be processed using the second damascene creation procedure, and a second set of processed wafers can be established. The second damascene creation procedure can be used to create a second set of S-D damascene features on the first number of the second set of S-D wafers, and the second set of S-D damascene features can include one or more second verification feature at one or more sites on each of the second set of S-D processing wafers. During and/or after the first creation procedure, a first set of S-D evaluation wafers can be established, and the first set of S-D evaluation wafers can include one or more of the first set of processed wafers. In addition, during and/or after the first creation procedure, a first set of S-D evaluation wafers can be established, and the first set of S-D evaluation wafers can include one or more of the first set of processed wafers.

In 730, one or more of the processed S-D wafers can either be transferred and/or delayed. In various embodiments, processed S-D wafers can be site-verification, procedure-verification, wafer-verification, feature-verification, image-verification, library-verification, or process-verification wafers, or any combination thereof. A processed S-D wafer can be transferred to a S-D evaluation element in one or more evaluation subsystems using a S-D transfer subsystem coupled to the one or more evaluation subsystems when the S-D evaluation element is available, and the processed S-D wafer can be delayed using the S-D transfer subsystem coupled to the one or more evaluation subsystems when a S-D evaluation element is not available.

When a delayed S-D processed wafer has been identified, updated wafer data can be determined for the delayed processed wafer. After a first delay period, updated operational state data can be determined for the one or more S-D evaluation elements in the first evaluation subsystem, and one or more newly-available S-D evaluation elements can be identified using the updated operational state data. When a newly-available S-D evaluation element is available, a delayed, processed, S-D wafer can be transferred to the first newly-available S-D evaluation element in the one or more evaluation subsystems using an S-D transfer subsystem coupled to the one or more evaluation subsystems. When the first S-D evaluation element is not available, the first delayed, processed, S-D wafer can be delayed for a second period of time using one or more S-D transfer subsystems coupled to the first processing subsystem. A delayed processed S-D wafer can be post-processed after being delayed for the second period of time, and the post-processing can include stopping the processing, pausing the processing, re-evaluating one or more wafers, re-measuring one or more wafers, re-inspecting one or more wafers, re-working one or more wafers, storing one or more wafers, cleaning one or more wafers, or stripping one or more wafers, or any combination thereof. One or more wafers can be delayed for the one or more periods of time using a transfer element in the S-D transfer subsystem, and the transfer element can include means for supporting two or more wafers.

Continuing further with the first exemplary embodiment, a second S-D transfer sequence can be established can be established for each of the S-D wafers in the first set of evaluation wafers. Real-time operational states can be established for one or more of the first S-D evaluation elements (152) in the evaluation subsystem (150). Operational states can change as wafers are transferred into and out of the S-D evaluation elements (152). Real-time transfer sequences can be established and used to transfer wafers into and out of the first S-D evaluation elements (152) in the evaluation subsystem (150). Alternatively, the S-D evaluation elements (137) in the inspection subsystem (135) can be used. When a first number of first S-D evaluation elements are available, a first number of the first set of S-D evaluation wafers can be transferred to the first number of the first set of S-D evaluation elements (152) in the evaluation subsystem (150) using the S-D transfer subsystem (101, 102). When first S-D evaluation elements are not available for the other S-D wafers in the first set of S-D evaluation wafers, the other S-D wafers in the first set of S-D evaluation wafers can be delayed for a second amount of time using the S-D transfer subsystem (101, 102). For example, the other S-D wafers in the first set of S-D evaluation wafers can be delayed for the second amount of time using one or more transfer elements (104) in the S-D transfer subsystem (101, 102). A transfer element (104) can be configured to support two or more wafers. The other S-D wafers in the first set of S-D evaluation wafers can be evaluated after the second period of time. A similar set of steps can be used when the S-D wafers for the second damascene layer require transferring. For example, a third and fourth transfer sequence can be used.

In 735, a query can be performed to determine if the wafer requires evaluation. When the wafer requires evaluation, procedure 700 can branch to 740, and when the wafer does not require evaluation, procedure 700 can branch to 745.

In 740, one or more sites can be selected on one or more of the S-D wafers. In various embodiments, the site can used in S-D procedures that can include site-verification procedures, feature-verification procedures, image-verification procedures, library-verification procedures, or process-verification procedures, or any combination thereof. A site can be selected from the number of remaining sites on the S-D wafer, and the site can have an unverified or verified feature associated therewith.

In 745, one or more of the processed S-D wafers can be evaluated using data from one or more selected sites. For example, the first site can be the most important site, and some verification decisions can be made using just the first site. Confidence data and/or risk assessment data can be used in the evaluation procedure. For example, one or more confidence values can be established for the selected sites using differences between the unverified data and the verification data, and one or more updated risk factors can be established for the S-D procedure.

In addition, updated confidence values can be established using additional confidence data from additional sites on one or more of the wafers, and total risk factors can be established and updated using additional confidence data from additional sites on one or more of the wafers. Other risk assessment data can also be used. In other cases, the verification decisions can be made using confidence values and/or risk factors from one or more sites on one or more wafers. Confidence values can be determined for unprocessed wafers, processed wafers, or delayed wafers, or any combination thereof.

Continuing still further with the first exemplary embodiment, the first evaluation procedure can be performed when the first damascene layer is being evaluated, and the second evaluation procedure can be performed when the second damascene layer is being evaluated. During the first evaluation procedure, one or more S-D first evaluation procedures can be performed. The first number of the first set of S-D evaluation wafers can be evaluated using the first damascene evaluation procedure, and a first set of verified wafers can be established. The first damascene evaluation procedure can be used to evaluate the first set of S-D damascene features created on the first set of S-D evaluation wafers, and the first set of S-D damascene features can include one or more verification feature at one or more sites on each of the first set of S-D evaluation wafers. During the second evaluation procedure, one or more S-D second evaluation procedures can be performed. A first number of the second set of S-D evaluation wafers can be evaluated using the second damascene evaluation procedure, and a second set of verified wafers can be established. The second damascene evaluation procedure can be used to evaluate the second set of S-D damascene features created on the second set of S-D evaluation wafers, and the second set of S-D damascene features can include one or more second verification feature at one or more sites on each of the second set of S-D evaluation wafers.

During and/or after the first evaluation procedure, a second set of S-D processing can be established, and the second set of S-D processing can include one or more of the first set of verified wafers.

In 745, a query can be performed to determine when additional S-D evaluation wafers are required. When an additional S-D evaluation wafer requires processing, procedure 700 can branch to 740, and when the additional evaluation wafer is not required, procedure 700 can branch to 750.

In 750, a query can be performed to determine when additional S-D creation wafers are required. When an additional S-D creation wafer requires processing, procedure 700 can branch to 720, and when additional creation wafer is not required, procedure 700 can branch to 755. In addition, additional verification data can be obtained from one or more sites on one or more additional S-D wafers. Additional confidence values can be established for the additional sites on additional S-D wafers. Additional risk factor can also be established using the additional confidence data. Furthermore, when verifying a S-D procedure, the data from delayed S-D wafers that were processed at a later time can be evaluated In 755, a query can be performed to determine when additional S-D and/or non-S-D procedures are required. When additional S-D and/or non-S-D procedures are required, procedure 700 can branch to 715, and when additional S-D and/or non-S-D procedures are not required, procedure 700 can branch to 760. Procedure 700 can end in 760.

In some multi-step examples, the lithography-related and/or scanner-related processing elements can perform mask layer deposition procedures, mask layer exposure procedures, and/or development procedures that can be S-D and/or non-S-D, and the S-D evaluation elements can be used to verify mask layer deposition procedures, mask layer exposure procedures, and/or development procedures that can be S-D and/or non-S-D. In addition, one or more layers can be etched using etch-related processing elements and the etched features can evaluated using one or more S-D evaluation elements In other multi-step examples, Dual Damascene procedure can be performed on one or more wafers. During a Dual Damascene procedure, a first damascene process can be performed followed by a second damascene process. In some embodiments, a Via First Trench Last (VFTL) procedure can be performed. In other embodiments, a Trench First Via Last (TFVL) procedure can be performed. S-D measurement, inspection, verification, and/or evaluation procedures can be performed before, during, and/or after a damascene process. Alternatively, one or more non-S-D procedures may be required. For example, etched features on a first patterned damascene layer can be measured after a "via first" or a "trench first" etching procedure is performed. One or more S-D data collection (DC) plans and/or S-D mapping applications can be used. Alternatively, different procedures may be used.

S-D wafer thickness data and/or wafer temperature data can be used during lithography procedures to create S-D mask (photoresist) data, to create S-D mask post-immersion cleaning and/or drying data, and to create S-D mask developing and/or baking data. In addition, S-D wafer thickness data and/or wafer temperature data can be used by the etching subsystem 140 to create S-D etching and/or ashing data. For example, the data can include etching chemistry data, etching time data, processing gas ratio data, an expected endpoint time, heater power data, and/or RF power data. In addition, S-D wafer thickness data and/or wafer temperature data can be used by the thermal processing subsystem 130 to create S-D heating and/or cooling data. The S-D wafer thickness data and/or wafer temperature data can be used by the inspection subsystem 135 to create S-D inspection, verification, and/or examination data. In other examples, S-D wafer thickness data and/or wafer temperature data can be used by the rework subsystem 155 to create S-D reworking procedures.

Figure 8:
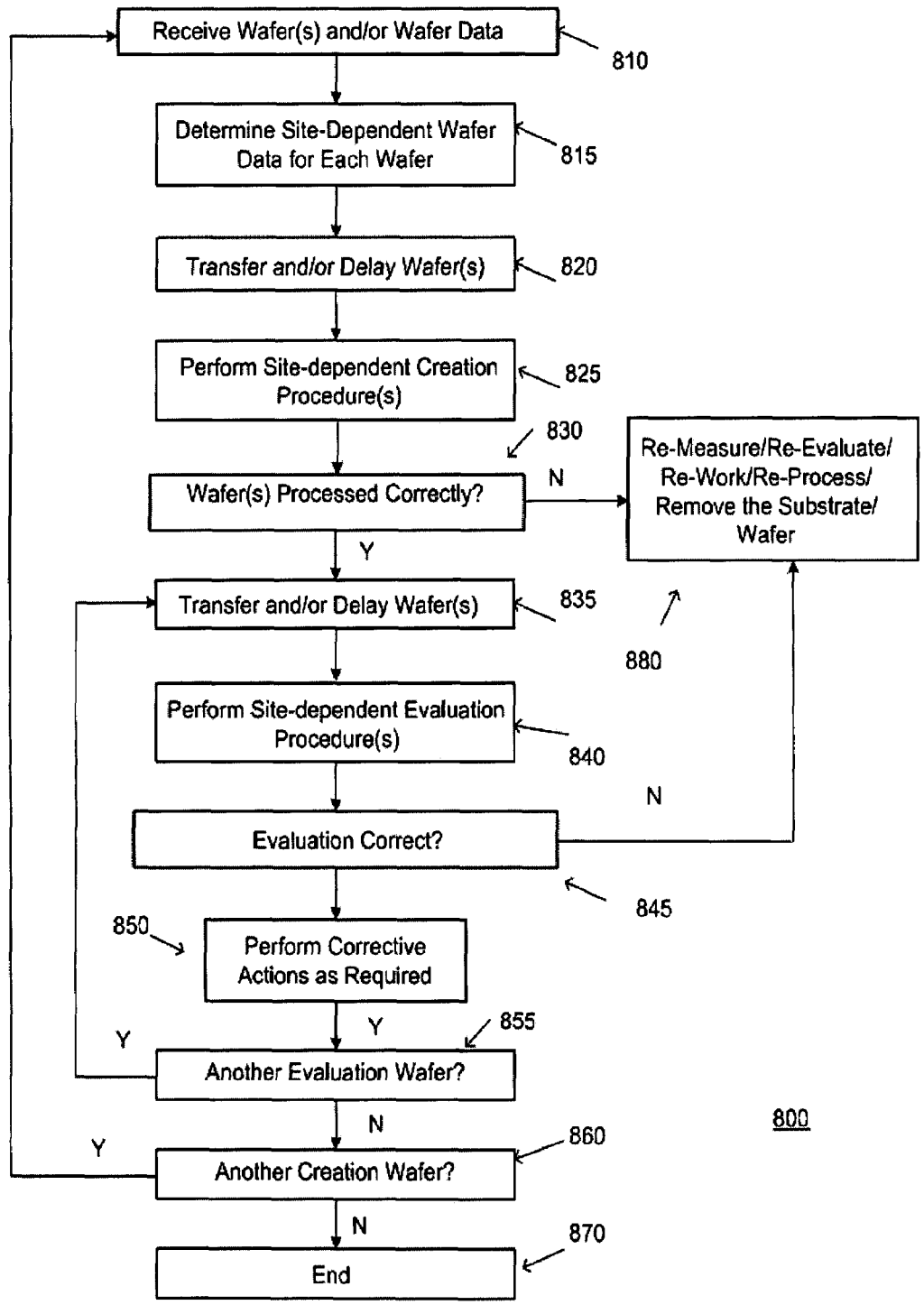
FIG. 8 illustrates another exemplary flow diagram for creating a S-D evaluation library.

FIG. 8 illustrates another exemplary flow diagram for creating an S-D evaluation library. In the illustrated procedure 800, a number of steps are shown. Alternatively, a different number of steps and different sequences may be used.

In 810, one or more S-D wafers can be received using one or more S-D transfer systems. Alternatively, one or more non-S-D wafers may also be received. In addition, wafer data can be received for the one or more wafers. The wafer data can include historical and/or real-time data. Alternatively, wafers can be received by different subsystems.

In 815, S-D wafer data and/or non-S-D wafer data can be determined for the one or more wafers can be received using one or more S-D transfer system. The wafer data can be used to establish sets of S-D and non-S-D wafers. In various examples, the S-D wafer data associated with an S-D wafer can be S-D, chip-dependent, product-dependent, location-dependent, layer dependent, wafer-dependent, or die-dependent, or any combination thereof. In addition, one or more S-D processing sequence can be established for the wafers, and the S-D processing sequences can be established using S-D wafer state data, chip-dependent wafer state data, and/or die-dependent wafer state data.

In 820, one or more S-D wafers can be transferred to one or more S-D processing elements using the S-D transfer system.

In 825, one or more processed S-D wafer can be created. A processed S-D wafer can have one or more S-D library-related features thereon that were created at one or more sites using one or more S-D creation procedures.

In 830, a query can be performed to determine if the one or more S-D creation procedures were performed correctly. When the one or more S-D creation procedures were performed correctly, procedure 800 can branch to step 835, and when the one or more S-D creation procedures were not performed correctly, procedure 800 can branch to step 880. For example, tool data, chamber data, and/or fault data may be used.

One or more sets of S-D evaluation wafers can be established using one or more sets of processed S-D wafers.

In 835, one or more sets of S-D evaluation wafers can be transferred to one or more S-D evaluation elements using the S-D transfer system. In addition, one or more other sets of S-D evaluation wafers can be delayed and/or stored using the S-D transfer system.

In 840, one or more S-D evaluation procedures can be performed using one or more of the S-D evaluation wafers that were transferred to the one or more S-D evaluation elements. In addition, one or more S-D evaluation procedures can be performed using one or more of the S-D evaluation wafers that were delayed and then transferred to the one or more S-D evaluation elements when they become available.

During some evaluation procedures, first confidence data can be established for a first S-D evaluation wafer by evaluating an S-D library-related feature at a first site on first S-D evaluation wafer. The first confidence data for first S-D evaluation wafer can be compared to one or more first confidence limits, and different levels of confidence can be associated with different confidence limits.

When a first confidence limit is met, the first library-related reference feature can be identified as a high confidence feature having a first level of confidence associated therewith, the first S-D evaluation wafer can be identified as a high confidence wafer having the first level of confidence associated therewith, and the first library-related evaluation data associated with the high confidence feature and the first S-D evaluation wafer can be stored in a S-D evaluation library. The high confidence feature and the S-D evaluation wafer can have one or more levels of confidence associated with them.

In 845, a query can be performed to determine if the one or more S-D evaluation procedures were performed correctly. When the one or more S-D evaluation procedures were performed correctly, procedure 800 can branch to step 850, and when the one or more S-D evaluation procedures were not performed correctly, procedure 800 can branch to step 880. For example, tool data, chamber data, and/or fault data may be used.

In 850, one or more corrective actions can be performed when one or more confidence limits are NOT met.

In 855, a query can be performed to determine if an additional evaluation wafer requires evaluation. When an additional evaluation wafer requires evaluation, procedure 800 can branch to step 835, and when an additional evaluation wafer does not require evaluation, procedure 800 can branch to step 860.

In 860, a query can be performed to determine if an additional creation wafer is available for further processing. When an additional creation wafer is available, procedure 800 can branch to step 810, and when an additional creation wafer is available, procedure 800 can branch to step 870. Procedure 800 can end in 870.

In some examples, applying corrective action can include the following steps: a) determining a maximum number of evaluation sites on the first S-D evaluation wafer; b) determining a minimum number of evaluation sites on the first S-D evaluation wafer; c) creating a first confidence map for the first S-D evaluation wafer; d) determining a required number of evaluation sites on the first S-D evaluation wafer; e) selecting a new site on the first S-D evaluation wafer; f) establishing new confidence data for the first S-D evaluation wafer using a new S-D evaluation procedure, wherein a S-D library-related feature at the new site on first S-D wafer is evaluated; g) adding the new site to the first confidence map for the first S-D evaluation wafer; h) comparing the new confidence data to new first confidence limits for the first S-D evaluation wafer; i) identifying the S-D library-related feature at the new site on the first S-D evaluation wafer as a new high confidence feature having a new first level of confidence associated therewith, identifying the first S-D evaluation wafer as a high confidence wafer having the new first level of confidence associated therewith; and storing the first library-related evaluation data associated with the new high confidence feature and the first S-D evaluation wafer in a S-D evaluation library when a new first confidence limit is met; j) identifying the S-D library-related feature at the new site on the first S-D evaluation wafer as a new unverified feature having the new confidence data associated therewith, decreasing the number of required sites by one, and increasing the number of visited sites by one, when the new first confidence limit is NOT met; k) repeating steps e)-j) when the number of required sites on the first S-D evaluation wafer is greater than zero; and l) stopping the evaluation of the first S-D evaluation wafer when the number of required sites on the first S-D evaluation wafer is equal to zero.

In other examples, applying corrective action can include the following steps: a1) receiving an additional S-D wafer using the S-D transfer system; b1) transferring the additional S-D wafer to an additional first S-D processing element using the S-D transfer system; c1) creating one or more additional processed S-D wafers, wherein one or more S-D library-related features are created at one or more sites on each additional S-D processed wafer using the first S-D creation procedure; d1) determining an additional S-D evaluation wafer using the additional processed S-D wafers; e1) transferring the additional S-D wafer to an additional first S-D evaluation element using the S-D transfer system; f1) establishing additional first confidence data for the additional S-D evaluation wafer using an additional first S-D evaluation procedure, wherein a S-D library-related feature at a first site on the additional S-D evaluation wafer is evaluated; g1) comparing the additional first confidence data to additional first confidence limits for the additional S-D wafer; h1) identifying the S-D library-related feature at the first site on the additional S-D evaluation wafer as an additional high confidence feature having an additional first level of confidence associated therewith, identifying the additional S-D evaluation wafer as a high confidence wafer having the new first level of confidence associated therewith; and storing the additional library-related evaluation data associated with the additional high confidence feature and the additional S-D evaluation wafer in the S-D evaluation library when an additional first confidence limit is met; and i1) applying a second corrective action when the additional first confidence limit is NOT met.

In addition, applying second corrective action can include the following steps: a2) determining a maximum number of evaluation sites on the additional S-D evaluation wafer; b2) determining a minimum number of evaluation sites on the additional S-D evaluation wafer; c2) creating a first confidence map for the additional S-D evaluation wafer; d2) determining a required number of evaluation sites on the additional S-D evaluation wafer; e2) selecting a new site on the additional S-D evaluation wafer; f2) establishing new additional confidence data for the additional S-D evaluation wafer using an additional new S-D evaluation procedure, wherein a S-D library-related feature at the new site on the additional S-D wafer is evaluated; g2) adding the new site to the first confidence map for the additional S-D evaluation wafer; h2) comparing the new additional confidence data to new first confidence limits for the additional S-D evaluation wafer; i2) identifying the S-D library-related feature at the new site on the additional S-D evaluation wafer as an additional new high confidence feature having an additional new first level of confidence associated therewith, identifying the first S-D evaluation wafer as a high confidence wafer having the additional new first level of confidence associated therewith; and storing the new additional library-related evaluation data associated with the additional new high confidence feature and the additional S-D evaluation wafer in the S-D evaluation library when an additional new first confidence limit is met; j2) identifying the S-D library-related feature at the new site on the additional S-D evaluation wafer as an additional new unverified feature having the new confidence data associated therewith, decreasing the number of required sites by one, and increasing the number of visited sites by one, when the additional new first confidence limit is NOT met; k2) repeating steps e2)-j2) when the number of required sites on the additional S-D evaluation wafer is greater than zero; and l2) stopping the evaluation of the additional S-D evaluation wafer when the number of required sites is equal to zero.

In some examples, the first site can be one of the most important sites and decisions can be made based on the results from first site data from one or more S-D wafers.

Data from S-D and/or non-S-D procedures can be used to change a measurement, inspection, verification, and/or evaluation process and to determine when to establish a new measurement, inspection, verification, and/or evaluation site. In addition, when the confidence values are low in one or more areas of the wafer, or when an error has occurred, one or more new sites can be established. Furthermore, when the values on a confidence map are consistently high for a particular process and/or when accuracy values are consistently within acceptable limits for a particular process, a new measurement, inspection, verification, and/or evaluation plan may be establish that uses a smaller number of sites and that can decrease the throughput time for each wafer.

In some cases, data for an entire wafer can be calculated during an S-D procedure. Alternatively, data may be calculated and/or predicted for a portion of the wafer. For example, a portion may include one or more radial areas and/or quadrants. An error condition can be declared when one or more of the measured values and/or calculated/predicted values are outside an accuracy limit established for the wafer. Some errors can be eliminated by using an S-D accuracy improvement procedure. Other errors can be resolved by a subsystem and/or controller.

Some portions of the wafer may have products having different confidence values and S-D processing can be used to obtain the maximum amount of product from an S-D wafer at many different stages in the product development cycle.

Tolerance values and/or limits can be associated with the process results and/or other maps can be used to identify allowable variations in one or more processes. In addition, process results and/or other maps can be used to establish confidence data and/or risk factors for one or more processes in a process sequence. For example, process results and/or other maps may vary in response to chamber cleaning procedures, and S-D procedures can be used to improve and/or eliminate the "first wafer" problems that can occur after a chamber cleaning.

In some embodiment, the S-D data can include layer fabrication information and the layer fabrication information can be different for different layers. New S-D layer data can be obtained during an S-D procedure and can be used to update and/or optimize process recipes, can be used to update and/or optimize process models, and can be used to update and/or optimize profile data. In addition, the S-D procedure can send the new S-D layer data to the controllers in other subsystems and/or the factory system. For example, the new S-D data can include new wafer thickness data and/or uniformity data.

The S-D procedures can utilize context information such as site ID, chip ID, die ID, product ID, subsystem ID, time, wafer ID, slot ID, lot ID, recipe, and/or patterned structure ID as a means for organizing and indexing wafer data.

In addition, S-D modeling procedures can create, refine, and/or use a wafer model, an accuracy model, a recipe model, an optical properties model, a structure model, a FDC model, a prediction model, a confidence model, a measurement model, an etching model, a deposition model, a first wafer effect model, a chamber model, a tool model, a drift model, a delay time model, an electrical performance model, or a device model, or any combination thereof.

The S-D procedures can also use historical data, wafer data, accuracy data, process data, optical properties data, structure data, FDC data, prediction data, confidence data, measurement data, etching data, chamber data, tool data, drift data, electrical performance data, or device data, or any combination thereof.

The S-D parameters can include S-D layer information. S-D thickness data may be provided after a lithography process, and S-D procedures can be used for communicating this information to the scanner subsystem. In addition, thickness data may be provided after a deposition process, and S-D procedures can be used for communicating this information to the other subsystems. By feed forwarding S-D wafer data in real-time to a measurement and/or processing subsystem, improved wafer processing can be provided. Material variations and/or process variations that affect the layer thicknesses can change from site-to-site, from wafer to wafer, and from lot to lot. Thickness variation can be due to a deposition process not being uniform across the wafer, and this can include chamber-to-chamber variations and chamber drift in processing over time. Thickness variations can cause optical property variations and/or thermal variations to occur. S-D procedures can be used to reduce and/or eliminate these variations.

System and/or subsystem data can comprise non-S-D and/or S-D data that can include set-up data, configuration data, historical data, input data, output data, priority data, delay data, fault data, response data, error data, feed-forward data, feedback data, pass-through data, internal data, external data, optimization data, status data, timing data, process results data, and/or measured data.

In some embodiments, the S-D wafer data and/or wafer data can include bottom CD data, middle CD data, top CD data, or angle data, or any combination thereof. For example, a subsystem can comprise an etching tool, and the etching tool can use the S-D new wafer and/or process state data to determine an etching time to use when etching a deep trench on the wafer, to determine an etching time to use when etching a dual damascene structure on the wafer, to determine an etching time to use when etching a gate structure on the wafer. In addition, the real-time processing data can include a calculated CD, a calculated depth, and/or a calculated sidewall angle.

An S-D control application can be used to prevent wafers from being transferred to a processing element until the processing element is ready to accept the wafer. The S-D control application can also be used to prevent the S-D messages and/or data from being sent until the recipient is ready to use the S-D messages and/or data. S-D control application can use delay time variables to delay wafers, calculations, processes, and/or measurements. For example, delay times can be used to prevent S-D data from arriving before it can be used by calculations, processes, and/or measurements for a wafer. Delay times can be determined by using wafer data, sequencing data, control data, and/or historical data. Delay time variables can be used by one or more of the controllers (114, 119, 124, 129, 134, 139, 144, 149, 154, and 159).

In addition, when judgment and/or intervention rules are associated with S-D procedures, they can be executed. Intervention and/or judgment rule evaluation procedures and/or limits can be performed based on historical procedures, on the customer's experience, or process knowledge, or obtained from a host computer. Rules can be used in S-D FDC procedures to determine how to respond to alarm conditions, error conditions, fault conditions, and/or warning conditions. The FDC S-D procedures can prioritize and/or classify faults, predict system performance, predict preventative maintenance schedules, decrease maintenance downtime, and extend the service life of consumable parts in the system.

The subsystem can take various actions in response to an alarm/fault, depending on the nature of the alarm/fault. The actions taken on the alarm/fault can be context-based, and the context can be S-D and can be specified by a rule, a system/process recipe, a chamber type, identification number, load port number, cassette number, lot number, control job ID, process job ID, slot number and/or the type of data.

One or more S-D simulation applications can be used to compute predicted data for the wafer based on the input state, the process characteristics, and a process model. S-D metrology models can be used to predict and/or calculate the smaller structures and/or features associated with the design nodes below 65 nm. For example, prediction models can include process chemistry models, chamber models, EM models, SPC charts, PLS models, PCA models, FDC models, and Multivariate Analysis (MVA) models.

As the physical dimensions of the structures decrease, real-time, S-D processing may be required for a large percentage of the wafers to obtain data that are more accurate. In addition, some wafers may be used to verify a new S-D process and/or to assess an existing S-D process. When a new S-D process is being developed and/or verified, the process results can be varying, and an assessment or verification procedure can be performed on a larger percentage of the wafers. When an assessment or verification procedure is performed, an S-D procedure can be used.

An S-D processing sequence can be executed and used to establish when and how to use the evaluation sites. An S-D processing sequence can be specified by a semiconductor manufacturer based on data stored in a historical database. For example, a semiconductor manufacturer may have historically chosen a number of sites on the wafer when making SEM measurements and would like to correlate the evaluation data to the data measured using a SEM tool, TEM tool and/or FIB tool. In addition, the number of evaluation sites used can be reduced as the manufacturer becomes more confident that the process is and will continue to produce high quality products and/or devices.

An evaluation/inspection/measurement procedure can be time consuming and can affect the throughput of a processing system. During process runs, a manufacturer may wish to minimize the amount of time used to create and evaluate a wafer. The S-D procedures can be context driven and different S-D procedures may be performed based on the context of the wafer. For example, one or more wafers may not be measured and/or inspected, and S-D procedures may be performed using a subset of evaluation sites included in the evaluation plan.

During a development portion of the semiconductor process, S-D and/or non-S-D historical data can be created and stored for later use. The S-D historical data can include data at a number of sites.

Before, during, and/or after a procedure is performed, simulation and/or prediction data can be created and/or modified. The simulation and/or prediction data can include S-D data and/or non-S-D data. The new simulation and/or prediction data can be used in real time to update the calculations, models, and/or results. In addition, before, during, and/or after a procedure is performed, confidence data can be created and/or modified for the simulation and/or prediction data.

The S-D historical data can include GOF data, thermal data, thickness data, via-related data, CD data, CD profile data, material related data, trench-related data, sidewall angle data, differential width data, or any combination thereof. The data can also include site result data, site number data, CD measurement flag data, number of measurement sites data, coordinate X data, and coordinate Y data, among others.

S-D procedures can be used by a subsystem to adjust recipes and/or models in real-time to process three-dimensional structures, such as memory structures, dual-damascene structures, trenches, vias, and multi-gate transistors. In addition, S-D procedures can be used by subsystems to adjust evaluation, inspection, verification, and/or measurement recipes and/or models in real-time to evaluate, inspect, verify, and/or measure three-dimensional structures. The three-dimensional structures can increase the S-D sensitivity of thickness variations and require structure modeling and/or measurements in multiple directions. Evaluation subsystems can cause throughput problems and higher measurement throughput can be obtained by adjusting the sampling locations, and structures dynamically in S-D procedures.

In an S-D semiconductor processing system, multiple processing and/or measurement tools can be present and tool matching can be a critical issue. In some cases, data from internal tools must be matched with data from external and/or reference tools. S-D procedures can be used for data matching between tools and can be used to create the calibration adjustments needed by a subsystem. These adjustments can be made as R2R calculations.

One or more S-D procedures can be used to enable two-way communications for exchanging S-D data and for handshaking. S-D procedures can query the subsystems, controllers, and/or S-D procedures for current status and configuration. S-D procedures can be used to communicate with multiple devices in a subsystem by separating the unique parameters for each device and by distributing the information to each device. For example, S-D parameters can be sent to the controllers, processing tools, metrology tools, OES tools, RF sensors, cameras, optical sensors, CCDs, endpoint detectors, temperature sensors, and depth sensors.

When the wafer is processed in a subsystem using the S-D data, the processed wafer can be identified as a processed S-D wafer by changing the wafer state data for the wafer; and the processing data associated with the wafer can be identified and/or stored as new S-D processing data. When the wafer is processed in a subsystem using the non-S-D data, the processed wafer can be identified as a processed non-S-D wafer by changing the wafer state data for the wafer; and the processing data associated with the wafer can be identified and/or stored as new non-S-D processing data.

The wafer data can include modeling data for the processed wafer that can be created, enhanced, and/or modified in the subsystem. When S-D modeling data is used, a new models and associated model parameters can be identified and stored as S-D models and data. When non-S-D data is used, the models and associated model parameters can be identified and stored as non-S-D models and data. For example, the S-D models and data can be stored in an S-D library and/or database, and the non-S-D models and data can be stored in a non-S-D library and/or database. When a simulation is performed using S-D or non-S-D data, the simulation model and/or simulation data can be identified and/or stored.

S-D procedures can create, use, change, and/or verify wafer profile data. For example, as dimensions get smaller S-D wafer profile data can have a greater impact during aligning, measuring, and/or processing and the wafer profile data can include radius data, curvature data, feature data, temperature data, and/or thickness data.

In some subsystems, the S-D, and/or non-S-D wafer data can be used to determine a contaminant level, a contamination probability, and/or an out-gassing rate. In other subsystems, nozzle position during a deposition procedure, and/or a probe position during an alignment and/or measurement procedure can be determined. The amount of energy radiated by the wafer in a chamber can be determined. For example, the optical elements, nozzles, and/or probes used may be position-sensitive, location-sensitive, site-sensitive, and/or temperature-sensitive. In addition, the optical properties for the wafer and/or a calibration factor for the optical properties can be determined. For example, the characteristics of a processed masking, and/or material layer can be determined.

The system data can comprise wafer state information, location information, measurement information, vendor information, design information, chip layout information, library information, tool information, or searching information, or any combination thereof.

In some embodiments, one or more subsystems can receive one or more wafers and the associated wafer data. The subsystem can comprise a number of processing elements for processing the one or more wafers at substantially the same time. For example, an inspection subsystem can include two or more inspection elements/modules for inspecting the one or more wafers at substantially the same time. The controller associated with the subsystem can use an S-D process sequence to determine which wafer is processed by each processing element. The transfer elements internal to and/or external from the subsystem can be used to move and/or store wafers. In addition, one or more processing elements in one or more subsystems can be used to process one or more wafer in non-real-time. A current wafer can be identified for each processing element, wafer data can be established for each wafer, and the wafer data can include real-time and/or historical wafer data. A processing sequence can include internal and/or external procedures in which a wafer can be sent to an external measurement and/or processing tool. Other wafers in a wafer lot can be sent to other subsystems or other IM tools.

Still other embodiments of the invention provide a method of creating a S-D image library, and the method can comprise obtaining a first S-D inspection image from a first S-D feature in and/or on a patterned masking layer, the first S-D feature being formed at a first pre-determined site on the wafer, and a S-D inspection subsystem generates the first S-D inspection image; calculating a first S-D simulated image that corresponds to a hypothetical image of the first S-D feature; calculating a first difference between the S-D inspection image and the first S-D simulated image; comparing the first difference to a first S-D image creation criteria; and either identifying the first S-D feature using the hypothetical image and storing in a S-D inspection image library the first S-D inspection image and associated site data, if the first S-D image creation criteria is met or applying a first corrective action if the first S-D image creation criteria is not met.

In addition, one or more additional procedures can be performed. When additional procedures are performed, additional processing data can be created. In some embodiments, a new S-D message and/or data may not be available because of timing issues.

In some embodiments, a wafer can be processed by one or more lithography subsystems using one or more S-D procedures and S-D wafer thickness data can be generated in real time by the one or more lithography subsystems. Then the wafer can be transferred to an etching subsystem and one or more of the lithography subsystems can send S-D messages and/or data to the etching subsystem. The etching subsystem can receive and process the S-D messages and can extract the S-D wafer thickness data. The etching subsystem can use the S-D wafer thickness data to establish S-D etching data that can include an etching recipe, an etching time, and/or an etching chemistry. Next, the etching subsystem can etch the wafer using the S-D etching data. In addition, when S-D layer thickness data is provided to an etching tool, the calculation time can be reduced and the accuracy can be improved.

Accuracy values can be determined for S-D and/or non-S-D procedures and/or results, the accuracy values can be compared to accuracy limits, and refinement procedures can be performed if the accuracy values do not meet the accuracy limits. Alternatively, other procedures can be performed, other sites can be used, or other wafers can be used.

When a refinement procedure is used, the refinement procedure can utilize bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, or Thiele's refinement algorithm, or a combination thereof.

In some embodiments, a completion time and/or execution time can determined for the S-D and/or non-S-D procedures. The completion time and/or execution time can be compared to a measurement and/or processing start time to determine if there is enough time to establish the updated recipe. The wafer can be measured and/or processed using the updated measurement recipe if the completion time and/or execution time are less than the processing start time, or the wafer can be measured using a non-updated measurement recipe if the completion time and/or execution time are not less than the processing start time.

S-D processing sequences can change with time. When an S-D processing sequence is being developed, the throughput can be less than desired because the confidence values are lower and the risk factors are higher for new processes and additional measurement steps can be required to raise the confidence values and lower the risk factors. When wafers are measured using separate and/or external measurement tools, additional time is required.

When S-D systems, subsystems, and/or procedures are developed, stable S-D procedures are first developed and then the stable S-D procedures can be optimized. S-D procedures can be used during process stabilization, process enhancement, and process optimization.

During a stabilization sequence, one or more additional S-D measurement steps can be used to raise confidence values and/or decrease risk factors before an optimization sequence is established. Delay times can be used to wait for S-D data before performing a process.

One or more S-D measurements can be performed before the etching process is performed to obtain S-D data for a patterned mask layer that can be used to compare with the S-D data from a patterned etched layer. In addition, S-D measurements can be made after a deposition process, and these S-D measurements can provide S-D thickness data, uniformity data, and/or optical properties data that can be fed forward in real-time as S-D data or historical data. S-D wafer data can be obtained from processing tools, measurement tools, alignment tools, transfer tools, inspection tools, and/or pattern recognition tools.

In some fabrication environments, S-D procedures can provide S-D data that was previously unavailable; can provide faster processing; can provide a more complete understanding of a process, can replace destructive methods; can provide higher confidence wafers, can provide a faster transfer rate, can improve uniformity, can reduce the number of wafers at risk, and can provide shorter reaction times to process and/or tool excursions.

As noted above, current manufacturing methodology and factory design used for integrated circuits require many tools located as stand alone platforms or grouped in general areas, usually separated by a distance of 2000 feet or more. Facilities to run these tools must therefore also be widely distributed throughout the factory. Typical functions required by these platforms are substrate coating (Adhesion, BARC, TARC, Resist, Top Coat), bake (post apply bake and post exposure bake) imaging (exposure), metrology (overlay, critical dimension, defect and film thickness), pre and post exposure cleaning using in immersion processing, etch (defining the pattern in the underling thin films) and post etch clean-up (polymer and other byproduct removal). Technologies targeting sub 32 nm gate lengths will require many of these operations to be repeated to complete a single active layer of the semiconductor device i.e. double BARC, double or triple patterning, double or triple imaging, etc. In order to move the integrated circuits between these manufacturing "islands", FOUPs (Forward Opening Unified Pods) are used to move the ICs between the separate platforms.

In order to speed the process and provide better produced 300 mm, 450 mm or other diameter wafers, the entire manufacturing process including coat, bake, exposure, develop, all inspection, etch, post etch clean, wafer scrap and wafer rework can ideally be completed in a single platform which is controlled by common control software within the single platform and includes feed forward and/or feed backward APC (Advanced Process Control) on post etch results that can be linked to the very first process step. The APC enables post etch CD (critical dimension), overlay and defect information to be evaluated and acted upon almost immediately by feeding data forward (to educate future processes for the same wafer) or by feeding data backward (to educate the current process for the current wafer or to educate the current process for future wafers).

In addition, the feed forward and/or feed backward APC system and associated S-D transfer subsystems may be used with site-specific technology. For instance, an S-D transfer subsystem can be used to transfer a wafer to a particular processing element, and APC adjustments could be made for a specific site of the wafer. In addition, manufacturing processes and transfer sequences can be developed based on the site specific information gathered from the processes performed on the specific site of the wafer.

Further, the manufacturing processes and transfer sequences can be developed and perfected using "send ahead" wafers (i.e. process and evaluate one complete wafer before committing the lot) with minimal impact to FAB (fabrication plant) utilization, something that is impossible with conventional processes without a large loss of FAB productivity. For example, using S-D transfer sequences, a "Send ahead" wafer can be processed through etch and inspect, while the main lot is processed upstream. This allows adjustment of upstream manufacturing processes with minimal impact to the overall throughput.

Thus, wafers from thin film processing (or other upstream processes) can enter at one end of the platform and good, finished wafers can exit the other end. In other words, FOUP's will deliver wafers for processing at one end and new FOUP's will receive at the other end. In contrast to the system using manufacturing "islands" described above, the intermediate delivery FOUP's will no longer be necessary after all wafers have been loaded into the photolithography system.

In order to complete these necessary processes, the platform may include a number of modules containing all the necessary equipment to process wafers from adhesion to post etch clean inspection. Each module may be removable and replacement is not required in order for a tool to be "rebooted". This will facilitate repair and minimize lost productivity time due to unplanned module level tool issues. In addition, the basic block design with removable modules will allow sufficient space for specialized sub assemblies (modules) to be added or removed as required without long down times and expensive removal and re-installation of the tool.

As the wafer moves between modules, the wafer can be managed by robots on a rail type system. The robots used to move wafers can comprise a double or triple pincette balanced system that rotates on a central axis. These robots that move wafers from location to location can move on rails on either side of the scanner allowing for fast cycle time and all possible configurations of process steps achieving improved process versatility. The "side transport" system can thus enable wafers to easily travel from post develop IM back to the start of the coat process for multiple lithography (double patterning or lithography) or rework, allowing increased utilization of the exposure tool. In addition, multiple patterning can be enabled with the "side transport" system such that a single wafer can be moved from post develop IM back to the input of the photolithography system for multiple lithography. Wafers requiring rework may also be handled this way if a rework process is available in the pre-lithography part of the photolithography system. Thus, wafers do not have to be reloaded into the FOUP and moved from tool to tool by either people or overhead automation, reducing wafer level defectivity.

The use of the above described rail system can also result in that the system does not have to process wafers sequentially. The modules that make up the entire process can be grouped with one or more robots servicing the set of modules. In addition, lots do not have to wait for rework or scrap wafers. Good wafers can be processed to the end of the line, while "child lots" of rework wafers can be created, processed and caught up to the main lot after etch. This same concept can be used to cull scrapped wafers from the primary lot without delaying the good wafers in the main lot. Rework of non-compliant wafers may be immediate and automated. Thus, the entire manufacturing, inspection and control functions can be incorporated into a single tool with a common software that controls monitors the output and adjusts process inputs in real time.

In one embodiment the present invention there are included modules containing all the necessary equipment to process wafers from adhesion to post etch clean inspection. The modules do not have to lie out sequentially as is illustrated in FIG. 9.

Figure 9:
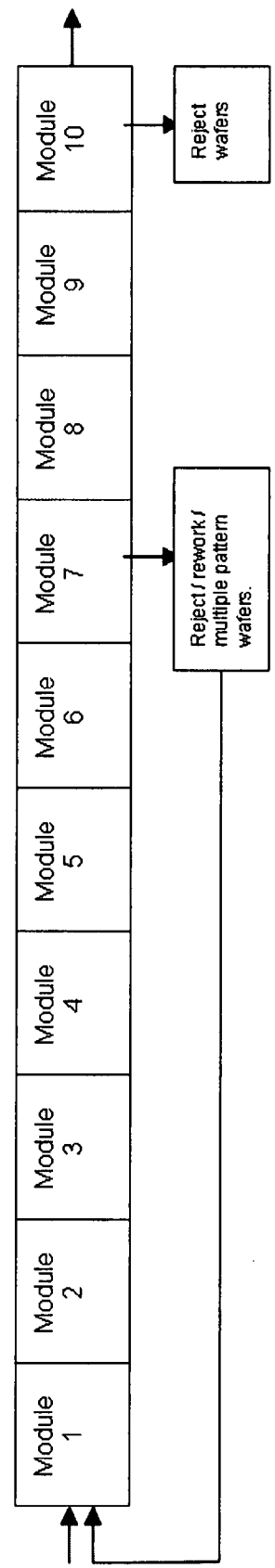
FIG. 9 is a block diagram of an embodiment of the present invention, which illustrates a system of modules each module containing all the necessary equipment to process wafers.

As shown in FIG. 9, wafers from thin film processing (or other upstream processes) enter at a first end and, verified, completed wafers exit the other end. For instance, modules 1 and 3 may include resist spinners, bake plates, pre-immersion clean processes. Module 2 may manage high out-gassing chemistries to minimize defectivity. If so, Module 2 would contain a "dirty" bake process, one that could contaminate the wafers. Accordingly, the present invention can allow these "dirty" processes to be isolated from the rest of the tool, lowering defectivity and minimizing possible contamination. Airborne particle counters can be established in the wafer path and critical process areas to monitor ambient defect levels. Detection could then enact alarm conditions. Further, the robot wafer handlers could ride a multiple rail type system from wafer entrance to scanner found in Module 4. The scanner could have its own internal wafer handler. Wafers would then be picked-up after exposure by another robot on a multiple rail system to modules 5 and 6 for post immersion clean, PEB, BWEE and developing. The wafers could then go to IM module 7 (Imaging module) for overlay, defect and critical dimension check.

At this point the wafers can be reworked if they fail, scrapped if they cannot be reworked, sent back via overheard handling or a single wafer "side track" for double or triple patterning. Also APC adjustments to photolithography system PAB, PEB, scanner or develop processes can be made based on the metrology results at this point. However, APC adjustments and site specific APC adjustments may also be made at any point in the processing. For instance, in the present example, although IM module 7 is the first module that images the wafer information regarding the wafer and specific sites on the wafer can be gleaned from any step in the process. For example, the scanner found in module 4 can provide information regarding the process performed on the wafer or information regarding the process performed on certain sites of the wafer. Thus, the APC adjustments can be made according to certain sites on the wafer and can be made using information from various sources in the process.

In addition, the etch process may be carried out in its own internal handler (module 8). Also included are the post etch cleaner (module 9) and the final IM tool (module 10). The final IM would contain critical dimension, defect and overlay features as required. Good and bad wafers can be sorted at this point. True, full APC can be implemented with the post etch critical dimension data driving resist photolithography system PAB, PEB, exposure tool or photolithography system developer recipes.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed is:

1. A method of processing a plurality of wafers comprising:
   receiving the plurality of wafers by a processing system, the processing system including Site-Dependent (S-D) and Non-Site-Dependent (N-S-D) subsystems, each wafer having wafer data associated therewith, wherein the wafer data includes S-D confidence data and/or N-S-D confidence data;
   establishing a first set of S-D wafers using the S-D confidence data and/or N-S-D confidence data;
   determining first S-D processing sequences for the first set of S-D wafers, the first set of S-D wafers being processed in first S-D subsystems using the first S-D processing sequences, wherein wafer state data is used to establish the first S-D processing sequences;
   transferring the first set of S-D wafers to one or more first S-D processing elements in the first S-D subsystems, the first S-D processing sequences being used to determine the one or more first S-D processing elements;
   collecting first S-D subsystem processing data before, during, and/or after the first S-D processing sequences are performed using the first set of S-D wafers;
   establishing first S-D confidence data for one or more wafers in the first set of S-D wafers using the wafer data and/or the first S-D subsystem processing data;
   establishing additional sets of S-D wafers using the first S-D confidence data, the S-D confidence data, or the N-S-D confidence data, or any combination thereof; and
   transferring the additional sets of S-D wafers to one or more additional S-D processing elements in additional subsystems, with additional S-D processing sequences being used to determine the one or more additional S-D processing elements.

2. The method of claim 1, further comprising:
   establishing a first set of N-S-D wafers using the S-D confidence data and/or N-S-D confidence data;
   determining first N-S-D processing sequences for the first set of N-S-D wafers, the first set of N-S-D wafers being processed in first N-S-D subsystems using the first N-S-D processing sequences, wherein wafer state data is used to establish the first N-S-D processing sequences; and
   transferring the first set of N-S-D wafers to one or more first N-S-D processing elements in the first N-S-D subsystems, the first N-S-D processing sequences being used to determine the one or more first N-S-D processing elements.

3. The method of claim 2, further comprising:
   establishing other sets of N-S-D wafers using the S-D confidence data and/or N-S-D confidence data;
   determining other N-S-D processing sequences for the other sets of N-S-D wafers, the other sets of N-S-D wafers being processed in other N-S-D subsystems using the other N-S-D processing sequences, wherein wafer state data is used to establish the other N-S-D processing sequences; and transferring the other sets of N-S-D wafers to one or more other N-S-D processing elements in the other N-S-D subsystems, the other N-S-D processing sequences being used to determine the one or more other N-S-D processing elements.

4. The method of claim 3, further comprising:
collecting other N-S-D subsystem processing data before, during, and/or after the other N-S-D processing sequences are performed using the other sets of N-S-D wafers;
establishing other N-S-D confidence data for one or more wafers in the other sets of N-S-D wafers using the wafer data and/or the other subsystem N-S-D processing data;
establishing additional sets of N-S-D wafers using the other N-S-D confidence data, the S-D confidence data, or the N-S-D confidence data, or any combination thereof; and
transferring the additional sets of N-S-D wafers to one or more additional N-S-D processing elements in additional subsystems, with additional N-S-D processing sequences being used to determine the one or more additional N-S-D processing elements.

5. The method of claim 4, wherein the establishing other N-S-D confidence data comprises:
establishing a first N-S-D confidence value for a first N-S-D wafer in the other sets of N-S-D wafers using the other N-S-D subsystem processing data;
comparing the first N-S-D confidence value for the first N-S-D wafer to a first N-S-D confidence limit; and
either continuing to process the other sets of N-S-D wafers when the first N-S-D confidence limit is met, or applying a first N-S-D corrective action when the first N-S-D confidence limit is not met.

6. The method of claim 5, wherein the applying a first N-S-D corrective action comprises:
establishing N-S-D confidence values for one or more additional wafers in the other sets of N-S-D wafers using the other N-S-D subsystem processing data;
comparing the N-S-D confidence values for one or more of the additional wafers in the other sets of N-S-D wafers to additional first N-S-D confidence limits; and
either continuing to process the other sets of N-S-D wafers, when one or more of the additional first N-S-D confidence limits are met, or stopping the establishing and the comparing, when one or more of the additional first N-S-D confidence limits are not met.

7. The method of claim 2, further comprising:
collecting first N-S-D subsystem processing data before, during, and/or after the first N-S-D processing sequences are performed using the first set of N-S-D wafers;
establishing first N-S-D confidence data for one or more wafers in the first set of N-S-D wafers using the wafer data and/or the first subsystem N-S-D processing data;
establishing additional sets of N-S-D wafers using the first N-S-D confidence data, the S-D confidence data, or the N-S-D confidence data, or any combination thereof; and
transferring the additional sets of N-S-D wafers to one or more additional N-S-D processing elements in additional subsystems, with additional N-S-D processing sequences being used to determine the one or more additional N-S-D processing elements.

8. The method of claim 7, wherein the establishing first N-S-D confidence data comprises:
establishing a first N-S-D confidence value for a first N-S-D wafer in the first set of N-S-D wafers using the first N-S-D subsystem processing data;
comparing the first N-S-D confidence value for the first N-S-D wafer to a first N-S-D confidence limit; and
either continuing to process the first set of N-S-D wafers when the first N-S-D confidence limit is met, or applying a first N-S-D corrective action when the first N-S-D confidence limit is not met.

9. The method of claim 8, wherein the applying a first N-S-D corrective action comprises:
establishing N-S-D confidence values for one or more additional wafers in the first set of N-S-D wafers using the first N-S-D subsystem processing data;
comparing the N-S-D confidence values for one or more of the additional wafers to additional first N-S-D confidence limits; and
either continuing to process the first set of N-S-D wafers, when one or more of the additional first N-S-D confidence limits are met, or stopping the establishing and the comparing, when one or more of the additional first N-S-D confidence limits are not met.

10. The method of claim 1, further comprising:
establishing other sets of S-D wafers using the S-D confidence data and/or N-S-D confidence data;
determining other S-D processing sequences for the other sets of S-D wafers, the other sets of S-D wafers being processed in other S-D subsystems using the other S-D processing sequences, wherein wafer state data is used to establish the other S-D processing sequences; and
transferring the other sets of S-D wafers to one or more other S-D processing elements in the other S-D subsystems, the other S-D processing sequences being used to determine the one or more other S-D processing elements.

11. The method of claim 10, further comprising:
collecting other S-D subsystem processing data before, during, and/or after the other S-D processing sequences are performed using the other sets of S-D wafers;
establishing other S-D confidence data for one or more wafers in the other sets of S-D wafers using the wafer data and/or the other S-D subsystem processing data;
establishing additional sets of S-D wafers using the other S-D confidence data, the S-D confidence data, or the N-S-D confidence data, or any combination thereof; and
transferring the additional sets of S-D wafers to one or more additional S-D processing elements in additional subsystems, with additional S-D processing sequences being used to determine the one or more additional S-D processing elements.

12. The method of claim 11, wherein the establishing other S-D confidence data comprises:
establishing a first S-D confidence value for a first S-D wafer in the other sets of S-D wafers using the other S-D subsystem processing data;
comparing the first S-D confidence value for the first S-D wafer to a first S-D confidence limit; and
either continuing to process the other sets of S-D wafers when the first S-D confidence limit is met, or applying a first S-D corrective action when the first S-D confidence limit is not met.

13. The method of claim 12, wherein the applying a first S-D corrective action comprises:
establishing S-D confidence values for one or more additional wafers in the other sets of S-D wafers using the other S-D subsystem processing data;
comparing the S-D confidence values for one or more of the additional wafers in the other sets of S-D wafers to additional first S-D confidence limits; and either continuing to process the other sets of S-D wafers, when one or more of the additional first S-D confidence limits are met, or stopping the establishing and the comparing, when one or more of the additional first S-D confidence limits are not met.

14. The method of claim 1, wherein the establishing first S-D confidence data comprises:
establishing a first S-D confidence value for a first S-D wafer in the first set of S-D wafers using the first S-D subsystem processing data;
comparing the first S-D confidence value for the first S-D wafer to a first S-D confidence limit; and
either continuing to process the first set of S-D wafers when the first S-D confidence limit is met, or applying a first S-D corrective action when the first S-D confidence limit is not met.

15. The method of claim 14, wherein the applying a first S-D corrective action comprises:
establishing S-D confidence values for one or more additional wafers in the first set of S-D wafers using the first S-D subsystem processing data;
comparing the S-D confidence values for one or more of the additional wafers to additional first S-D confidence limits; and
either continuing to process the first set of S-D wafers, when one or more of the additional first S-D confidence limits are met, or stopping the establishing and the comparing, when one or more of the additional first S-D confidence limits are not met.

16. The method of claim 1, wherein the first S-D processing sequences include at least one of one or more coating procedures, one or more etching procedures, one or more thermal procedures, one or more exposure procedures, one or more oxidation procedures, one or more nitridation procedures, one or more development procedures, one or more lithography procedures, one or more scanner-related procedures, one or more measurement procedures, one or more inspection procedures, one or more evaluation procedures, one or more simulation procedures, one or more prediction procedures, one or more rework procedures, one or more storage procedures, one or more transfer procedures, one or more loadlock procedures, or one or more cleaning procedures, or any combination thereof.

17. The method of claim 1, wherein the first S-D subsystems include at least one of one or more coating subsystems, one or more etching subsystems, one or more thermal subsystems, one or more exposure subsystems, one or more oxidation subsystems, one or more nitridation subsystems, one or more development subsystems, one or more lithography subsystems, one or more scanner-related subsystems, one or more measurement subsystems, one or more inspection subsystems, one or more evaluation subsystems, one or more simulation subsystems, one or more prediction subsystems, one or more rework subsystems, one or more storage subsystems, one or more transfer subsystems, one or more loadlock subsystems, or one or more cleaning subsystems, or any combination thereof.

18. The method of claim 1, wherein the first S-D processing elements include at least one of one or more coating processing elements, one or more etching processing elements, one or more thermal processing elements, one or more exposure processing elements, one or more oxidation processing elements, one or more nitridation processing elements, one or more development processing elements, one or more lithography processing elements, one or more scanner-related processing elements, one or more measurement processing elements, one or more inspection processing elements, one or more evaluation processing elements, one or more simulation processing elements, one or more prediction processing elements, one or more rework processing elements, one or more storage processing elements, one or more transfer processing elements, one or more loadlock processing elements, or one or more cleaning processing elements, or any combination thereof.

19. The method of claim 1, wherein the plurality of wafers comprise at least on of semiconductor material, carbon material, dielectric material, glass material, ceramic material, metallic material, oxidized material, mask material, or planarization material, or a combination thereof.

20. A method of processing a plurality of wafers comprising:
receiving the plurality of wafers by a non-site dependent transfer subsystem in a processing system, the processing system including Site-Dependent (S-D) and Non-S-D (N-S-D) subsystems, each wafer having wafer data associated therewith, wherein the wafer data includes S-D confidence data and/or N-S-D confidence data, wherein at least one wafer has one or more evaluation structures thereon;
establishing a first set of S-D measurement wafers by using the using the S-D confidence data and/or N-S-D confidence data, each wafer in the first set of S-D measurement wafers having one or more evaluation structures thereon, wherein the first set of S-D measurement wafers are transferred from a N-S-D transfer subsystem to a S-D transfer subsystem;
determining first S-D measurement procedures for the first set of S-D measurement wafers, the first set of S-D measurement wafers being measured in first S-D measurement subsystems using the first S-D measurement procedures, wherein the wafer data is used to establish the first S-D measurement procedures;
transferring the first set of S-D measurement wafers to one or more first S-D measurement-related elements in the first S-D subsystems using the S-D transfer subsystem, a first S-D transfer sequence, a first S-D processing sequence, or the first S-D measurement procedures, or any combination thereof being used to determine the one or more first S-D measurement-related elements; and
performing the first S-D measurement procedures.

21. The method of claim 20, wherein the performing the first S-D measurement procedures comprises:
selecting a first measurement wafer from the first set of S-D measurement wafers, the first measurement wafer having a first S-D evaluation feature thereon;
obtaining first measurement data including first S-D measured signal data from the first S-D feature;
selecting first S-D best estimate signal data and an associated first S-D best estimate structure from a library of S-D measurement signals and associated structures;
calculating first S-D differences between the first S-D measured signal data and the first S-D best estimate signal data;
establishing first S-D confidence data for the first measurement wafer using the first S-D differences;
comparing the first S-D confidence data to first S-D product requirements; and
either identifying the first measurement wafer as a first high confidence wafer and continuing the processing when one or more of the first S-D product requirements are met, or applying a first corrective action when one or more of the first S-D product requirements are not met.

22. The method of claim 21, further comprising:
identifying the first S-D evaluation feature using the first S-D best estimate structure and the associated first S-D best estimate signal data when one or more of the first S-D product requirements are met.

23. The method of claim 21, wherein the applying a first corrective action comprises:
selecting new S-D best estimate signal data and an associated new S-D best estimate structure from a library of S-D diffraction signals and associated structures;
calculating new S-D differences between the first S-D measured signal data and the new S-D best estimate signal data;
establishing new S-D confidence data for the first measurement wafer using the new S-D differences;
comparing the new S-D confidence data to new S-D product requirements; and
either identifying the first measurement wafer as a new high confidence wafer and continuing the processing when one or more of the new S-D product requirements are met, or stopping the selecting, the calculating, the establishing, the comparing, and the identifying when one or more of the new S-D product requirements are not met.

24. The method of claim 23, further comprising:
identifying the first S-D evaluation feature using the new S-D best estimate structure and the associated new S-D best estimate signal data when first S-D profile library creation criteria is met.

25. The method of claim 21, wherein the applying a first corrective action comprises:
selecting a second measurement wafer from the first set of S-D measurement wafers, the second measurement wafer having the first S-D evaluation feature thereon;
obtaining second measurement data including second S-D measured signal data from the first S-D feature;
selecting second S-D best estimate signal data and an associated second S-D best estimate structure from the library of S-D measurement data and associated structures or a library of S-D diffraction signals and associated structures;
calculating second S-D differences between the second S-D measured signal data and the second S-D best estimate signal data;
establishing second S-D confidence data for the second measurement wafer using the second S-D differences;
comparing the second S-D confidence data to second S-D product requirements; and
either identifying the second measurement wafer as a second high confidence wafer and continuing the processing when one or more of the second S-D product requirements are met, or applying a second corrective action when one or more of the second S-D product requirements are not met.

26. The method of claim 25, further comprising:
identifying the first S-D evaluation feature using the second S-D best estimate structure and the associated second S-D best estimate signal data when one or more of the second S-D product requirements are met.

27. The method of claim 25, wherein the applying a second corrective action comprises:
selecting new second S-D best estimate signal data and an associated new second S-D best estimate structure from the library of S-D measurement data and associated structures or the library of S-D diffraction signals and associated structures;
calculating new second S-D differences between the second S-D measured signal data and the new second S-D best estimate signal data;
establishing new second S-D confidence data for the second measurement wafer using the new second S-D differences;
comparing the new second S-D confidence data to new second S-D product requirements; and
either identifying the second measurement wafer as a new second high confidence wafer and continuing the processing when one or more of the new second S-D product requirements are met, or stopping the selecting, the calculating, the establishing, the comparing, and the identifying when one or more of the new second S-D product requirements are not met.

28. The method of claim 27, further comprising:
identifying the first S-D evaluation feature using the new second S-D best estimate structure and the associated new second S-D best estimate signal data when one or more of the new second S-D product requirements are met.

29. The method of claim 27, wherein the applying a second corrective action comprises re-measuring, re-inspecting, re-working, storing, cleaning, and/or stripping the first measurement wafer, the second measurement wafer, or the first set of S-D measurement wafers, or any combination thereof.

30. The method of claim 21, wherein the applying a first corrective action comprises:
selecting a second S-D evaluation feature on the first measurement wafer;
obtaining second measurement data including second S-D measured signal data from the second S-D feature;
selecting second S-D best estimate signal data and an associated second S-D best estimate structure from the library of S-D measurement data and associated structures;
calculating second S-D differences between the second S-D measured signal data and the second S-D best estimate signal data;
establishing second S-D confidence data for the first measurement wafer using the second S-D differences;
comparing the second S-D confidence data to second S-D product requirements; and
either identifying the first measurement wafer as a second high confidence wafer and continuing the processing when one or more of the second S-D product requirements are met, or applying a second corrective action when one or more of the second S-D product requirements are not met.

31. The method of claim 21, wherein the applying a first corrective action comprises:
selecting a second measurement wafer having a second S-D evaluation feature thereon;
obtaining second measurement data including second S-D measured signal data from the second S-D feature;
selecting second S-D best estimate signal data and an associated second S-D best estimate structure from the library of S-D measurement data and associated structures;
calculating second S-D differences between the second S-D measured signal data and the second S-D best estimate signal data;
establishing second S-D confidence data for the second measurement wafer using the second S-D differences;
comparing the second S-D confidence data to second S-D product requirements; and either identifying the second, measurement wafer as a second high confidence wafer and continuing the processing when one or more of the second S-D product requirements are met, or applying a second corrective action when one or more of the second S-D product requirements are not met.

32. The method of claim 21, wherein the applying a first corrective action comprises re-measuring, re-inspecting, re-working, storing, cleaning, and/or stripping the one or more of the first set of S-D measurement wafers.

33. The method of claim 21, wherein applying a first corrective action further comprises:
establishing a first S-D calculated evaluation structure and associated first S-D calculated signal data from a new profile space outside a profile space associated with the library of S-D measurement signals and associated structures or a library of S-D diffraction signals and associated structures;
determining first S-D calculated differences between the first measured signal data and the first S-D calculated signal data;
establishing first S-D calculated confidence data for the first measurement wafer using the first S-D calculated differences;
comparing the first S-D calculated confidence data to first S-D profile library creation criteria; and
either identifying the first measurement wafer as a first calculated high confidence wafer and continuing the processing when one or more of the first S-D profile library creation criteria are met, or applying a second corrective action when one or more of the first S-D profile library creation criteria are not met.

34. The method of claim 33, further comprising:
creating a new S-D calculated evaluation structure and associated new S-D calculated signal data by changing at least one of a height, a width, a thickness, a depth, a volume, an area, an angle, a dielectric property, a process recipe parameter, a processing time, a critical dimension, a spacing, a period, a position, or a line width, or a combination of two or more thereof;
determining new S-D calculated differences between the first measured signal data and the new S-D calculated signal data;
establishing new S-D calculated confidence data for the first measurement wafer using the new S-D calculated differences;
comparing the new S-D calculated confidence data to new S-D profile library creation criteria; and either
identifying the first measurement wafer as a new calculated high confidence wafer and continuing the processing when one or more of the new S-D profile library creation criteria are met, or stopping the creating, the determining, the establishing, the comparing, and the identifying when one or more of the new S-D profile library creation criteria are not met.

35. The method of claim 33, further comprising:
storing the first S-D calculated evaluation structure and the associated first S-D calculated signal data in the library of S-D measurement signals and associated structures or the library of S-D diffraction signals when the first S-D profile library creation criteria are met.

36. The method of claim 33, further comprising:
identifying the first S-D evaluation feature using the S-D first calculated evaluation structure and the associated first calculated signal data when the first S-D profile library creation criteria is met.

37. The method of claim 21, wherein applying a first corrective action further comprises:
determining a first outside data point in a first S-D profile data space outside a data space associated with a S-D profile library, wherein first outside S-D signal data, or first outside S-D profile data, or first outside S-D profile parameter data, or a combination thereof are associated with the first outside data point;
calculating first outside S-D differences between the first S-D measured signal data and the first outside S-D signal data;
establishing first outside S-D confidence data for the first measurement wafer using the first outside S-D differences;
comparing the first outside S-D confidence data to first outside S-D product requirements; and
either identifying the first measurement wafer as an outside high confidence wafer and continuing the processing when one or more of the first outside S-D product requirements are met, or applying a second corrective action when one or more of the first outside S-D product requirements are not met.

38. The method of claim 37, further comprising:
identifying the first S-D evaluation feature using the data associated with the first outside data point when one or more of the first outside S-D product requirements are met.

39. The method of claim 21, wherein the continuing the processing comprises:
comparing the first S-D differences to first accuracy requirements; and
either identifying a first set of inspection wafers as first high confidence wafers and continuing the processing when one or more of a first accuracy requirements are met, or applying additional corrective actions when one or more of the first accuracy requirements are not met.

40. The method of claim 20, wherein the applying a second corrective action comprises:
selecting a third S-D evaluation feature on the first measurement wafer;
obtaining third measurement data including third S-D measured signal data from the third S-D feature;
selecting third S-D best estimate signal data and an associated third S-D best estimate structure from a library of S-D measurement data and associated structures or a library of S-D diffraction signals and associated structures;
calculating third S-D differences between the third S-D measured signal data and the third S-D best estimate signal data;
establishing third S-D confidence data for the first measurement wafer using the third S-D differences;
comparing the third S-D confidence data to third S-D product requirements; and
either identifying the first measurement wafer as a third high confidence wafer and continuing the processing when one or more of the third S-D product requirements are met, or stopping the selecting, the calculating, the establishing, the comparing, and the identifying when one or more of the third S-D product requirements are not met.

41. The method of claim 22, wherein the applying a second corrective action comprises:
selecting new second S-D best estimate signal data and an associated new second S-D best estimate structure from the library of S-D measurement data and associated structures;

calculating new second S-D differences between the second measured signal data and the new second S-D best estimate signal data;

establishing new second S-D confidence data for the second measurement wafer using the new second S-D differences;

comparing the new second S-D confidence data to new second S-D product requirements; and either identifying the second measurement wafer as a new second high confidence wafer and continuing the processing when one or more of the new second S-D product requirements are met, or stopping the selecting, the calculating, the comparing, and the identifying when one or more of the new second S-D product requirements are not met.

* * * * *